(12) United States Patent
Wang et al.

(10) Patent No.: US 11,984,672 B2
(45) Date of Patent: *May 14, 2024

(54) ANTENNA AND PREPARATION METHOD THEREOF, PHASE SHIFTER AND COMMUNICATION DEVICE

(71) Applicant: Shanghai Tianma Micro-Electronics Co., Ltd., Shanghai (CN)

(72) Inventors: Linzhi Wang, Shanghai (CN); Kerui Xi, Shanghai (CN); Dengming Lei, Shanghai (CN); Zhenyu Jia, Shanghai (CN)

(73) Assignee: Shanghai Tianma Microelectronics Co., Ltd, Shanghai (CN)

( * ) Notice: Subject to any disclaimer, the term of this patent is extended or adjusted under 35 U.S.C. 154(b) by 308 days.

This patent is subject to a terminal disclaimer.

(21) Appl. No.: 17/348,842

(22) Filed: Jun. 16, 2021

(65) Prior Publication Data

US 2022/0285843 A1 Sep. 8, 2022

(30) Foreign Application Priority Data

Mar. 2, 2021 (CN) .......................... 202110232062.5

(51) Int. Cl.
| | |
|---|---|
| *H01Q 1/38* | (2006.01) |
| *H01L 25/075* | (2006.01) |
| *H01L 25/16* | (2023.01) |
| *H01Q 1/36* | (2006.01) |
| *H01Q 3/44* | (2006.01) |

(Continued)

(52) U.S. Cl.
CPC .......... *H01Q 9/045* (2013.01); *H01L 25/0753* (2013.01); *H01L 25/167* (2013.01); *H10K 59/00* (2023.02)

(58) Field of Classification Search
CPC .......... H01Q 1/38; H01Q 3/44; H01Q 21/065; H01Q 1/243; H01Q 1/36; H01Q 1/44; H01Q 9/0407; H01Q 3/36; H01Q 1/24
See application file for complete search history.

(56) References Cited

U.S. PATENT DOCUMENTS

| | | | |
|---|---|---|---|
| 2008/0036664 A1 | 2/2008 | Haziza | |
| 2012/0212375 A1* | 8/2012 | Depree, IV | H01Q 15/0086 977/762 |

FOREIGN PATENT DOCUMENTS

| | | |
|---|---|---|
| CN | 202523849 U | 11/2012 |
| CN | 103178345 A | 6/2013 |
| JP | 2014127889 A | 7/2014 |

* cited by examiner

*Primary Examiner* — Wei (Victor) Y Chan
(74) *Attorney, Agent, or Firm* — KDW Firm PLLC

(57) ABSTRACT

Provided are an antenna and a preparation method thereof, a phase shifter, and a communication device. The antenna includes a first electrode, a second electrode, a third electrode, and a photodielectric variable layer. The first electrode and the second electrode are respectively disposed on opposite two sides of the photodielectric variable layer. The first electrode includes a plurality of transmission electrodes, and the plurality of transmission electrodes are configured to transmit an electrical signal. The second electrode is provided with a fixed potential. The third electrode includes a plurality of radiator units, and the plurality of radiator units are configured to send the electrical signal. The antenna further includes at least one light-emitting element configured to emit light irradiated to the photodielectric variable layer to change a dielectric constant of the photodielectric variable layer.

20 Claims, 29 Drawing Sheets

(51) Int. Cl.
*H01Q 9/04* (2006.01)
*H10K 59/00* (2023.01)

ANTENNA AND PREPARATION METHOD THEREOF, PHASE SHIFTER AND COMMUNICATION DEVICE

CROSS-REFERENCE TO RELATED APPLICATION

This application claims priority to Chinese Patent Application No. 202110232062.5 filed Mar. 2, 2021, the disclosure of which is incorporated herein by reference in its entirety.

FIELD

Embodiments of the present disclosure relate to the technical field of communications, and in particular, to an antenna and a preparation method thereof, a phase shifter, and a communication device.

BACKGROUND

An antenna is an important radio device for sending and receiving electromagnetic waves, and it could be said that there is no communication device without an antenna.

The phased array antenna is an upgrade of a traditional antenna. The phased array antenna can quickly and flexibly change an antenna beam and a pointing shape according to a target and can send and receive electromagnetic waves in various frequency bands in a whole space, that is, the phased array antenna can accurately complete tasks such as searching, tracking, capturing or identifying on multiple targets.

A liquid crystal phased array antenna is a type of antenna which utilizes the dielectric anisotropy of the liquid crystal and changes a size of phase shift of a phase shifter by controlling a deflection direction of the liquid crystal to adjust an alignment direction of the phased array antenna. The liquid crystal phased array antenna has the characteristics of miniaturization, wide frequency band, multi-band, high gain and the like and is an antenna more suitable for the current technical development direction. The liquid crystal phased array antenna has a wide application prospect in the fields of satellite receiving antenna, vehicle-mounted radar, base station antenna and the like. Therefore, the liquid crystal phased array antenna is the most studied phased array antenna at present.

However, the liquid crystal antenna has a high cost and an expensive selling price, so it is difficult for the liquid crystal antenna to achieve large-scale commercialization.

SUMMARY

The present disclosure provides a new type of antenna and preparation method thereof, a phase shifter, and a communication device to provide more possibilities for large-scale commercialization.

In a first aspect, an embodiment of the present disclosure provides an antenna. The antenna includes a first electrode, a second electrode, a third electrode, and a photodielectric variable layer. The first electrode and the second electrode are respectively disposed on opposite two sides of the photodielectric variable layer. The first electrode includes a plurality of transmission electrodes, and the plurality of transmission electrodes are configured to transmit an electrical signal. The second electrode is provided with a fixed potential. The third electrode includes a plurality of radiator units, and the plurality of radiator units are configured to send the electrical signal. The antenna further includes at least one light-emitting element configured to emit light irradiated to the photodielectric variable layer to change a dielectric constant of the photodielectric variable layer. The at least one light-emitting element and at least one of the first electrode, the second electrode, or the third electrode are an integral structure.

In a second aspect, an embodiment of the present disclosure further provides a phase shifter. The phase shifter includes a first electrode, a second electrode, and a photodielectric variable layer. The first electrode and the second electrode are respectively disposed on opposite two sides of the photodielectric variable layer. The first electrode includes a plurality of transmission electrodes, and the plurality of transmission electrodes are configured to transmit an electrical signal. The second electrode is provided with a fixed potential. The phase shifter further includes at least one light-emitting element configured to emit light irradiated to the photodielectric variable layer to change a dielectric constant of the photodielectric variable layer. The at least one light-emitting element and at least one of the first electrode or the second electrode are an integral structure.

In a third aspect, an embodiment of the present disclosure further provides a communication device, and the communication device includes the antenna of the first aspect and the phase shifter of the second aspect.

In a fourth aspect, an embodiment of the present disclosure further provides a method for preparing an antenna, and the method for preparing an antenna includes steps described below. A photodielectric variable module is provided. The photodielectric variable module includes a photodielectric variable layer and a second electrode, and the second electrode is provided with a fixed potential. A first electrode is formed on a side of the photodielectric variable module. The first electrode and the second electrode are respectively disposed on two sides of the photodielectric variable layer, the first electrode includes a plurality of transmission electrodes, a plurality of radiator units, a signal trace, and a light-emitting element connection pad, the plurality of transmission electrodes are configured to transmit an electrical signal, and the plurality of radiator units are configured to send the electrical signal. A light-emitting element is bonded to the light-emitting element connection pad. The light-emitting element connection pad is electrically connected to the light-emitting element and the signal trace, separately.

In a fifth aspect, an embodiment of the present disclosure further provides a method for preparing an antenna, and the method for preparing an antenna includes steps described below. A substrate base plate is provided. A circuit base plate is arranged on the substrate base plate. The circuit base plate includes a light-emitting element connection pad. A limiting layer is arranged on a side of the circuit base plate facing away from the substrate base plate. The limiting layer includes a limiting hole, and a vertical projection of the limiting hole on a plane where the substrate base plate is located overlaps a vertical projection of the light-emitting element connection pad on the plane where the substrate base plate is located. A second electrode is formed on a side of the substrate base plate facing away from the circuit base plate. The second electrode is provided with a fixed potential. A photodielectric variable layer is arranged on a side of the second electrode facing away from the substrate base plate. A first electrode is arranged on a side of the photodielectric variable layer facing away from the second electrode. The first electrode includes a plurality of transmission electrodes and a plurality of radiator units, the plurality of transmission electrodes are configured to transmit an electrical signal, and the plurality of radiator units are configured to send the electrical signal. A light-emitting element is bonded to the limiting hole. The light-emitting element is electrically connected to the light-emitting element connection pad.

In a sixth aspect, an embodiment of the present disclosure further provides a method for preparing an antenna, and the method for preparing an antenna includes steps described below. A substrate base plate is provided. A second electrode is arranged on the substrate base plate. The second electrode is provided with a fixed potential. A circuit base plate is arranged on the second electrode. The circuit base plate includes a light-emitting element connection pad. A limiting layer is arranged on a side of the circuit base plate facing away from the second electrode. The limiting layer includes a limiting hole, and a vertical projection of the limiting hole on a plane where the substrate base plate is located overlaps a vertical projection of the light-emitting element connection pad on the plane where the substrate base plate is located. A light-emitting element is bonded to the limiting hole. The light-emitting element is electrically connected to the light-emitting element connection pad. A sticking layer is arranged on a side of the substrate base plate facing away from the second electrode. A photodielectric variable module is bonded on a side of the sticking layer facing away from the substrate base plate. The photodielectric variable module includes a photodielectric variable layer and a first electrode, the first electrode is disposed on a side of the photodielectric variable layer facing away from the sticking layer, the first electrode includes a plurality of transmission electrodes and a plurality of radiator units, the plurality of transmission electrodes are configured to transmit an electrical signal, and the plurality of radiator units are configured to send the electrical signal.

In a seventh aspect, an embodiment of the present disclosure further provides a method for preparing an antenna, and the method for preparing an antenna includes steps described below. A substrate base plate is provided. A circuit base plate is arranged on the substrate base plate. The circuit base plate includes a light-emitting element connection pad. A limiting layer is arranged on a side of the circuit base plate facing away from the substrate base plate. The limiting layer includes a limiting hole, and a vertical projection of the limiting hole on a plane where the substrate base plate is located overlaps a vertical projection of the light-emitting element connection pad on the plane where the substrate base plate is located. A light-emitting element is bonded to the limiting hole. The light-emitting element is electrically connected to the light-emitting element connection pad. A planarizing layer is arranged on a side of the light-emitting element facing away from the substrate base plate. A second electrode is arranged on a side of the planarizing layer facing away from the light-emitting element. The second electrode is provided with a fixed potential. A sticking layer is arranged on a side of the second electrode facing away from the planarizing layer. A photodielectric variable module is bonded on a side of the sticking layer facing away from the second electrode. The photodielectric variable module includes a photodielectric variable layer and a first electrode, the first electrode is disposed on a side of the photodielectric variable layer facing away from the sticking layer, the first electrode includes a plurality of transmission electrodes and a plurality of radiator units, the plurality of transmission electrodes are configured to transmit an electrical signal, and the plurality of radiator units are configured to send the electrical signal.

In the embodiments of the present disclosure, the photodielectric variable layer is disposed between the first electrode and the second electrode, the dielectric constant of the photodielectric variable layer is controlled to change through the light emitted by the light-emitting element, and then the electrical signal transmitted by the transmission electrode is controlled to shift a phase. The new type of antenna, the phase shifter and the communication device provide more possibilities for large-scale commercialization.

DETAILED DESCRIPTION

Figure 1:
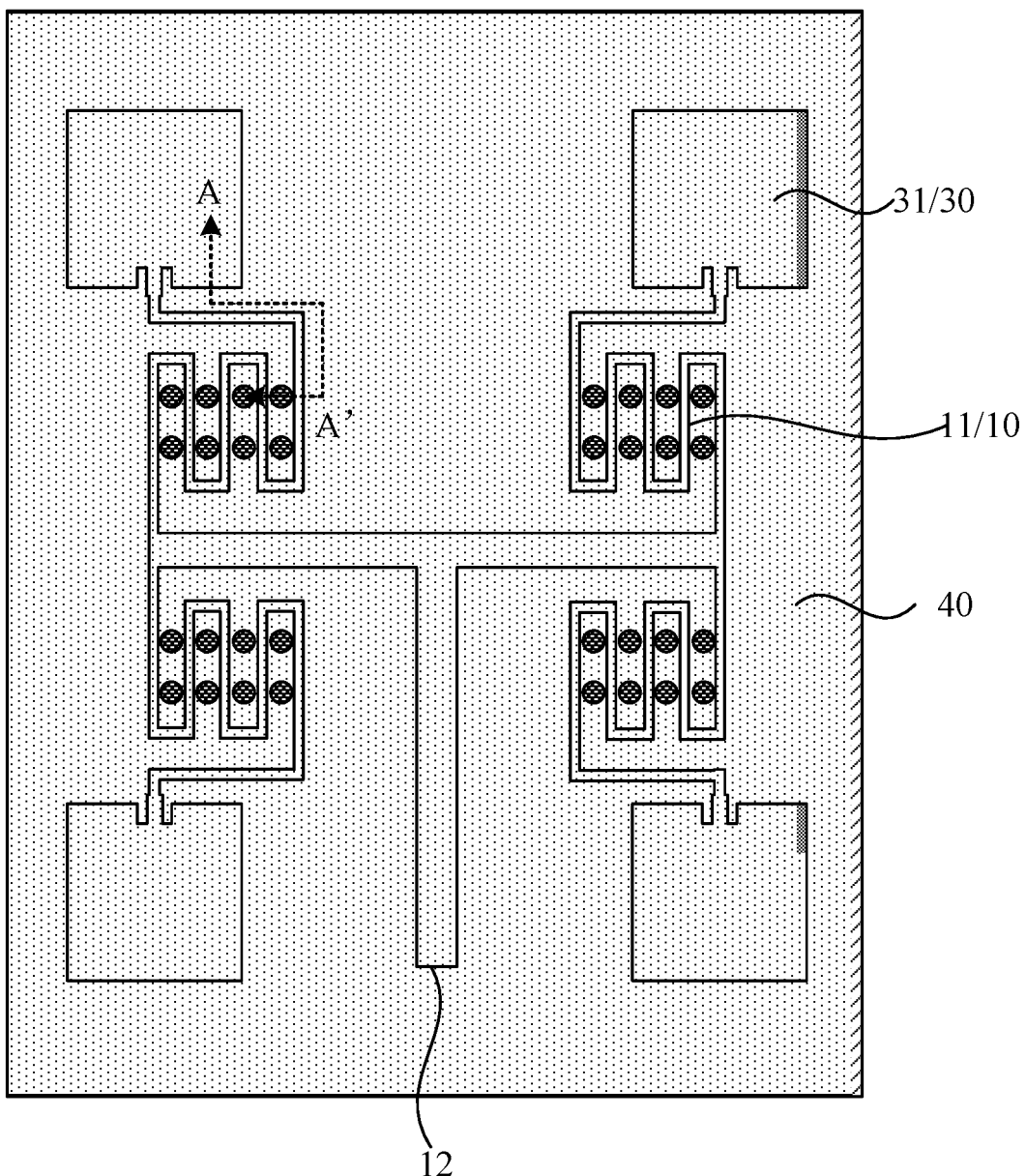
FIG. 1 is a top view of an antenna according to an embodiment of the present disclosure.

Hereinafter the present disclosure will be further described in detail in conjunction with the drawings and embodiments. It is to be understood that the embodiments set forth herein are merely intended to illustrate and not to limit the present disclosure. Additionally, it is to be noted that for ease of description, merely part, not all, of the structures related to the present disclosure are illustrated in the drawings.

In view of the problems in the background, an embodiment of the present disclosure provides an antenna. The antenna includes a first electrode, a second electrode, a third electrode, and a photodielectric variable layer. The first electrode and the second electrode are respectively disposed on opposite two sides of the photodielectric variable layer. The first electrode includes a plurality of transmission electrodes, and the plurality of transmission electrodes are configured to transmit an electrical signal. The second electrode is provided with a fixed potential. The third electrode includes a plurality of radiator units, and the plurality of radiator units are configured to send the electrical signal. The antenna further includes at least one light-emitting element configured to emit light irradiated to the photodielectric variable layer to change a dielectric constant of the photodielectric variable layer. The at least one light-emitting element and at least one of the first electrode, the second electrode, or the third electrode are an integral structure.

In the antenna provided by this embodiment, the light emitted by the light-emitting element in the antenna controls the dielectric constant of the photodielectric variable layer to change, and then the electrical signal transmitted by the transmission electrode is controlled to shift a phase. The antenna structure provided by this embodiment provides more possibilities for large-scale commercialization.

The above is the core idea of the present disclosure, technical schemes in the embodiments of the present disclosure will be described clearly and completely in conjunction with drawings in the embodiments of the present disclosure. Based on the embodiments of the present disclosure, all other embodiments obtained by those skilled in the art without creative work are within the scope of the present disclosure.

Figure 2:
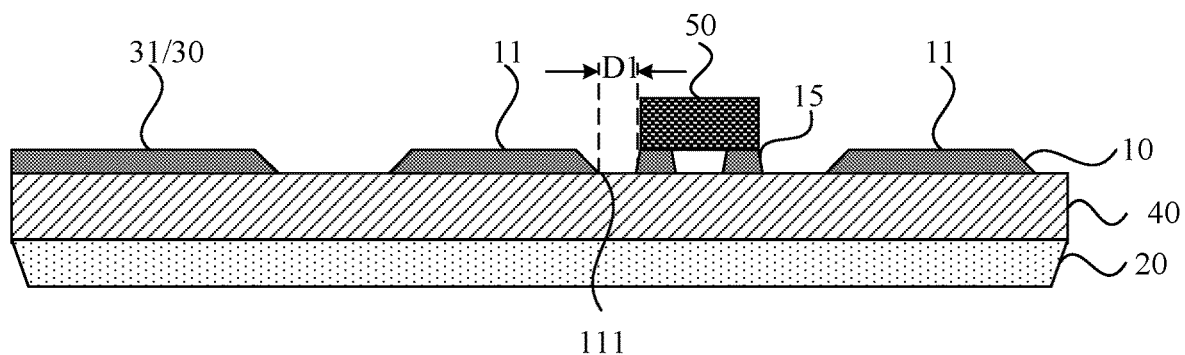
FIG. 2 is a cross-sectional structure view taken along a line A-A' of FIG. 1.

FIG. 1 is a top view of an antenna according to an embodiment of the present disclosure. FIG. 2 is a cross-sectional structure view taken along a line A-A' of FIG. 1. As shown in FIGS. 1 and 2, an antenna 100 provided by the embodiment of the present disclosure includes a first electrode 10, a second electrode 20, a third electrode 30, and a photodielectric variable layer 40. The first electrode 10 and the second electrode 20 are respectively disposed on opposite two sides of the photodielectric variable layer 40. The first electrode 10 includes a plurality of transmission electrodes 11, and the plurality of transmission electrodes 11 are configured to transmit an electrical signal. The electric signal transmitted by the transmission electrodes 11 may be, for example, a high frequency signal, and for example, a frequency of the high frequency signal is greater than 1 GHz. The second electrode 20 is provided with a fixed potential. For example, the second electrode 20 is grounded. The third electrode 30 includes a plurality of radiator units 31, and the plurality of radiator units 31 are configured to send the electrical signal.

Still referring to FIGS. 1 and 2, the antenna 100 further includes at least one light-emitting element 50 configured to emit light irradiated to the photodielectric variable layer 40 to change a dielectric constant of the photodielectric variable layer 40. The at least one light-emitting element 50 and at least one of the first electrode 10, the second electrode 20, or the third electrode 30 are an integral structure. The integral structure means that the at least one light-emitting element 50 and at least one of the first electrode 10, the second electrode 20, or the third electrode 30 are located on a same supporting layer, that is, the at least one light-emitting element 50 and at least one of the first electrode 10, the second electrode 20, or the third electrode 30 are disposed in the same supporting layer, and that is, if the at least one light-emitting element 50 is a prepared light-emitting element, the at least one light-emitting element 50 is directly bonded to the supporting layer provided with at least one of the first electrode 10, the second electrode 20, or the third electrode 30 without providing another supporting layer separately. For example, the light-emitting element 50 may be a Micro Light Emitting Diode (Micro LED) or a Mini Light Diode (Mini LED). Alternatively, the light-emitting element 50 is prepared and formed on the supporting layer, and in addition to the light-emitting element 50, at least one of the first electrode 10, the second electrode 20, or the third electrode 30 is also prepared and formed on the supporting layer without providing another supporting layer separately. For example, the light-emitting element 50 may be an Organic Light-Emitting Diode (OLED). Exemplarily, if the light-emitting element 50 is the prepared light-emitting element, for example, the supporting layer may be provided with the second electrode 20 shown in FIGS. 1 and 2, the photodielectric variable layer 40 is disposed on the second electrode 20, one side of the photodielectric variable layer 40 facing away from the second electrode 20 is formed with the transmission electrodes 11 and the radiator unit 31, and then the light-emitting element 50 is bonded, that is, the light-emitting element 50, the first electrode 10, the second electrode 20, and the third electrode 30 are all disposed in the same supporting layer, and that is, the light-emitting element 50 is directly bonded to the supporting layer provided with the first electrode 10, the second electrode 20, and the third electrode 30 without providing another supporting layer separately. It is to be understood that if the antenna 100 requires the supporting layer, the supporting layer (not shown in the figure) does not need to be peeled off; and if the antenna 100 does not requires the supporting layer, the supporting layer may be peeled off, as shown in FIGS. 1 and 2.

In this embodiment, the transmission electrodes 11 are configured to transmit the electrical signal. In a process of transmitting the electrical signal, the light emitted by the light-emitting element 50 and irradiated to the photodielectric variable layer 40 can change the dielectric constant of the photodielectric variable layer 40. When the dielectric constant of the photodielectric variable layer 40 changes, a capacitance value of a capacitor formed between the transmission electrodes 11 and the second electrode 20 is changed, resulting in a change in a phase of the electrical signal transmitted by the transmission electrodes 11. In this manner, the phase of the electrical signal is changed, and a function of phase shifting of the electrical signal is implemented.

In the embodiment provided in the present application, not only a new antenna structure, that is, a light-controlled antenna, is provided, but also a light source for controlling the antenna is integrated into the antenna structure, so that a volume of the antenna device can be further reduced. Portable and light antennas provide more possibilities for their applications. For example, in addition to being used in position-fixed devices (such as 5G base stations), the antennas can also be applied to devices with changing positions, such as automobiles, airplanes, ships, or the like. On the other hand, compared with a liquid crystal antenna, since the signal is controlled by the light source rather than by the electric field generated by the electrodes, the antenna can avoid the influence of the control of the dielectric variable layer on the transmission signal.

Figure 3:
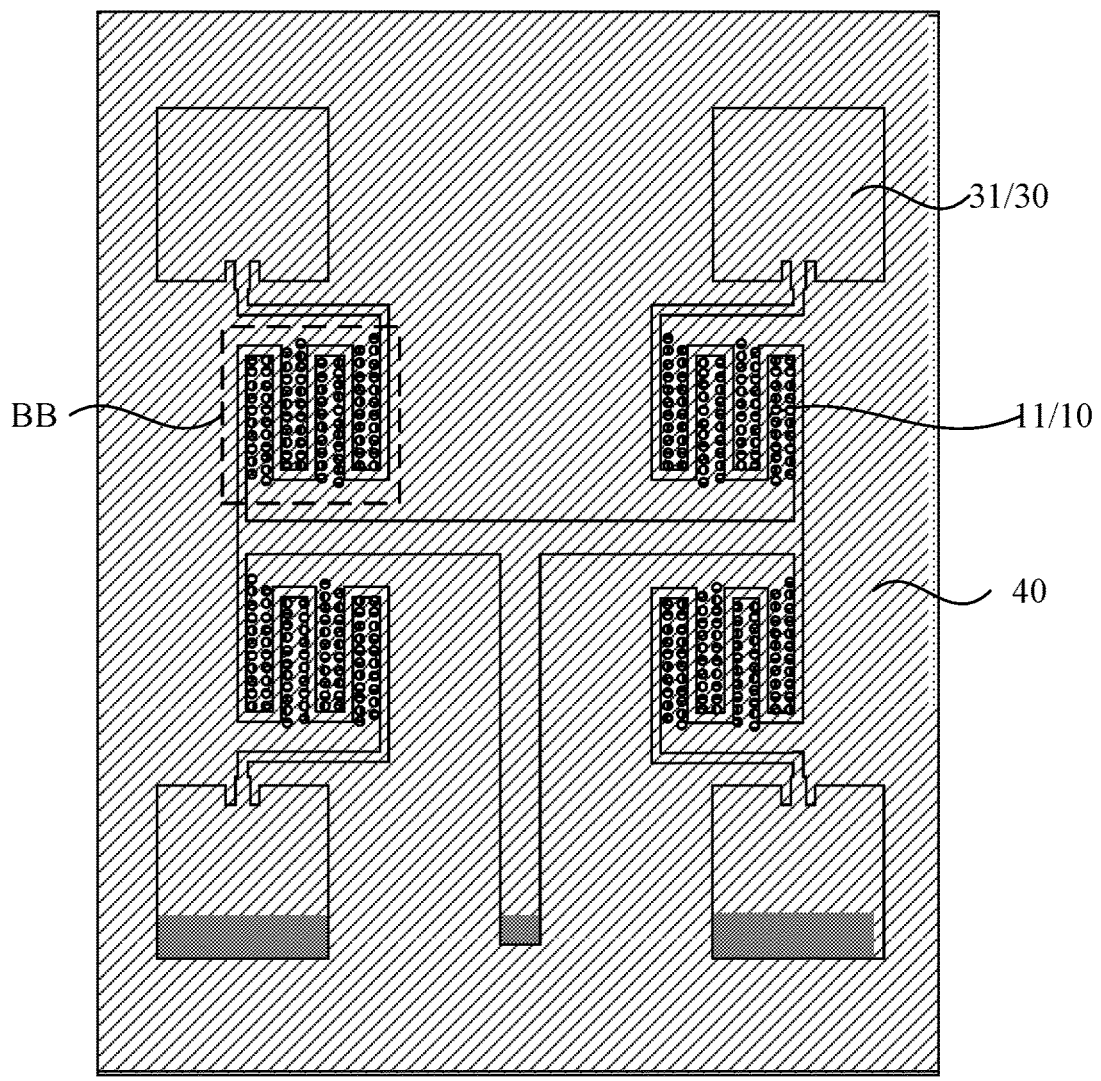
FIG. 3 is a top view of another antenna according to an embodiment of the present disclosure.
Figure 4:
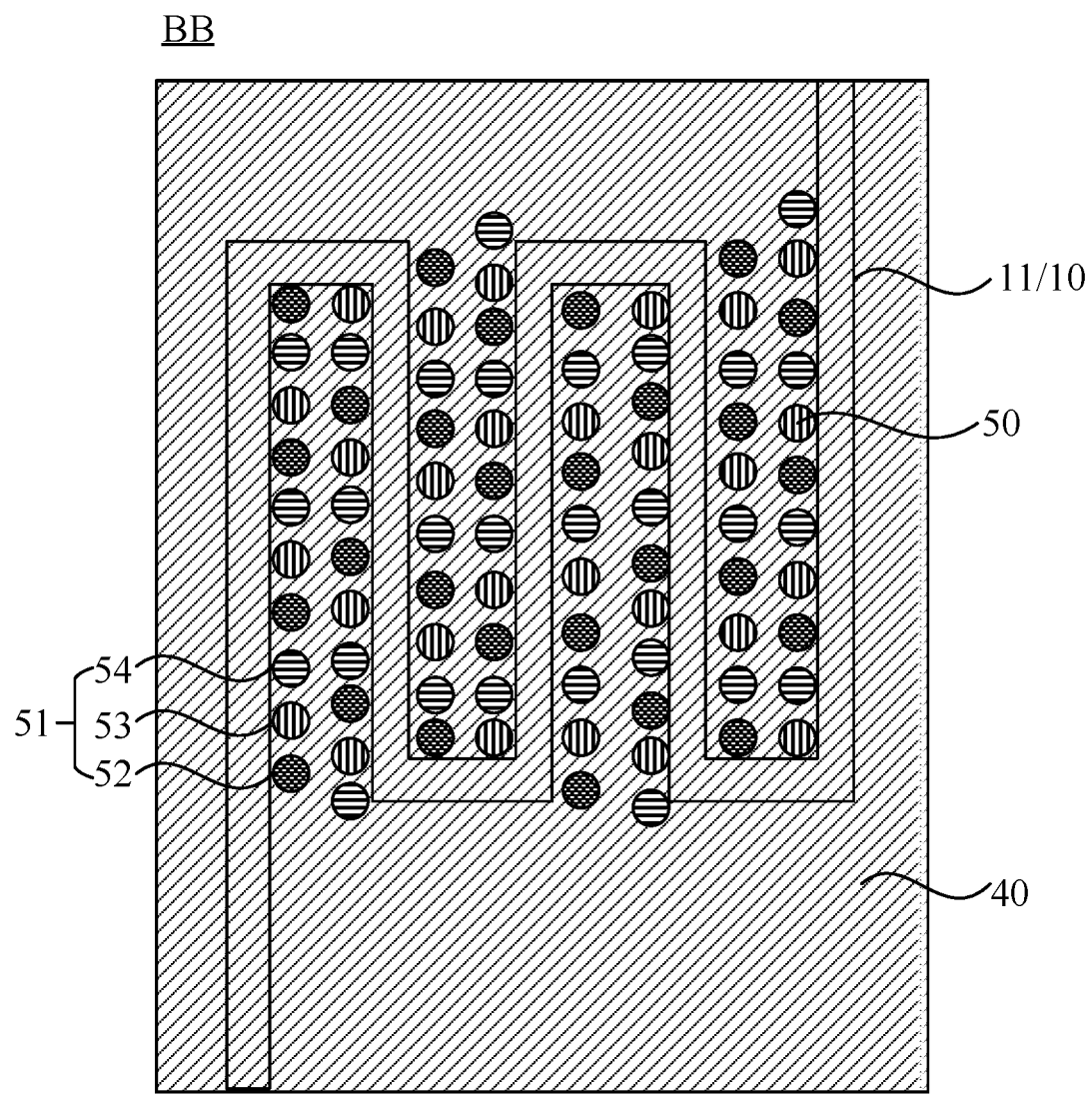
FIG. 4 is a partial enlarged view of a BB region of FIG. 3.

It is to be noted that the dielectric constant of the photodielectric variable layer 40 may be changed through the light intensity of the light and may also be changed through the light wavelength of the light. When the dielectric constant of the photodielectric variable layer 40 is changed through the light intensity of the light, in an embodiment, still referring to FIGS. 1 and 2, the at least one light-emitting element 50 includes a plurality of light-emitting elements 50, the light emitted by the plurality of light-emitting elements 50 may be, for example, ultraviolet light, and the dielectric constant of the photodielectric variable layer 40 is changed through the light intensity of the ultraviolet light. Exemplarily, a material of the photodielectric variable layer 40 may include azo dyes or azo polymers. The azo dyes or azo polymers are sensitive to the ultraviolet light. When the light-emitting element 50 emits the ultraviolet light, the ultraviolet light can reverse the molecular structure of the azo dyes or azo polymers, for example, the molecular structure changes between the cis-form and the trans-form, so that the dielectric constant of the photodielectric variable layer 40 is changed. It is to be understood that the material of the photodielectric variable layer 40 is not limited to the azo dyes or azo polymers and the light emitted by the light-emitting element 50 is also not limited to the ultraviolet light, which can be selected by those skilled in the art according to the actual situation as long as the phase of the electrical signal transmitted on the transmission electrode 11 can be shifted through the photodielectric variable layer 40 to change the phase of the electrical signal. When the dielectric constant of the photodielectric variable layer 40 is changed through the light wavelength of the light, in an embodiment, FIG. 3 is a top view of another antenna according to an embodiment of the present disclosure, and FIG. 4 is a partial enlarged view of a BB region of FIG. 3. As shown in FIGS. 3 and 4, the at least one light-emitting element 50 includes a plurality of light-emitting elements 50, and the plurality of light-emitting elements 50 form a plurality of light-emitting element groups 51; and each of the plurality of light-emitting element groups 51 includes a first light-emitting element 52 having a light-emitting color of a first color, a second light-emitting element 53 having a light-emitting color of a second color, and a third light-emitting element 54 having a light-emitting color of a third color. The light-emitting color of the first light-emitting element 52 may be, for example, green, the light-emitting color of the second light-emitting element 53 may be, for example, red, the light-emitting color of the third light-emitting element 54 may be, for example, blue, and three colors of red, green, and blue in different proportions are combined to a desired light wavelength so that the dielectric constant of the photodielectric variable layer 40 is changed. In addition, a quantum dot layer (not shown in the figure) may further be provided between the light-emitting element 50 and the photodielectric variable layer 40 so that when the light-emitting element 50 is a monochromatic light-emitting element, the light intensity can be increased. Alternatively, different quantum dot layers are provided between the light-emitting element 50 and the photodielectric variable layer 40, and the light emitted by the monochromatic light-emitting element is converted by the quantum dot layers to form lights of different colors such that the required light wavelength is synthesized.

It is to be noted that the type of the light-emitting element 50 includes, but is not limited to, the above examples. FIGS. 1 and 2 describe an example in which the light-emitting element 50 is the Micro LED and the Micro LED uses a flip-chip and bottom-emitting light-emitting chip. When the light-emitting element 50 includes the Micro LED, since a size of the Micro LED is smaller, the number of Micro LEDs may be larger. In this way, the amount of light irradiated to each region of the photodielectric variable layer 40 is substantially consistent, and consistency of the change of the dielectric constant of each region of the photodielectric variable layer 40 is ensured.

It is to be noted that this embodiment does not limit materials of the first electrode 10, the second electrode 20, and the third electrode 30. Exemplarily, the second electrode 20 may be made of metal or indium tin oxide. When the second electrode 20 may be made of the metal, for example, the second electrode 20 may be made of copper. When the second electrode 20 is made of the copper, the light emitted by the light-emitting element 50 may pass through the photodielectric variable layer 40 and be irradiated to the second electrode 20, and since the copper has a relatively high reflectivity, the light can be reflected by the second electrode 20 at this time, thereby improving the utilization rate of the light.

It is to be noted that the third electrode 30 and the first electrode 10 may be disposed in a same layer or in different layers, and FIGS. 1 and 2 only describe an example in which the third electrode 30 and the first electrode 10 are disposed in the same layer. When the third electrode 30 and the first electrode 10 are disposed in the same layer, processing steps may be simplified. In addition, when the third electrode 30 and the first electrode 10 are disposed in the same layer, that is, the radiator units 31 and the transmission electrodes 11 are disposed in the same layer and electrically connected to each other, compared with the liquid crystal antenna in which an electrical signal transmitted by an transmission electrode is coupled to a radiator unit through a liquid crystal layer, this technical scheme can directly transmit the electrical signal to the radiator units 31 without coupling due to the direct electric connection between the radiator units 31 and the transmission electrodes 11, so that the problem of loss of electric signal caused by coupling can be avoided. In an embodiment, still referring to FIG. 1, the antenna 100 provided by the embodiment of the present disclosure further includes a feed network 12, and the feed network 12 and the transmission electrodes 11 are disposed in a same layer and electrically connected to each other. That is to say, the radiator units 31, the transmission electrodes 11, and the feed network 12 are disposed in a same layer, the the feed network 12 is electrically connected to the transmission electrodes 11, and the transmission electrodes 11 are electrically connected to the radiator units 31. The feed network 12 directly transmits the electrical signal to the transmission electrodes 11 without coupling; and then the electrical signal is transmitted on the transmission electrodes 11, and the light emitted by the light-emitting element 50 and irradiated to the photodielectric variable layer 40 can change the dielectric constant of the photodielectric variable layer 40. When the dielectric constant of the photodielectric variable layer 40 changes, after the phase of the electrical signal transmitted on the transmission electrode 11 is shifted, a signal is directly radiated outward through the radiator units 31, and the coupling is also not required. Compared with the liquid crystal antenna in which the electrical signal transmitted in a feed network is coupled to the transmission electrode through the liquid crystal layer and then coupled to the radiator unit through the liquid crystal layer, the technical scheme provided by this embodiment can avoid the problem of loss of electric signal caused by two couplings.

In addition, the radiator units 31, the transmission electrodes 11, and the feed network 12 are disposed in the same layer and may be simultaneously formed by one process, thereby greatly reducing the production cost and facilitating large-scale commercial application.

It is to be noted that the light-emitting element 50 and the first electrode 10 may be disposed at a same side, that is, the first electrode 10 and the light-emitting element 50 are disposed on a side of the photodielectric variable layer 40, and the second electrode 20 is disposed on another side of the photodielectric variable layer 40; and the light-emitting element 50 may further be disposed at a same side as the second electrode 20, that is, the second electrode 20 and the light-emitting element 50 are disposed on a side of the photodielectric variable layer 40, and the first electrode 10 is disposed on another side of the photodielectric variable layer 40. FIGS. 1 and 2 only describe an example in which the light-emitting element 50 and the first electrode 10 are disposed on the same side. In other optional embodiments, the light-emitting element 50 may further be disposed at the side of the second electrode 20. The arrangement position of the light-emitting element 50 will be described in detail below with respect to these two cases.

Firstly, the light-emitting element 50 and the first electrode 10 being disposed on the same side is described as an example.

In an embodiment, still referring to FIGS. 1 and 2, the light-emitting element 50 is disposed on the side of the photodielectric variable layer 40 facing away from the second electrode 20 and does not overlap the transmission electrode 11; and the transmission electrode 11 includes a first boundary 111, the first boundary 111 is a boundary closest to a transmission electrode 11 from the light-emitting element 50, and a distance from the light-emitting element 50 to the first boundary 111 is D1, where 10 μm≤D1≤100 μm.

Considering that when the light-emitting element 50 is the Micro LED or the Mini LED, an anode and a cathode of the light-emitting element 50 transmit a signal, and if the light-emitting element 50 is too close to the transmission electrode 11, the signals transmitted in the light-emitting element 50 may interfere with the electrical signals transmitted on the transmission electrode 11; and if the light-emitting element 50 is too far away from the transmission electrode 11, the light emitted by the light-emitting element 50 cannot be irradiated to the photodielectric variable layer 40 below the transmission electrode 11, thereby causing the dielectric constant of the photodielectric variable layer 40 in this region to be unable to change and affecting the phase shift of the electrical signal. Therefore, in this embodiment, the distance between the light-emitting element 50 and the first boundary 111 is configured to be between 10 μm and 100 μm so that it is ensured that the electric signal transmitted by the transmission electrode 11 is not interfered with and the light emitted by the light-emitting element 50 is irradiated to the photodielectric variable layer 40 below the transmission electrode 11, and thus the dielectric constant of the photodielectric variable layer 40 in this region is changed.

In an embodiment, for example, still referring to FIGS. 1 and 3, the at least one light-emitting element 50 includes a plurality of light-emitting elements 50; shapes of the transmission electrodes 11 include a linear shape, the linear shape includes a plurality of segments connected to each other, and extension directions of at least two segments among the plurality of segments intersect with each other; and the plurality of light-emitting elements 50 are sequentially disposed along an extension direction of the transmission electrodes 11.

In this embodiment, the shapes of the transmission electrodes 11 are linear so that a path for transmitting the electrical signals is lengthened and the influence of the photodielectric variable layer 40 on electrical signals is increased. In addition, when the shapes of the transmission electrodes 11 are linear and the plurality of light-emitting elements 50 are sequentially disposed along the extension direction of the transmission electrodes 11, the amount of light irradiated to each region of the photodielectric variable layer 40 is substantially consistent, and the consistency of the change of the dielectric constant of each region of the photodielectric variable layer 40 is ensured.

Figure 5:
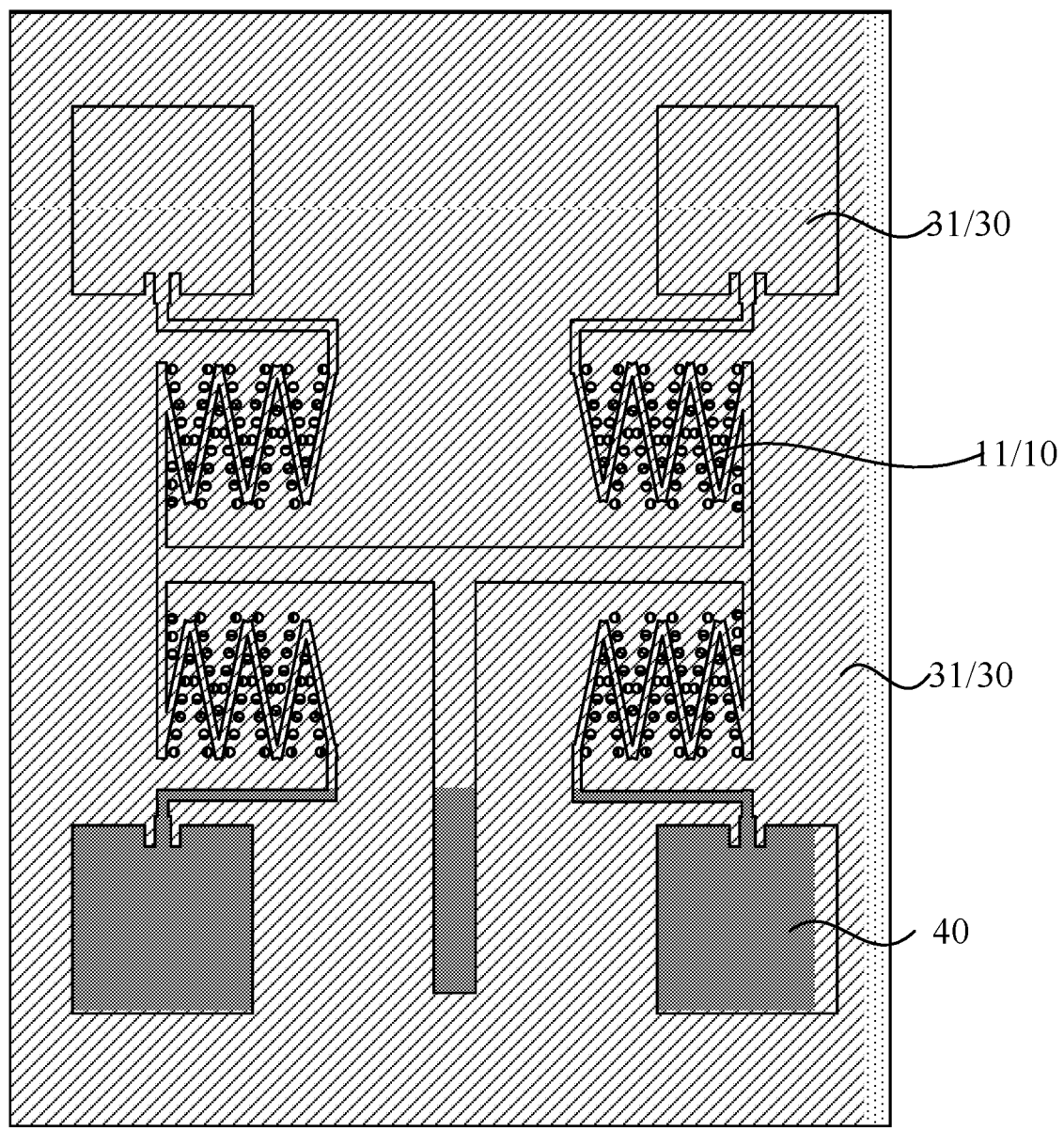
FIG. 5 is a top view of another antenna according to an embodiment of the present disclosure.

It is to be noted that when the shapes of the transmission electrodes 11 are linear, FIGS. 1 and 3 illustrate an example in which the transmission electrodes 11 are S-shaped, the example is not a limitation of the preset application, and those skilled in the art can set the shape of the transmission electrode according to the actual situation. In other optional embodiments, the shape of the transmission electrode 11 may also be a W-shape formed by multiple connected straight segments, for example, referring to FIG. 5 or an interconnected U-shape (not shown in the figure).

Figure 6:
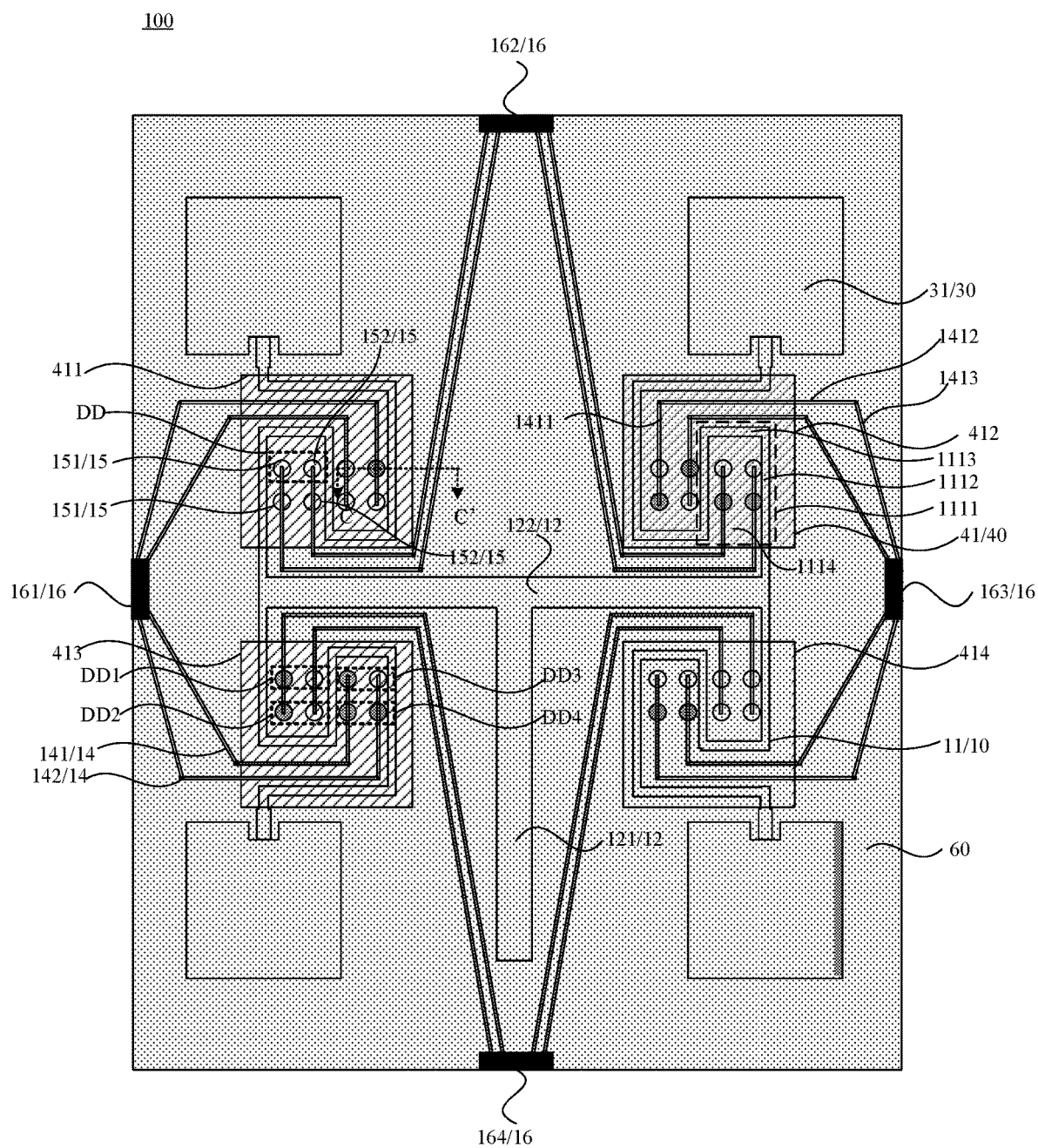
FIG. 6 is a top view of another antenna according to an embodiment of the present disclosure.
Figure 7:
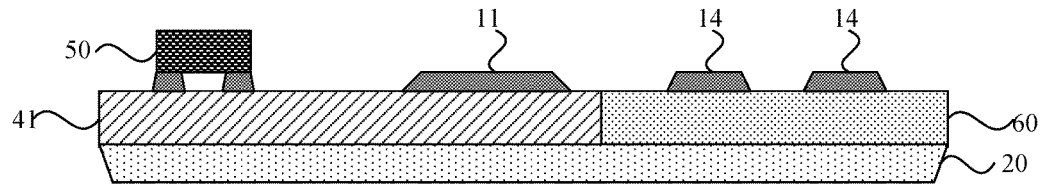
FIG. 7 is a cross-sectional structure view taken along a line C-C' of FIG. 6.

In an embodiment, FIG. 6 is a top view of another antenna according to an embodiment of the present disclosure, and FIG. 7 is a cross-sectional structure view taken along a line C-C' of FIG. 6. As shown in FIGS. 6 and 7, the light-emitting element 50 is disposed on the side of the photodielectric variable layer 40 facing away from the second electrode 20. The antenna 100 further includes a signal trace 14 and a light-emitting element connection pad 15. The light-emitting element 50 is disposed in a light-emitting element arrangement region DD and disposed on the light-emitting element connection pad 15, and the light-emitting element connection pad 15 is electrically connected to the light-emitting element 50 and the signal trace 14, separately. The signal trace 14, the light-emitting element connection pad 15, and the transmission electrodes 11 are disposed in a same layer. It is to be noted that in order to clearly show a positional relationship between the light-emitting element connection pad 15 and the signal trace 14 in FIG. 6, the light-emitting element 50 is not shown in the light-emitting element arrangement region DD of FIG. 6.

Exemplarily, still referring to FIGS. 6 and 7, the light-emitting element 50 in this embodiment includes the Micro LED and a type of the Micro LED is a lateral structure. Correspondingly, the light-emitting element connection pad 15 includes a first light-emitting element connection pad 151 and a second light-emitting element connection pad 152, the first light-emitting element connection pad 151 is electrically connected to the anode of the light-emitting element 50, the second light-emitting element connection pad 152 is electrically connected to the cathode of the light-emitting element 50, the first light-emitting element connection pad 151 is electrically connected to a signal trace 14 transmitting an anode signal, and the second light-emitting element connection pad 152 is electrically connected to a signal trace 14 transmitting a cathode signal. In addition, the antenna 100 further includes a drive circuit 16, and the drive circuit 16 may be, for example, a driver chip, or may be, for example, a flexible printed circuit board. The signal trace 14 is configured to receive a driving signal sent by the drive circuit 16 and transmit the driving signal to the light-emitting element connection pad 15 to drive the light-emitting element 50 to emit light. In this embodiment, the signal trace 14, the first light-emitting element connection pad 151, the second light-emitting element connection pad 152, the radiator units 31, and the transmission electrodes 11 are disposed in the same layer so that not only the interference to the electric signal transmitted on the transmission electrode 11 caused by the cross-line on the transmission electrodes 11 can be avoided, but also a lower cost is achieved.

It is to be understood that the above embodiment only describes an example in which the light-emitting element 50 includes the Micro LED and the type of the Micro LED is the Micro LED with the lateral structure and not limits the present application. In other optional embodiments, the light-emitting element 50 may further include the Mini LED.

It is to be noted that the above embodiment only describes an example in which the light-emitting element 50 is driven in a passive driving mode, the example is not a limitation of the preset application, and those skilled in the art can select the driving mode of the light-emitting element 50 according to the actual situation.

In an embodiment, still referring to FIGS. 6 and 7, the photodielectric variable layer 40 includes a plurality of photodielectric variable units 41. For example, the photodielectric variable layer 40 includes four photodielectric variable units 41, and the four photodielectric variable units 41 are a first photodielectric variable unit 411, a second photodielectric variable unit 412, a third photodielectric variable unit 413, and a fourth photodielectric variable unit 414, separately. It is to be understood that in order to avoid the occurrence of electric connection between the first electrode 10 and the second electrode 20 and/or support the whole antenna, a second substrate base plate 60 is further included between adjacent photodielectric variable units 41. A specific arrangement of the structure and a corresponding preparation method will be described in detail in the following examples and will not be repeated herein.

The at least one light-emitting element 50 includes a plurality of light-emitting elements 50. Each photodielectric variable unit 41 corresponds to a plurality of light-emitting elements 50 and overlaps the transmission electrode 11. For example, each photodielectric variable unit 41 corresponds to four light-emitting elements 50. As described above, in order to clearly show the positional relationship between the light-emitting element connection pad 15 and the signal trace 14 in FIG. 6, the light-emitting element 50 is not shown in the light-emitting element arrangement region DD of FIG. 6, and only the light-emitting element arrangement region DD is shown in FIG. 6. A first light-emitting element arrangement region DD1 is provided with the first light-emitting element, a second light-emitting element arrangement region DD2 is provided with the second light-emitting element, a third light-emitting element arrangement region DD3 is provided with the third light-emitting element, and a fourth light-emitting element arrangement region DD4 is provided with the fourth light-emitting element.

The signal trace 14 includes an anode signal trace 141 and a cathode signal trace 142. Anodes of at least part of the plurality of light-emitting elements 50 corresponding to a same photodielectric variable unit 41 are electrically connected to a same anode signal trace 141. Cathodes of at least part of the plurality of light-emitting elements 50 are electrically connected to a same cathode signal trace 142. For example, in the four light-emitting elements 50 corresponding to the third photodielectric variable unit 413, a first light-emitting element connection pad 151 corresponding to a first light-emitting element disposed in the first light-emitting element arrangement region DD1 and a first light-emitting element connection pad 151 corresponding to a second light-emitting element disposed in the second light-emitting element arrangement region DD2 are electrically connected to a same anode signal trace 141, and a second light-emitting element connection pad 152 corresponding to the first light-emitting element disposed in the first light-emitting element arrangement region DD1 and a second light-emitting element connection pad 152 corresponding to the second light-emitting element disposed in the second light-emitting element arrangement region DD2 are electrically connected to a same cathode signal trace 142. This configuration has advantages that the structure is simple, a reduction of the number of control terminals on the chip for providing an anode signal and a cathode signal is facilitated and saving of the cost of the chip is facilitated. In addition, since each cathode in the light-emitting element 50 can receive a same signal, the cathodes of all the light-emitting elements 50 can be electrically connected to a same cathode signal trace 142. In this way, the number of control terminals on the chip can be further reduced.

Figure 8:
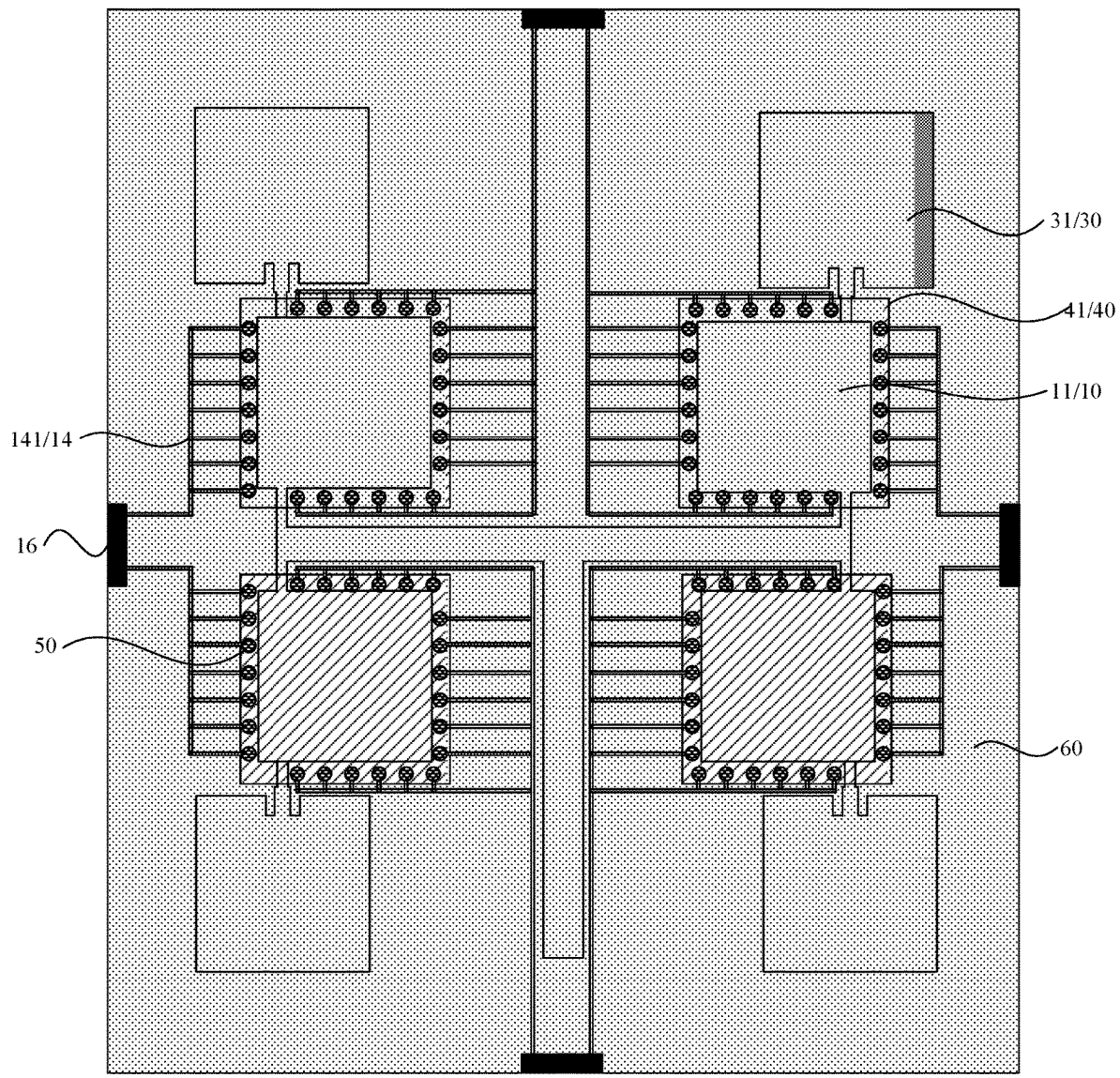
FIG. 8 is a top view of another antenna according to an embodiment of the present disclosure.

It is to be noted that FIG. 6 only illustrates an example in which the shapes of the transmission electrodes 11 are linear. In other optional embodiments, the shapes of the transmission electrodes 11 may further be a block. For example, referring to FIG. 8, when the transmission electrode 11 has a block shape, the light-emitting elements 50 are successively disposed in series along edges of the transmission electrode 11. Anodes of at least part of the plurality of light-emitting elements 50 corresponding to a same photodielectric variable unit 41 are electrically connected to the same anode signal trace 141. Cathodes of at least part of the plurality of light-emitting elements 50 are electrically connected to the same cathode signal trace 142. FIG. 8 only illustrates the anode signal trace 141 and does not illustrate the cathode signal trace 142.

It is further to be noted that FIG. 6 describes an example in which the photodielectric variable layer 40 includes four photodielectric variable units 41 and each photodielectric variable unit 41 corresponds to four light-emitting elements 50. In other optional embodiments, the number of light-emitting elements 50 corresponding to each photodielectric variable unit 41 is not limited to four, and the number of light-emitting elements 50 corresponding to different photodielectric variable units 41 may be different.

In an embodiment, each side of the antenna is provided with the drive circuit. Exemplarily, still referring to FIG. 6, the antenna 100 further includes a plurality of drive circuits 16, and the plurality of drive circuits 16 are respectively disposed on each side of the antenna 100. The plurality of drive circuits 16 may include, for example, a first drive circuit 161, a second drive circuit 162, a third drive circuit 163, and a fourth drive circuit 164. In the four light-emitting elements 50 corresponding to the first photodielectric variable unit 411, an anode signal trace 141 electrically connected to a first light-emitting element connection pad 151 corresponding to a first light-emitting element disposed in the first light-emitting element arrangement region DD1 and a first light-emitting element connection pad 151 corresponding to a second light-emitting element disposed in the second light-emitting element arrangement region DD2 and a cathode signal trace 142 electrically connected to a second light-emitting element connection pad 152 corresponding to the first light-emitting element disposed in the first light-emitting element arrangement region DD1 and a second light-emitting element connection pad 152 corresponding to the second light-emitting element disposed in the second light-emitting element arrangement region DD2 are connected to the second drive circuit 162. In the four light-emitting elements 50 corresponding to the second photodielectric variable unit 412, an anode signal trace 141 electrically connected to a first light-emitting element connection pad 151 corresponding to a third light-emitting element disposed in the third light-emitting element arrangement region DD3 and a first light-emitting element connection pad 151 corresponding to a fourth light-emitting element disposed in the fourth light-emitting element arrangement region DD4 and a cathode signal trace 142 electrically connected to a second light-emitting element connection pad 152 corresponding to the third light-emitting element disposed in the third light-emitting element arrangement region DD3 and a second light-emitting element connection pad 152 corresponding to the fourth light-emitting element disposed in the fourth light-emitting element arrangement region DD4 are similarly connected to the second drive circuit 162. Similarly, in the four light-emitting elements 50 corresponding to the second photodielectric variable unit 412, an anode signal trace 141 electrically connected to a first light-emitting element connection pad 151 corresponding to a first light-emitting element disposed in the first light-emitting element arrangement region DD1 and a first light-emitting element connection pad 151 corresponding to a second light-emitting element disposed in the second light-emitting element arrangement region DD2 and a cathode signal trace 142 electrically connected to a second light-emitting element connection pad 152 corresponding to the first light-emitting element disposed in the first light-emitting element arrangement region DD1 and a second light-emitting element connection pad 152 corresponding to the second light-emitting element disposed in the second light-emitting element arrangement region DD2 are connected to the third drive circuit 163. In the four light-emitting elements 50 corresponding to the fourth photodielectric variable unit 414, an anode signal trace 141 electrically connected to a first light-emitting element connection pad 151 corresponding to a first light-emitting element disposed in the first light-emitting element arrangement region DD1 and a first light-emitting element connection pad 151 corresponding to a second light-emitting element disposed in the second light-emitting element arrangement region DD2 and a cathode signal trace 142 electrically connected to a second light-emitting element connection pad 152 corresponding to the first light-emitting element disposed in the first light-emitting element arrangement region DD1 and a second light-emitting element connection pad 152 corresponding to the second light-emitting element disposed in the second light-emitting element arrangement region DD2 are similarly connected to the third drive circuit 163. A specific manner in which the anode signal trace 141 and the cathode signal trace 142 corresponding to other photodielectric variable unit 41 are connected to the drive circuit is the same as the above manner and will not be repeated herein. In this way, when each side of the antenna is provided with the drive circuit 16, the reduction of cross-line is facilitated. In addition, the signal traces are connected to a closer drive circuit 16 so that the reduction of the cost of line manufacturing is facilitated.

Figure 9:
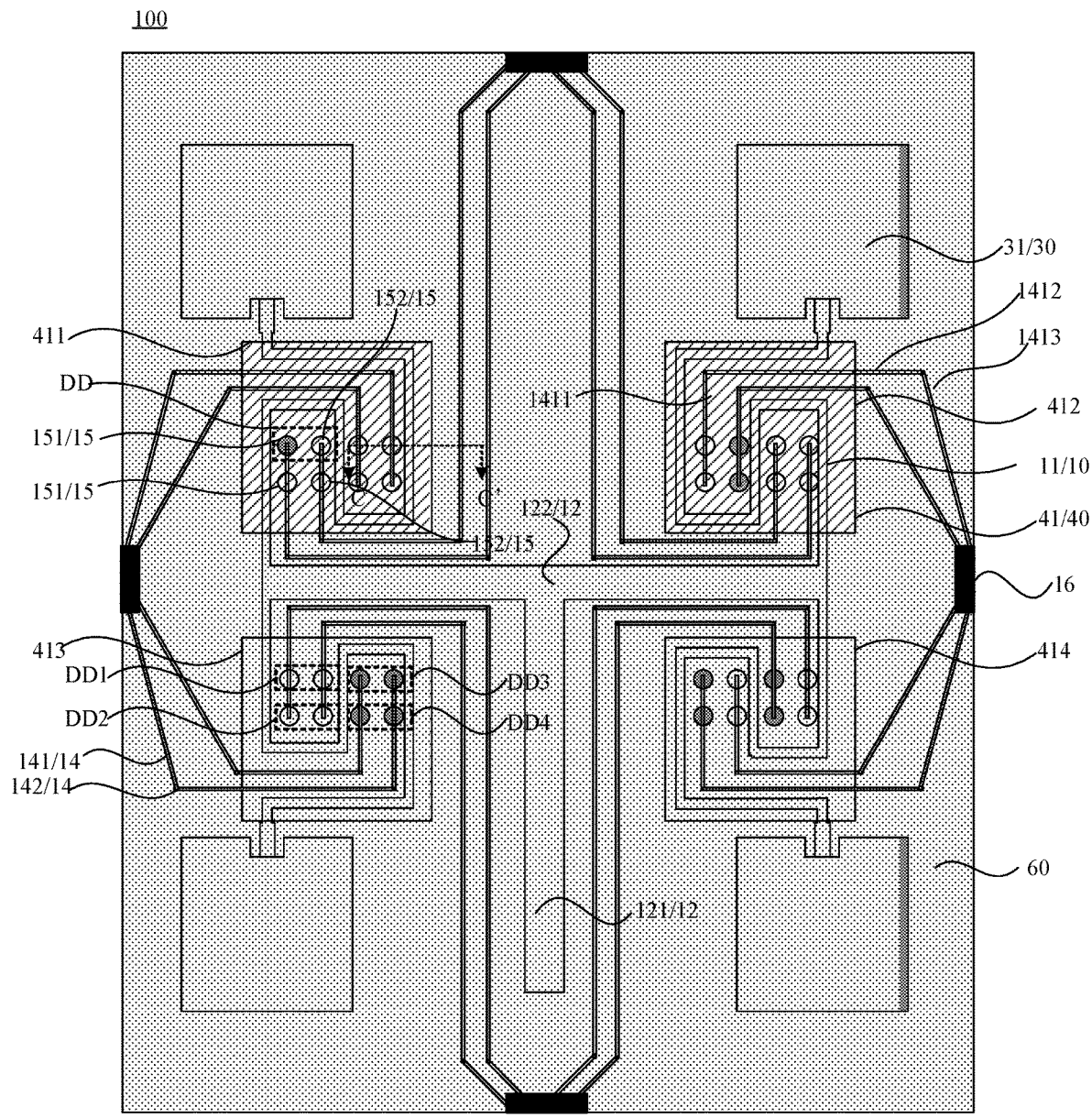
FIG. 9 is a top view of another antenna according to an embodiment of the present disclosure.

In an embodiment, still referring to FIG. 6, the signal trace 14 includes a plurality of connected subsections, and at least part of the plurality of connected subsections is parallel to part of the plurality of segments of the linear transmission electrode 11. Exemplarily, still referring to FIG. 6, the anode signal trace 141 includes a first subsection 1411, a second subsection 1412, and a third subsection 1413; and the linear transmission electrode 11 includes a transmission unit 1111, and the transmission unit 1111 includes a first segment 1112 and a second segment 1113. The first subsection 1411 is parallel to the first segment 1112 and the second subsection 1412 is parallel to the second segment 1113 so that cross-line can be reduced. In addition, an extension direction of the third subsection 1413 is at an acute angle with respect to or parallel to an extension direction of one section of the feed network 12. Exemplarily, still referring to FIG. 6, the feed network 12 includes a first feed unit 121 and a second feed unit 122. The third subsection 1413 corresponding to the second photodielectric variable unit 412 and the third subsection 1413 corresponding to the third photodielectric variable unit 413 are described as an example. An included angle between the extension direction of the third subsection 1413 corresponding to the second photodielectric variable unit 412 and an extension direction of the second feed unit 122 is 60°, and an included angle between the extension direction of the third subsection 1413 corresponding to the third photodielectric variable unit 413 and an extension direction of the first feed unit 121 is 30°. For another example, referring to FIG. 9, the third subsection 1413 corresponding to the second photodielectric variable unit 412 and the third subsection 1413 corresponding to the third photodielectric variable unit 413 are described as an example. The included angle between the extension direction of the third subsection 1413 corresponding to the second photodielectric variable unit 412 and the extension direction of the second feed unit 122 is 60°, and the included angle between the extension direction of the third subsection 1413 corresponding to the third photodielectric variable unit 413 and the extension direction of the first feed unit 121 is 0°.

In addition, still referring to FIG. 6, the transmission unit 1111 further includes a transmission opening 1114, and signal traces 14 corresponding to light-emitting elements 50 in transmission openings 1114 with a same orientation in a same transmission electrode 11 are electrically connected to a same drive circuit 16. In this way, the reduction of cross-line is facilitated and the processing step is simplified.

A situation in which the light-emitting element 50 and the first electrode 10 are disposed on the same side is described above. It could be known from the above description that the light-emitting element 50 and the first electrode 10 are disposed on the same side and the dielectric constant of the photodielectric variable layer 40 is controlled to change through the light emitted by the light-emitting element 50 so that the electrical signal transmitted by the transmission electrode 11 is controlled to shift the phase. Compared with the liquid crystal antenna of the existing art, the antenna provided in the embodiment of the present disclosure can achieve the phase shift of the electrical signal by replacing the expensive liquid crystal layer with the photodielectric variable layer 40 with a relatively low price and reduce the cost of the antenna at the same time. In addition, since the light-emitting element 50 and at least one of the first electrode 10, the second electrode 20, or the third electrode 30 are an integral structure, that is, the light-emitting element 50 and the structure in the antenna 100 are integrated, the process steps are simplified and the preparation efficiency of the antenna 100 is improved. Moreover, a thickness of the antenna 100 can be reduced, thereby facilitating the miniaturization of the antenna 100.

A situation in which the light-emitting element 50 and the second electrode 20 are disposed on the same side is described below.

Figure 10:
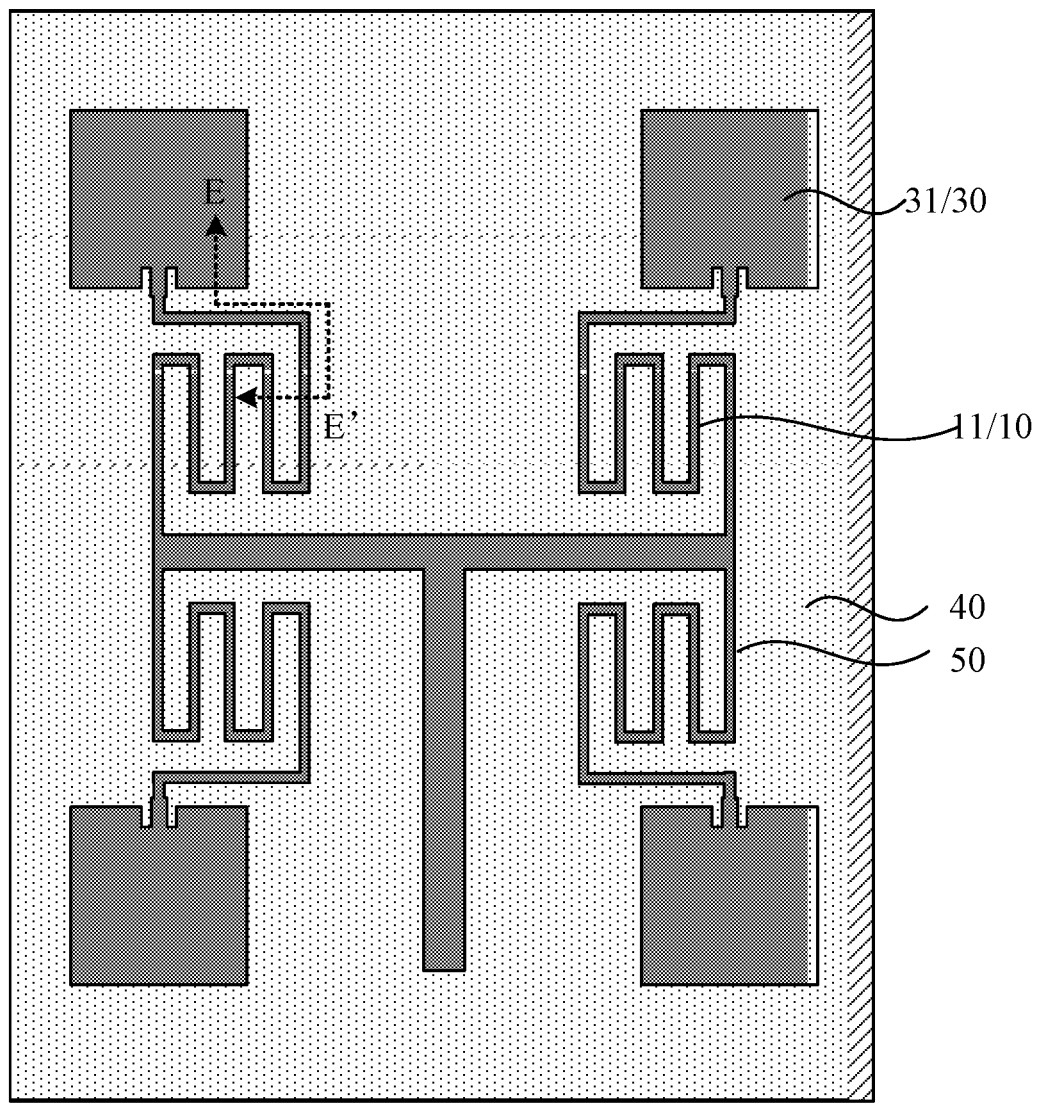
FIG. 10 is a top view of another antenna according to an embodiment of the present disclosure.
Figure 11:
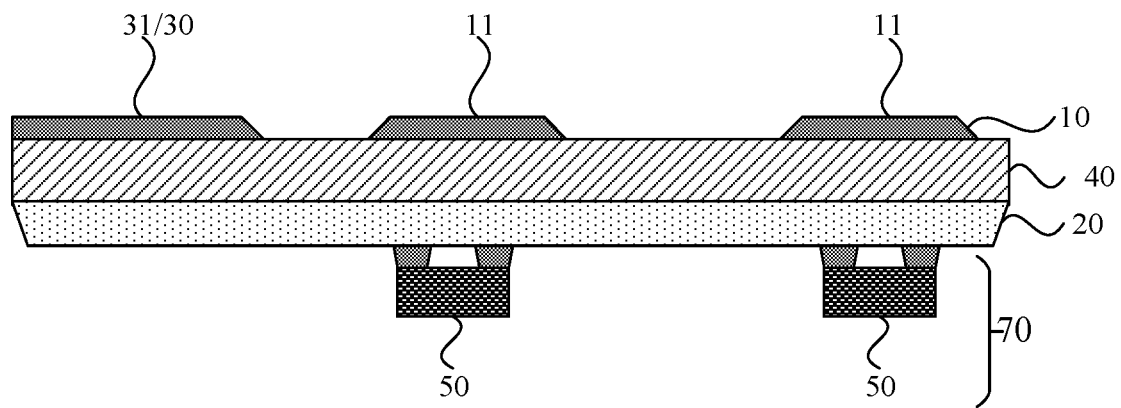
FIG. 11 is a cross-sectional structure view taken along a line E-E' of FIG. 10.

In an embodiment, FIG. 10 is a top view of another antenna according to an embodiment of the present disclosure, and FIG. 11 is a cross-sectional structure view taken along a line E-E' of FIG. 10. As shown in FIGS. 10 and 11, the antenna 100 provided by the embodiment of the present disclosure further includes a light-emitting element arrangement base plate 70 disposed on a side of the second electrode 20 facing away from the photodielectric variable layer 40, and the light-emitting element arrangement base plate 70 includes the light-emitting elements 50. It is to be noted that the light-emitting element arrangement base plate 70 is not a single substrate, but a combination of several films. The structure will be described in detail in the following embodiments and will not be repeated herein.

In this embodiment, the light-emitting element 50 is disposed on a side of the photodielectric variable layer 40 facing away from the first electrode 10, that is, the light-emitting element 50 may be disposed not only on a side of the photodielectric variable layer 40 facing towards the first electrode 10, but also on the side of the photodielectric variable layer 40 facing away from the first electrode 10, so that the arrangement position of the light-emitting element 50 is flexible.

It is to be noted that when the light-emitting element 50 is disposed on the side of the photodielectric variable layer 40 facing away from the first electrode 10, the shape of the transmission electrode 11 is not limited to the linear shape of FIG. 10 nor to the S-shape of FIG. 10, and those skilled in the art can set the shape of the transmission electrode according to the actual situation. For example, when the shape of the transmission electrode 11 is linear, the shape may also be a W-shape formed by multiple connected straight segments, or an interconnected U-shape. For another example, the shape of the transmission electrode 11 is a block.

In an embodiment, still referring to FIG. 10, the light-emitting elements 50 overlap the transmission electrodes 11. This arrangement has the advantage that a large amount of light emitted from the light-emitting element 50 can be ensured to be irradiated to the photodielectric variable layer 40 below the transmission electrode 11 so that the dielectric constant of the photodielectric variable layer 40 in this region is changed and the utilization rate of the light can be improved.

In an embodiment, still referring to FIG. 10, the at least one light-emitting element 50 includes a plurality of light-emitting elements 50; shapes of the transmission electrodes 11 include a linear shape, the linear shape includes a plurality of segments connected to each other, and extension directions of at least two segments among the plurality of segments intersect with each other; and the plurality of light-emitting elements 50 are sequentially disposed along an extension direction of the transmission electrodes 11.

In this embodiment, the shapes of the transmission electrodes 11 are linear so that the path for transmitting the electrical signals is lengthened and the influence of the photodielectric variable layer 40 on electrical signals is increased. In addition, when the shapes of the transmission electrodes 11 are linear and the plurality of light-emitting elements 50 are sequentially disposed along the extension direction of the transmission electrodes 11, the amount of light irradiated to each region of the photodielectric variable layer 40 is substantially consistent, and the consistency of the change of the dielectric constant of each region of the photodielectric variable layer 40 is ensured.

Figure 12:
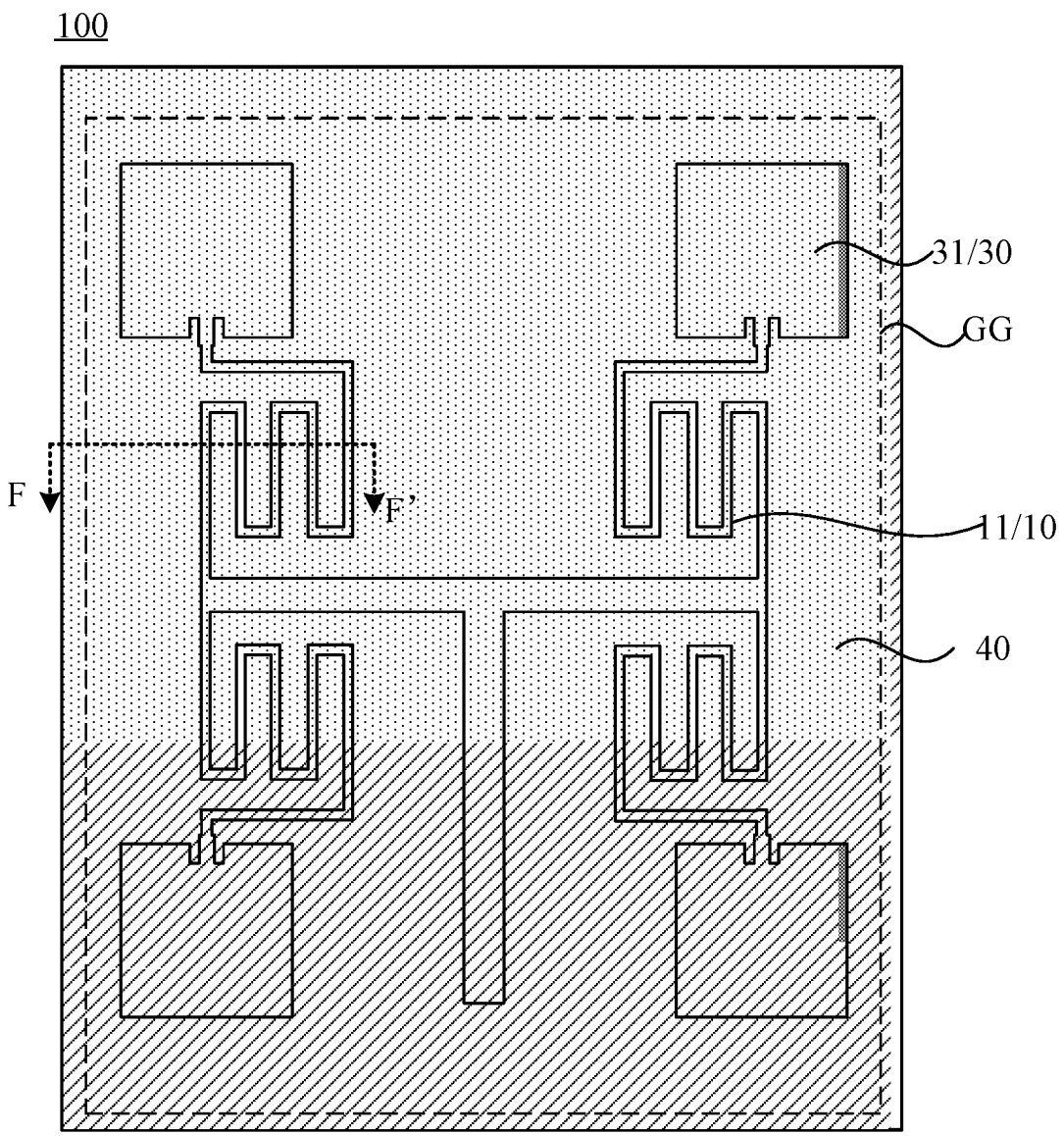
FIG. 12 is a top view of another antenna according to an embodiment of the present disclosure.
Figure 13:
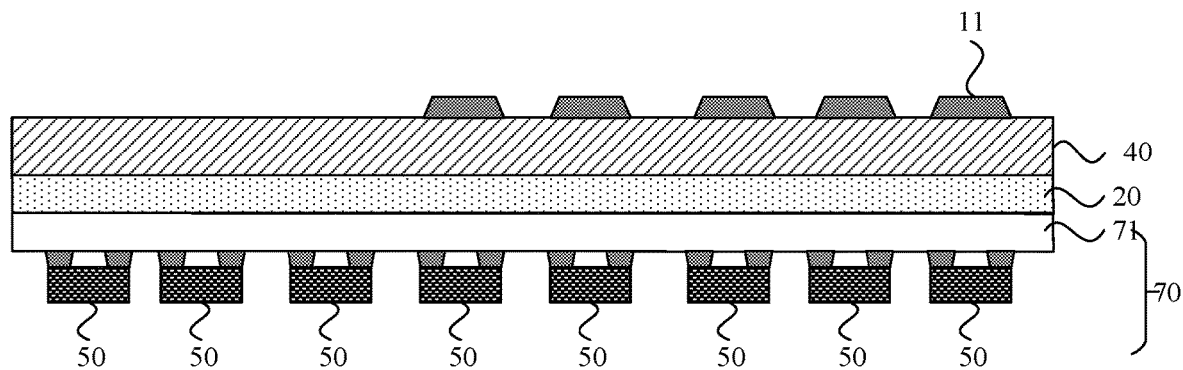
FIG. 13 is a cross-sectional structure view taken along a line F-F' of FIG. 12.

In an embodiment, FIG. 12 is a top view of another antenna according to an embodiment of the present disclosure, and FIG. 13 is a cross-sectional structure view taken along a line F-F' of FIG. 12. As shown in FIGS. 12 and 13, the light-emitting element arrangement base plate 70 further includes a first substrate base plate 71; the first substrate base plate 71 includes a light-emitting element arrangement region GG, and the transmission electrodes 11 are disposed on a same light-emitting element arrangement region GG; and the at least one light-emitting element 50 includes a plurality of light-emitting elements 50, and the plurality of light-emitting elements 50 are disposed in overall of the light-emitting element arrangement region GG. In this way, positions of the transmission electrodes 11 do not need to be positioned so that the process steps are simplified and the preparation efficiency of the antenna 100 is improved. It is to be understood that the light emitted by the light-emitting elements 50 can pass through the first substrate base plate 71 in this embodiment so that the light can be irradiated to the photodielectric variable layer 40.

Figure 14:
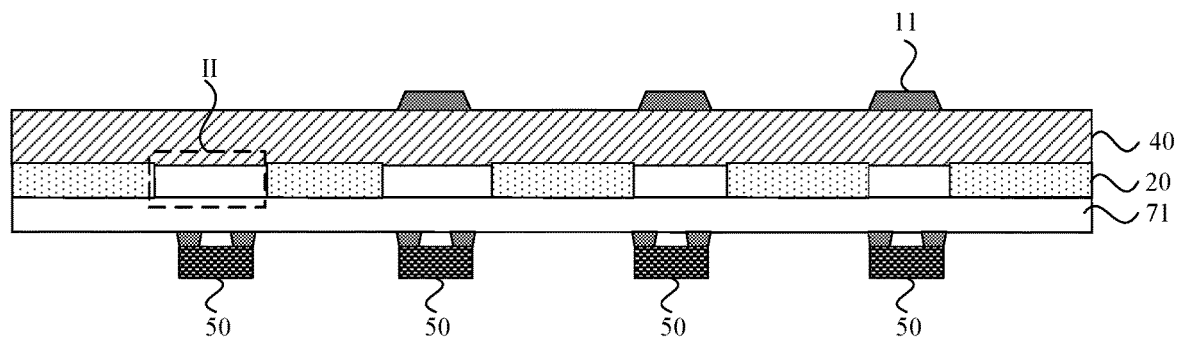
FIG. 14 is a structure diagram of a partial film of an antenna according to an embodiment of the present disclosure.

In an embodiment, FIG. 14 is a structure diagram of a partial film of an antenna according to an embodiment of the present disclosure. As shown in FIG. 14, the second electrode 20 includes a first hollowed-out structure II, and the first hollowed-out structure II overlaps the light-emitting element 50. In this way, the light emitted by the light-emitting elements 50 can pass through the first hollowed-out structure II and be irradiated to the photodielectric variable layer 40 so as to prevent the second electrode 20 from blocking the light emitted by the light-emitting element 50. In an embodiment, the light-emitting element 50 covers the first hollowed-out structure II. Since the light-emitting element 50 includes an electrode layer, such as an anode layer (transmitting an anode signal) and a cathode layer (transmitting a cathode signal), when the light-emitting element 50 covers the first hollowed-out structure II, the electrode layer in the light-emitting element 50 can prevent the electric signal transmitted by the transmission electrode 11 from being leaked outward through the first hollowed-out structure II.

In an embodiment, the second electrode 20 includes a light-transmitting electrode.

The light-transmitting electrode may be, for example, a transparent electrode, that is, the light emitted by the light-emitting element 50 may be irradiated to the photodielectric variable layer 40 through the transparent electrode. In this case, the transparent electrode may be made of, for example, indium tin oxide. The light-transmitting electrode is not limited to the transparent electrode, and may also be an electrode that can only transmit light that the photodielectric variable layer 40 can respond to. The light that the photodielectric variable layer 40 can respond to may be that the dielectric constant of the photodielectric variable layer 40 changes when the light is irradiated to the photodielectric variable layer 40. For example, the light that the photodielectric variable layer can respond to is blue light, and the light-transmitting electrode can transmit the blue light.

As can be seen from the above content, the light-emitting element arrangement base plate 70 is not a single substrate, but a combination of some films, that is, the light-emitting element arrangement base plate 70 includes not only the light-emitting element 50, but also traces for providing the anode signal and the cathode signal for the light-emitting element 50, an insulating layer, and the like. The light-emitting element arrangement base plate 70 will be described in detail below with reference to typical examples.

Figure 15:
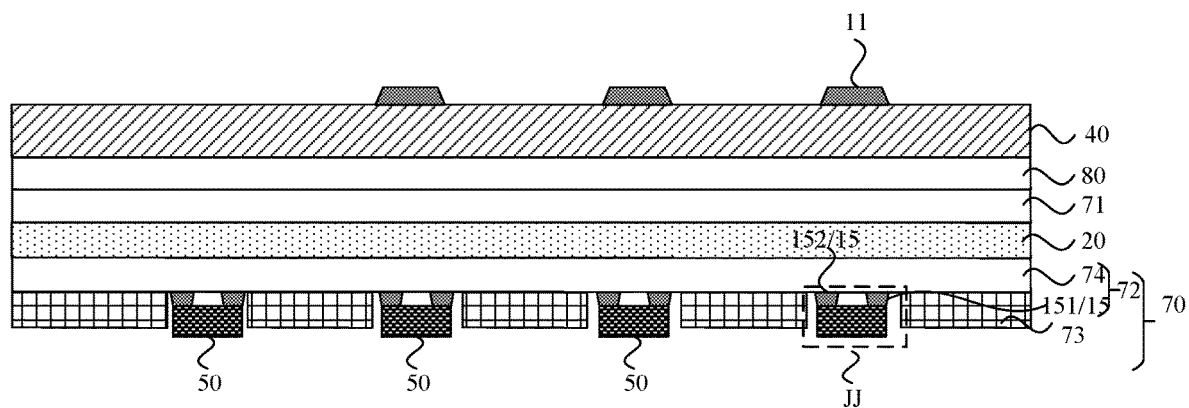
FIG. 15 is a structure diagram of a partial film of another antenna according to an embodiment of the present disclosure.

In an embodiment, FIG. 15 is a structure diagram of a partial film of another antenna according to an embodiment of the present disclosure. As shown in FIG. 15, the light-emitting element arrangement base plate 70 includes a circuit base plate 72 and a limiting layer 73; and the circuit base plate 72 includes a first surface provided with a light-emitting element connection pad 15, the limiting layer 73 is disposed on the first surface, and the limiting layer 73 includes a limiting hole JJ. A vertical projection of the limiting hole JJ on a plane where the first surface is located overlaps a vertical projection of the light-emitting element connection pad 15 on the plane where the first surface is located. A method for preparing an antenna with the structure will be described in the following embodiments and will not be repeated herein.

Exemplarily, still referring to FIG. 15, the circuit base plate 72 includes a transparent insulating layer 74, the light-emitting element connection pad 15, and a signal trace (not shown in the figure). The first surface of the circuit base plate 72 is provided with the limiting layer 73, the limiting layer 73 includes a plurality of limiting holes JJ, and each limiting hole JJ penetrates through the limiting layer 73 so as to expose the light-emitting element connection pad 15 on the circuit base plate 72. When the light-emitting element 50 is transferred to the circuit base plate 72, the light-emitting element 50 is located in the limiting hole JJ so that the electric connection between electrodes of the light-emitting element 50 and the light-emitting element connection pad 15 can be achieved.

In an embodiment, the limiting layer 73 may include, for example, a light-blockage layer. It is to be understood that the limiting layer 73 includes, but is not limited to, the light-blockage layer, which may be set by those skilled in the art according to the actual situation as long as the light-emitting element 50 is limited to a preset position to achieve the electric connection between the light-emitting element 50 and the light-emitting element connection pad 15.

It is to be understood that the light-emitting element 50 may be driven to emit light in an active driving manner or a passive driving manner.

Figure 16:
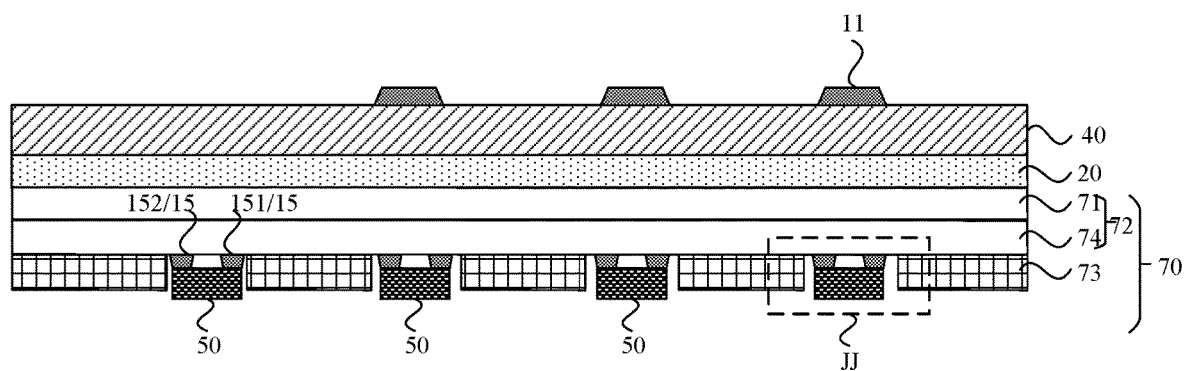
FIG. 16 is a structure diagram of a partial film of another antenna according to an embodiment of the present disclosure.

When the light-emitting element 50 is driven to emit light in the passive driving manner, in an embodiment, FIG. 16 is a structure diagram of a partial film of another antenna according to an embodiment of the present disclosure. As shown in FIG. 16, the circuit base plate 72 includes a first substrate base plate 71, a transparent insulating layer 74 disposed on a side of the first substrate base plate 71, and a signal trace layer disposed on a side of the transparent insulating layer 74 facing away from the first substrate base plate 71. The signal trace layer includes the signal trace (not shown in FIG. 15) and the light-emitting element connection pad 15. The light-emitting element 50 is disposed on the light-emitting element connection pad 15, and the light-emitting element connection pad 15 is electrically connected to the light-emitting element 50 and the signal trace, separately. That is to say, the signal on the chip is directly transmitted to the light-emitting element connection pad 15 through the signal trace and then transmitted to the light-emitting element 50 through the light-emitting element connection pad 15 to drive the light-emitting element 50 to emit light. It is to be understood that when the light-emitting element 50 is driven to emit light in the passive driving manner, the antenna is not limited to the antenna shown in FIG. 16 and may further be the antenna shown in FIG. 15.

Figure 17:
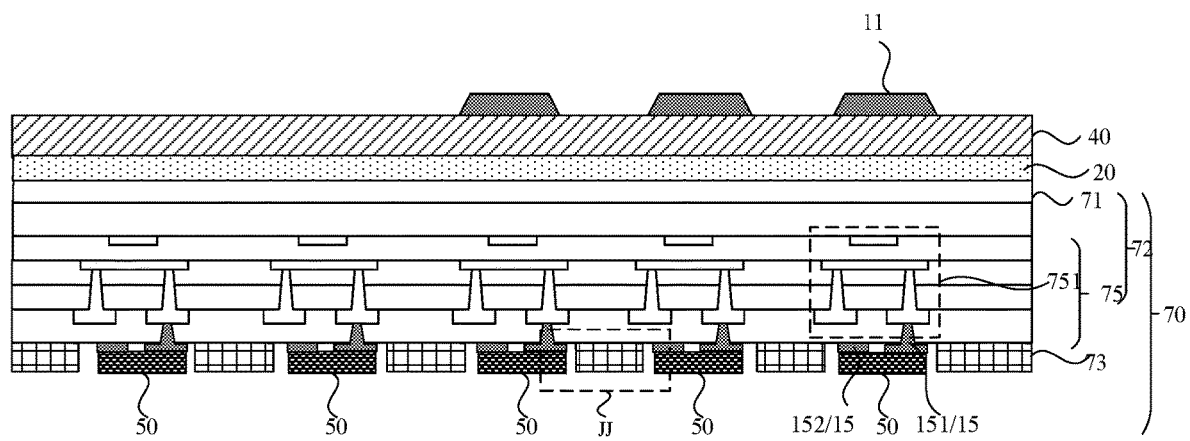
FIG. 17 is a structure diagram of a partial film of another antenna according to an embodiment of the present disclosure.

When the light-emitting element 50 is driven to emit light in the active driving manner, in an embodiment, FIG. 17 is a structure diagram of a partial film of another antenna according to an embodiment of the present disclosure. As shown in FIG. 17, the circuit base plate 72 includes a first substrate base plate 71 and a pixel circuit layer 75 disposed on a side of the first substrate base plate 71. The pixel circuit layer 75 includes a pixel circuit 751, and the pixel circuit 751 is electrically connected to the anode of the light-emitting element 50. The pixel circuit 751 may be electrically connected to the light-emitting element 50 through, for example, the light-emitting element connection pad 15 to drive a corresponding light-emitting element 50 to emit light, and the embodiment of the present disclosure does not specifically limit the specific structure of the pixel circuit 751 on the premise that the above functions can be achieved. For example, a pixel circuit 751 having a 2T1C (two transistors and one capacitor) structure or a pixel circuit 751 having a 7T1C (seven transistors and one capacitor) structure may be used.

Figure 18:
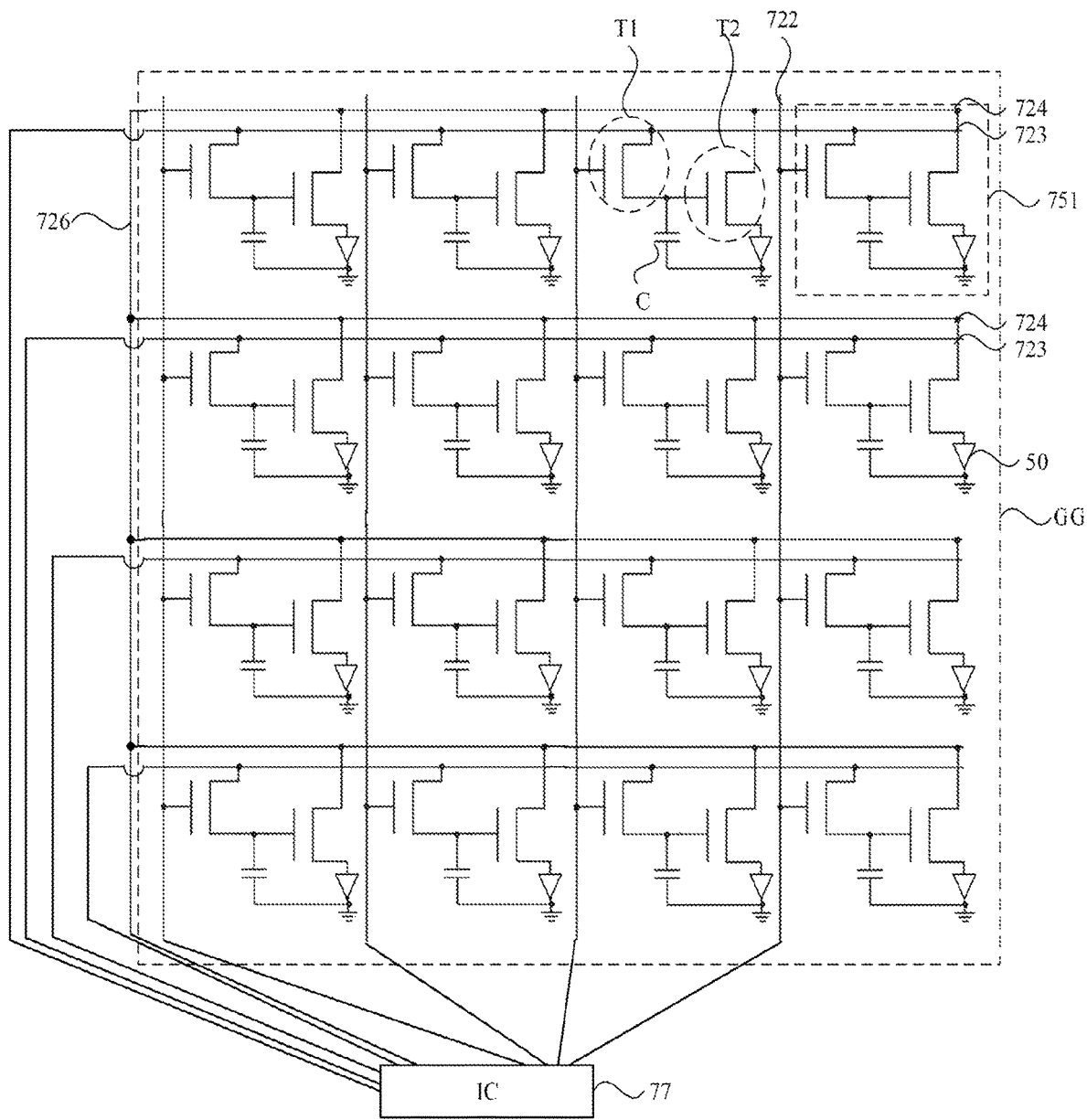
FIG. 18 is a circuit diagram of a pixel circuit according to an embodiment of the present disclosure.

In an embodiment, FIG. 18 is a circuit diagram of a pixel circuit according to an embodiment of the present disclosure. As shown in FIGS. 17 and 18, when the light-emitting elements 50 and the second electrode 20 are disposed on the same side and disposed in different layers, the plurality of light-emitting elements 50 are arranged in an array in the light-emitting element arrangement region GG. The light-emitting element arrangement base plate 70 further includes the pixel circuit layer 75 disposed on the first substrate base plate 71. The pixel circuit layer 75 includes pixel circuits 751 arranged in an array, a plurality of scanning lines 722, a plurality of data lines 723, a first power supply signal line 724, and a second power supply signal line (not shown in the figure). Pixel circuits 751 in a same row are electrically connected to a same data line 723, and the data line 723 is electrically connected to a driver chip 77 to receive a data signal. Pixel circuits 751 in a same column are electrically connected to a same scanning line 722, and the scanning line 722 is electrically connected to the driver chip 77 to receive a scanning signal. Pixel circuits 751 in a same row are electrically connected to a same first power supply signal line 724, first power supply signal lines 724 corresponding to pixel circuits 751 of different rows are electrically connected to a same power supply signal bus 726, and the power supply signal bus 726 is electrically connected to the driver chip 77 to receive a first power supply signal. The pixel circuits 751 are electrically connected to anodes of the light-emitting elements 50 in one-to-one correspondence.

Exemplarily, the pixel circuit 751 includes a drive transistor T1, a data writing transistor T2, and a storage capacitor C, that is, the pixel circuit 751 having 2T1C is used to drive the light-emitting element 50. In an embodiment, the scanning signal transmitted by the scanning line 722 is written into a gate of the data writing transistor T2 to turn on the data writing transistor T2; and then the data signal transmitted on the data line 723 is written to a gate of the drive transistor T1 through the data writing transistor T2, so that the drive transistor T1 generates a driving current for driving the light-emitting element 50 to emit light. In an embodiment, the antenna 100 is further provided with a cascaded shifting register (not shown in the figure), and the shifting register receives a signal sent by the driver chip 77 to output the scanning signal to the scanning lines 722.

In the technical scheme provided in this embodiment, since the light-emitting element 50 and the second electrode 20 are disposed on the same side and disposed in different layers, the pixel circuit layer 75 corresponding to the light-emitting elements 50 is separately disposed. In this way, the design of other films (the first electrode 10, the second electrode 20, and the third electrode 30) in the antenna does not need to be changed, thereby reducing the process difficulty.

It is to be noted that all the above embodiments are described with the example in which the light-emitting element 50 is the Micro LED and the Micro LED is the Micro LED with the lateral structure, that is, the anode and the cathode of the Micro LED are disposed at a same side; and correspondingly, the light-emitting element connection pad 15 includes the first light-emitting element connection pad 151 and the second light-emitting element connection pad 152, the first light-emitting element connection pad 151 is electrically connected to the anode of the Micro LED, and the second light-emitting element connection pad 152 is electrically connected to the cathode of the Micro LED. The example is not a limitation of the present application, and those skilled in the art can select according to the actual situation.

Figure 19:
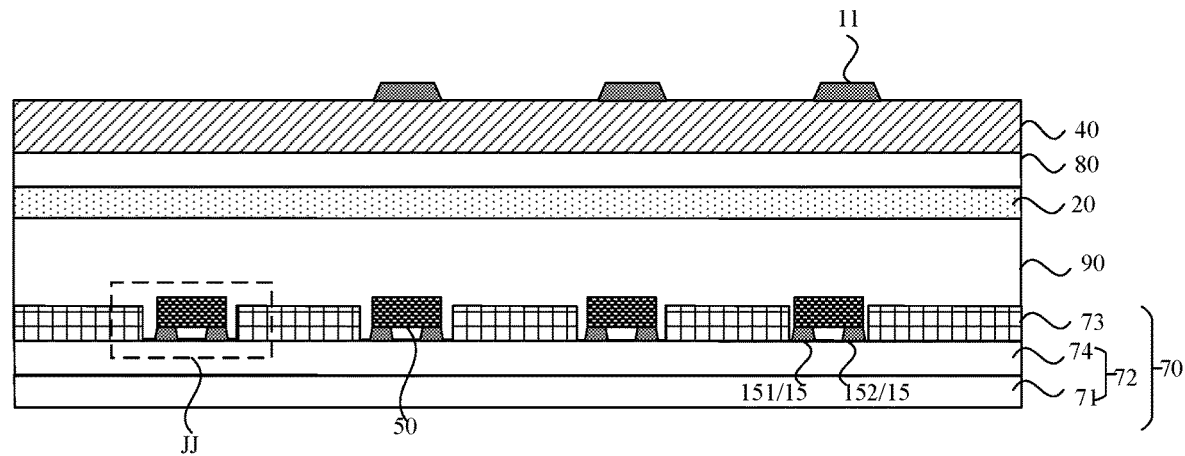
FIG. 19 is a structure diagram of a partial film of another antenna according to an embodiment of the present disclosure.
Figure 20:
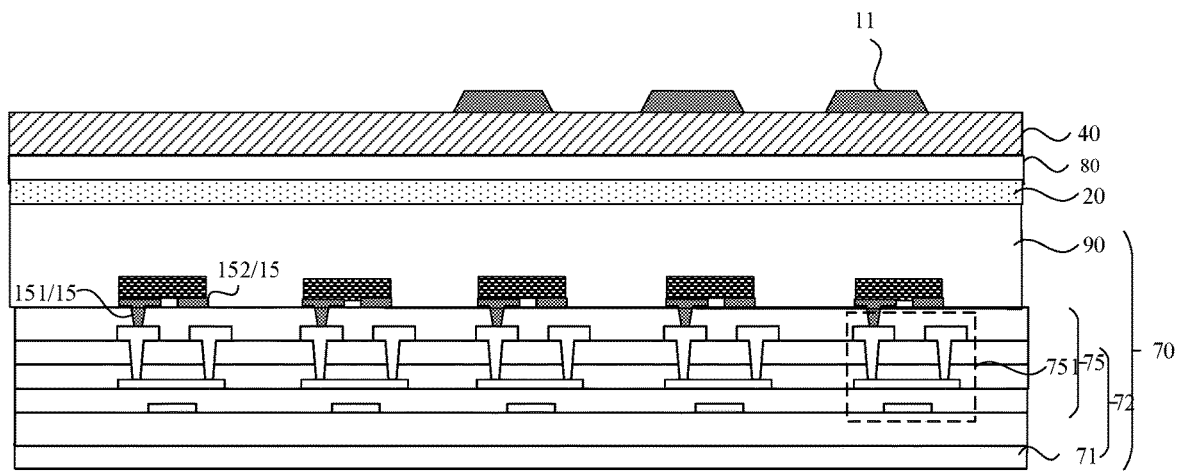
FIG. 20 is a structure diagram of a partial film of another antenna according to an embodiment of the present disclosure.

It is to be noted that FIGS. 16 and 17 only describe an example in which the light-emitting element 50 is disposed on the side of the first substrate base plate 71 facing away from the second electrode 20, that is, each film in the light-emitting element arrangement base plate 70 is formed on the first substrate base plate 71, and the second electrode 20, the photodielectric variable layer 40, the transmission electrodes 11, the radiator units 13, and the like are disposed on the side of the first substrate base plate 71 facing away from the light-emitting element arrangement base plate 70, but the example is not a limitation of the present application. In an embodiment, FIG. 19 is a structure diagram of a partial film of another antenna according to an embodiment of the present disclosure. As shown in FIG. 19, the antenna 100 provided by this embodiment further includes a sticking layer 80, and the sticking layer 80 is disposed on a side of the light-emitting element 50 facing away from the first substrate base plate 71 and disposed between the photodielectric variable layer 40 and the second electrode 20. The process of the method for preparing the antenna will be described in detail in the following embodiments and will not be repeated herein. In an embodiment, FIG. 20 is a structure diagram of a partial film of another antenna according to an embodiment of the present disclosure. The difference from FIG. 19 is that the light-emitting element 50 is driven to emit light in the passive driving manner in FIG. 19, and the light-emitting element 50 is driven to emit light in the active driving manner in FIG. 20.

It is to be understood that when the antenna 100 further includes the sticking layer 80 and the sticking layer 80 is disposed on the side of the light-emitting element 50 facing away from the first substrate base plate 71 and disposed between the photodielectric variable layer 40 and the second electrode 20, the transparent insulating layer 74 in FIG. 19 is not limited to a transparent material, and the material of the transparent insulating layer may be selected by those skilled in the art according to the actual situation.

A situation in which the light-emitting element 50 and the second electrode 20 are disposed on the same side is described above. As can be seen from the above description, when the light-emitting element 50 and the second electrode 20 are disposed on the same side, the arrangement mode of the light-emitting element 50 is more flexible.

To sum up, when the light-emitting element 50 and the first electrode 10 are disposed on the same side or the light-emitting element 50 and the second electrode 20 are disposed on the same side, the dielectric constant of the photodielectric variable layer 40 can be controlled to change so that the electrical signal transmitted by the transmission electrode 11 is controlled to shift the phase. Compared with the liquid crystal antenna of the existing art, the antenna provided in the embodiment of the present disclosure can achieve the phase shift of the electrical signal by replacing the expensive liquid crystal layer with the photodielectric variable layer 40 with a relatively low price and reduce the cost of the antenna at the same time. In addition, since the light-emitting element 50 and at least one of the first electrode 10, the second electrode 20, or the third electrode 30 are an integral structure, that is, the light-emitting element 50 and the structure in the antenna 100 are integrated, the process steps are simplified and the preparation efficiency of the antenna 100 is improved. Moreover, the thickness of the antenna 100 can be reduced, thereby facilitating the miniaturization of the antenna 100.

In an embodiment, the antenna further includes at least one second substrate base plate. The at least one second substrate base plate and the photodielectric variable layer are disposed in a same layer; and/or the at least one second substrate base plate and the photodielectric variable layer are disposed in different layers and overlap each other.

The second substrate base plate may be made of, for example, one of polyimide, glass or liquid crystal polymer. It is to be understood that the material of the second substrate base plate includes, but is not limited to, the above examples and may be selected by those skilled in the art according to the actual situation.

Exemplarily, still referring to FIGS. 6 and 7, the antenna 100 further includes the second substrate base plate 60, and the second substrate base plate 60 and the photodielectric variable layer 40 are disposed in a same layer. In an embodiment, for example, the preparation steps of the antenna 100 shown in FIGS. 6 and 7 may be described below. First, the second electrode 20 is formed on a supporting layer (not shown in the figure). Then a side of the second electrode 20 facing away from the supporting layer is provided with the second substrate base plate 60. The second substrate base plate 60 includes a plurality of groove structures, and all the plurality of groove structures penetrate through the second substrate base plate 60. Each groove structure is provided with the photodielectric variable layer 40. A side of the second substrate base plate 60 facing away from the second electrode 20 is formed with the transmission electrodes 11, the radiator units 13, signal traces corresponding to the light-emitting elements 50, and light-emitting element connection pads. Finally, the light-emitting element 50 is bonded. If the antenna 100 requires the supporting layer, the supporting layer does not need to be peeled off; and if the antenna 100 does not requires the supporting layer, the supporting layer may be peeled off after the light-emitting element 50 is bonded, as shown in FIGS. 6 and 7.

Figure 21:
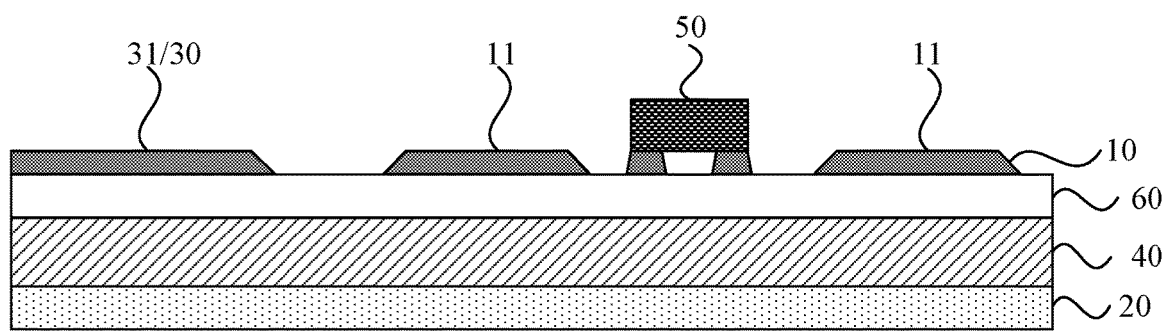
FIG. 21 is a structure diagram of a partial film of another antenna according to an embodiment of the present disclosure.

Exemplarily, FIG. 21 is a structure diagram of a partial film of another antenna according to an embodiment of the present disclosure. As shown in FIG. 21, the antenna 100 further includes a second substrate base plate 60, the second substrate base plate 60 and the the photodielectric variable layer 40 are disposed in different layers and overlap each other, and the second substrate base plate 60 is disposed between the first electrode 10 and the photodielectric variable layer 40. Alternatively, the second substrate base plate 60 is disposed between the second electrode 20 and the photodielectric variable layer 40.

Figure 22:
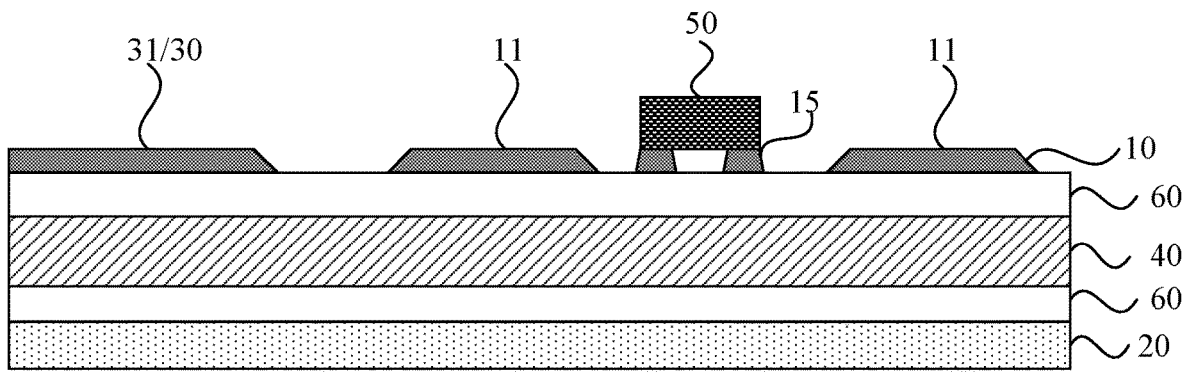
FIG. 22 is a structure diagram of a partial film of another antenna according to an embodiment of the present disclosure.

Exemplarily, FIG. 22 is a structure diagram of a partial film of another antenna according to an embodiment of the present disclosure. As shown in FIG. 22, the antenna 100 further includes two second substrate base plates 60, where one of the two the second substrate base plates 60 is disposed between the photodielectric variable layer 40 and the first electrode 10, and the other second substrate base plate 60 is disposed between the photodielectric variable layer 40 and the second electrode 20. The antenna provided by this embodiment has a simple structure so that the process steps are simplified and the preparation efficiency of the antenna 100 is improved during preparation of the antenna 100. The preparation steps of the antenna are not limited in this embodiment. For example, the transmission electrodes 11, the radiator units 13, the signal traces, the light-emitting element connection pads 15 and the like may be formed on one of the two second substrate base plates 60, and then the light-emitting elements 50 are bonded; the second electrode 20 is formed on the other second substrate base plate 60; and then the two second substrate base plates 60 are bonded to opposite two sides of the photodielectric variable layer 40 through OC optical glue or the like.

In an embodiment, still referring to FIGS. 21 and 22, the second substrate base plate 60 and the photodielectric variable layer 40 are disposed in different layers and overlap each other, and a thickness of the photodielectric variable layer 40 is greater than a thickness of the second substrate base plate 60 so that the influence of the photodielectric variable layer 40 on the electrical signal is increased.

Figure 23:
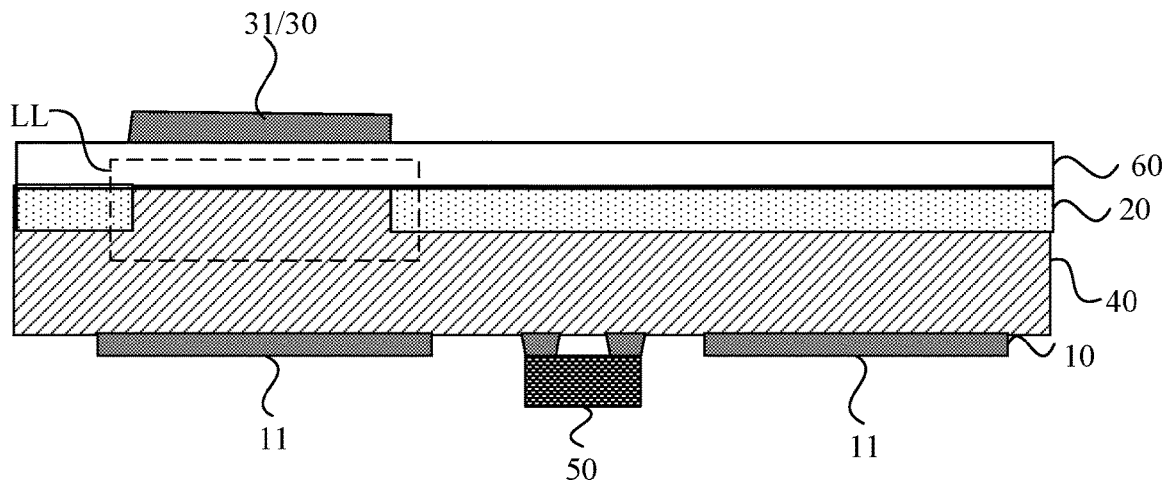
FIG. 23 is a structure diagram of a partial film of another antenna according to an embodiment of the present disclosure.

In an embodiment, FIG. 23 is a structure diagram of a partial film of another antenna according to an embodiment of the present disclosure. As shown in FIG. 23, the second substrate base plate 60 and the photodielectric variable layer 40 are disposed in different layers and overlap each other; the second substrate base plate 60 is disposed on a side of the second electrode 20 facing away from the first electrode 10, the third electrode 30 is disposed on a side of the second substrate base plate 60 facing away from the second electrode 20; and the second electrode 20 includes a plurality of second hollowed-out structures LL, vertical projections of the plurality of second hollowed-out structures LL on a plane where the second substrate base plate 60 is located are within vertical projections of the plurality of transmission electrodes 11 on the plane where the second substrate base plate 60 is located; and the vertical projections of the plurality of second hollowed-out structures LL on the plane where the second substrate base plate 60 is located are within vertical projections of the plurality of radiator units 13 on the plane where the second substrate base plate 60 is located.

When the antenna 100 is the structure shown in FIG. 23, an operating principle of the antenna is described below. The electrical signal is transmitted on the transmission electrode 11, and at the same time, the dielectric constant of the photodielectric variable layer 40 is changed after the photodielectric variable layer is affected by the light emitted by the light-emitting element 50, and the phase of the electrical signal transmitted on the transmission electrode 11 is shifted. In this way, the phase of the electrical signal is changed. Finally, the electrical signal is coupled to the radiator unit 31 at the second hollowed-out structure LL of the second electrode 20, and the radiator unit 31 radiates the signal outward. It is to be noted that the plurality of radiator units 31 are a plurality of mutually independent radiator units 31, and each radiator unit 31 radiates a signal outward.

To sum up, the photodielectric variable layer is disposed between the first electrode and the second electrode, the dielectric constant of the photodielectric variable layer is controlled to change through the light emitted by the light-emitting element in the antenna, and then the electrical signal transmitted by the transmission electrode is controlled to shift the phase. The antenna structure provided by this embodiment provides more possibilities for the large-scale commercialization. In addition, in this embodiment, since the light-emitting element and at least one of the first electrode, the second electrode, or the third electrode are an integral structure, that is, the light-emitting element and the structure in the antenna are integrated, the process steps are simplified and the preparation efficiency of the antenna 100 is improved. Moreover, the thickness of the antenna can be reduced, thereby facilitating the miniaturization of the antenna.

Figure 24:
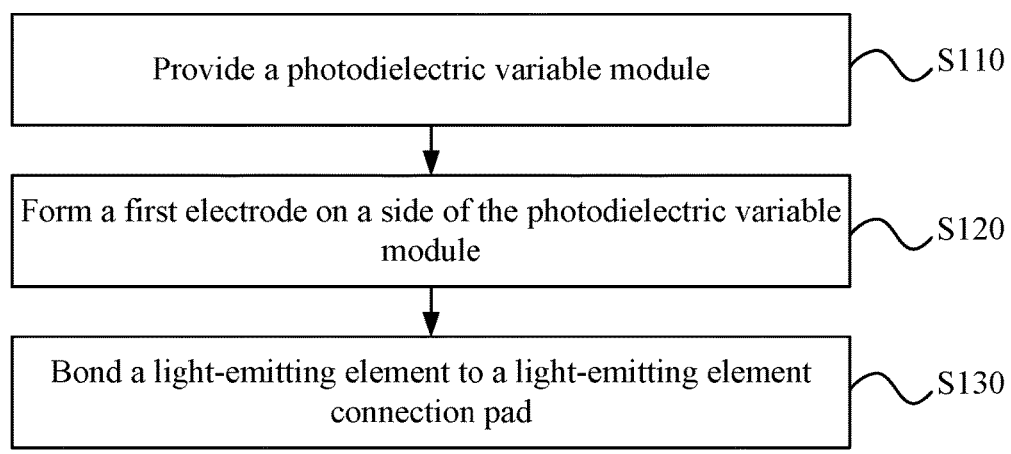
FIG. 24 is a flowchart of a method for preparing an antenna according to an embodiment of the present disclosure.

An embodiment of the present disclosure further provides a method for preparing an antenna, and the method belongs to the same inventive concept as the antenna in the above embodiments. For embodiments not described in detail, reference may be made to embodiments of the antenna. FIG. 24 is a flowchart of a method for preparing an antenna according to an embodiment of the present disclosure. The method may, for example, prepare the antenna 100 shown in FIGS. 1 and 2.

As shown in FIG. 24, the method for preparing an antenna provided by the embodiment of the present disclosure includes steps described below.

In S110, a photodielectric variable module is provided. The photodielectric variable module includes a photodielectric variable layer and a second electrode, and the second electrode is provided with a fixed potential.

Exemplarily, still referring to FIGS. 1 and 2, the second electrode 20 is formed on a supporting layer (not shown in the figure), and the photodielectric variable layer 40 is disposed on a side of the second electrode 20 facing away from the supporting layer. If the formed antenna requires the supporting layer to be included, the supporting layer does not need to be peeled off in subsequent steps, and in this case, the photodielectric variable module includes the supporting layer, the second electrode 20, and the photodielectric variable layer 40. If the formed antenna does not require the supporting layer, the supporting layer needs to be peeled off in subsequent steps, and in this case, the photodielectric variable module includes only the photodielectric variable layer 40 the second electrode 20.

In S120, a first electrode is formed on a side of the photodielectric variable module. The first electrode and the second electrode are respectively disposed on two sides of the photodielectric variable layer. The first electrode includes a plurality of transmission electrodes, a plurality of radiator units, a signal trace, and a light-emitting element connection pad. The plurality of transmission electrodes are configured to transmit an electrical signal, and the plurality of radiator units are configured to send the electrical signal.

The signal trace (not shown in FIGS. 1 and 2), the light-emitting element connection pad 15, the radiator units 31, and the transmission electrodes 11 are disposed in the same layer and the radiator units 31 are electrically connected to the transmission electrodes 11 so that not only the interference to the electric signal transmitted on the transmission electrode 11 caused by the cross-line on the transmission electrodes 11 can be avoided, but also a lower cost is achieved. Moreover, the radiator units 31 are electrically connected to the transmission electrodes 11, compared with the liquid crystal antenna in which the electrical signal transmitted by the transmission electrode is coupled to the radiator unit through the liquid crystal layer, this technical scheme can directly transmit the electrical signal to the radiator units 31 without coupling due to the direct electric connection between the radiator units 31 and the transmission electrodes 11, so that the problem of loss of electric signal caused by coupling can be avoided.

In S130, a light-emitting element is bonded to the light-emitting element connection pad. The light-emitting element connection pad is electrically connected to the light-emitting element and the signal trace, separately.

For example, the light-emitting element 50 may be transferred to the light-emitting element connection pad 15 through a transfer process to achieve electric connection between the light-emitting element 50 to the light-emitting element connection pad 15, and then an anode signal and a cathode signal transmitted by the signal trace may be transmitted to the light-emitting element 50, so that the light-emitting element 50 emits light.

In this embodiment, since the prepared light-emitting element 50 is directly bonded to the supporting layer provided with the first electrode 10, the second electrode 20, and the third electrode 30 without providing another supporting layer separately, that is, the light-emitting element, the first electrode, the second electrode, and the third electrode are an integral structure, that is, the light-emitting element and the structure in the antenna are integrated, the process steps are simplified and the preparation efficiency of the antenna is improved. Moreover, the thickness of the antenna can be reduced, thereby facilitating the miniaturization of the antenna.

Figure 25:
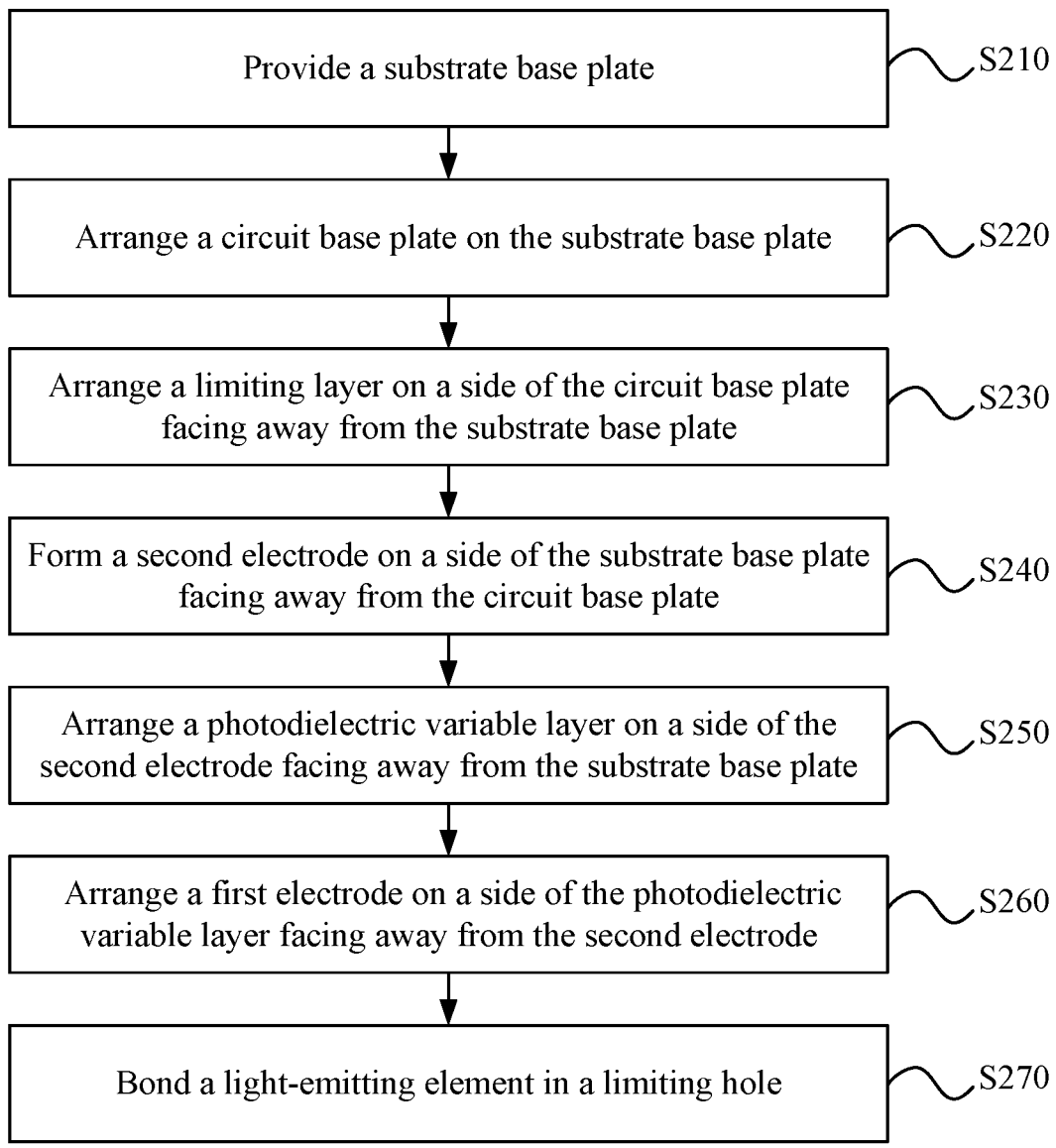
FIG. 25 is a flowchart of a method for preparing another antenna according to an embodiment of the present disclosure.

An embodiment of the present disclosure further provides a method for preparing an antenna, and the method belongs to the same inventive concept as the antenna in the above embodiments. For embodiments not described in detail, reference may be made to embodiments of the antenna. FIG. 25 is a flowchart of a method for preparing another antenna according to an embodiment of the present disclosure. The method may, for example, prepare the antenna 100 shown in FIGS. 16 and 17. As shown in FIG. 25, the method for preparing an antenna provided by the embodiment of the present disclosure includes steps described below.

In S210, a substrate base plate is provided.

The substrate base plate is, for example, the first substrate base plate 71 in FIGS. 16 and 17. For example, other film structures in the antenna are prepared on the first substrate base plate 71.

In S220, a circuit base plate is arranged on the substrate base plate. The circuit base plate includes a light-emitting element connection pad.

When the light-emitting element is driven to emit light in the passive driving manner, for example, referring to FIG. 16, a transparent insulating layer 74 may be firstly formed on the first substrate base plate 71, and then a signal trace layer is prepared on a side of the transparent insulating layer 74 facing away from the first substrate base plate 71. The signal trace layer includes a signal trace (not shown in FIG. 16) and the light-emitting element connection pad 15.

When the light-emitting element is driven to emit light in the active driving manner, for example, referring to FIG. 17, a pixel circuit layer 75 may be formed on the first substrate base plate 71. The pixel circuit layer 75 includes a pixel circuit 751, where the pixel circuit 751 is configured to drive the light-emitting element 50 to emit light.

In S230, a limiting layer is arranged on a side of the circuit base plate facing away from the substrate base plate. The limiting layer includes a limiting hole, and a vertical projection of the limiting hole on a plane where the substrate base plate is located overlaps a vertical projection of the light-emitting element connection pad on the plane where the substrate base plate is located.

Exemplarily, the limiting layer 73 is arranged on the side of the circuit base plate 72 facing away from the first substrate base plate 71. For example, the limiting layer 73 may be patterned by exposure development to form a plurality of limiting holes JJ, and each limiting hole JJ penetrates through the limiting layer 73 to expose the light-emitting element connection pad 15 on the circuit base plate 72.

In S240, a second electrode is formed on a side of the substrate base plate facing away from the circuit base plate. The second electrode is provided with a fixed potential.

In S250, a photodielectric variable layer is arranged on a side of the second electrode facing away from the substrate base plate.

For example, the photodielectric variable layer 40 may be formed on the side of the second electrode 20 facing away from the first substrate base plate 71 by a coating or printing process.

In S260, a first electrode is arranged on a side of the photodielectric variable layer facing away from the second electrode. The first electrode includes a plurality of transmission electrodes and a plurality of radiator units, the plurality of transmission electrodes are configured to transmit an electrical signal, and the plurality of radiator units are configured to send the electrical signal.

Exemplarily, an electrode layer is formed on the side of the photodielectric variable layer 40 facing away from the first substrate base plate 71, and the electrode layer is patterned to form the transmission electrodes 11, the radiator units (not shown in the figure), and the like.

In S270, a light-emitting element is bonded to the limiting hole. The light-emitting element is electrically connected to the light-emitting element connection pad.

Exemplarily, the light-emitting element 50 is transferred to the circuit base plate 72, and the limiting hole JJ functions as limiting a position of the light-emitting element 50 so that the light-emitting element 50 is transferred to a preset position and the electric connection between the electrodes of the light-emitting element 50 and the light-emitting element connection pad 15 is achieved. Finally, the light-emitting element 50 is bonded so that the influence of other preparation processes on the light-emitting element 50 is avoided.

In this embodiment, since the prepared light-emitting element 50 is directly bonded to the substrate base plate provided with the first electrode 10, the second electrode 20, and the third electrode 30 without providing another substrate base plate separately, that is, the light-emitting element, the first electrode, the second electrode, and the third electrode are an integral structure, that is, the light-emitting element and the structure in the antenna are integrated, the process steps are simplified and the preparation efficiency of the antenna is improved. Moreover, the thickness of the antenna can be reduced, thereby facilitating the miniaturization of the antenna.

Figure 26:
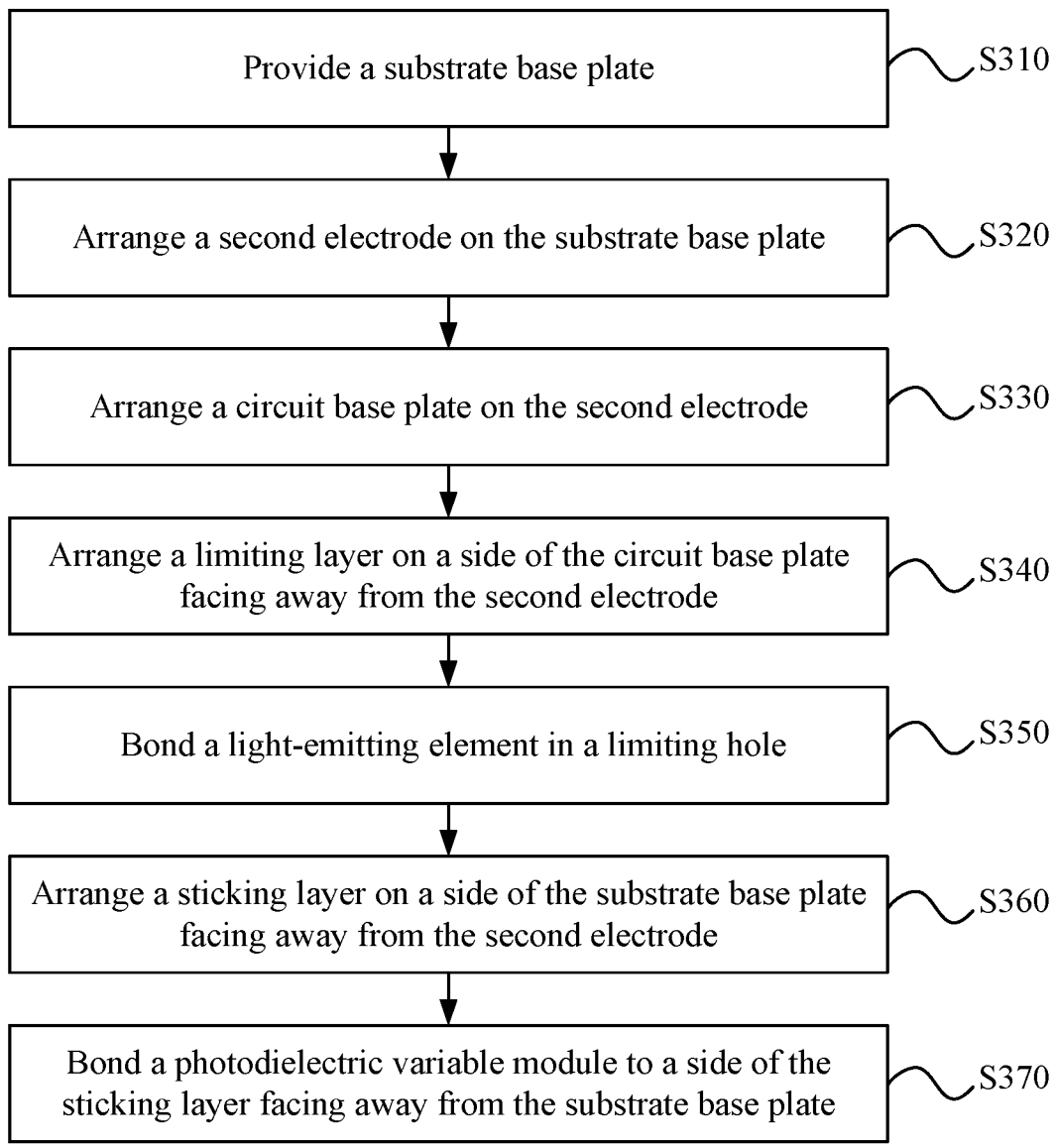
FIG. 26 is a flowchart of a method for preparing another antenna according to an embodiment of the present disclosure.

An embodiment of the present disclosure further provides a method for preparing an antenna, and the method belongs to the same inventive concept as the antenna in the above embodiments. For embodiments not described in detail, reference may be made to embodiments of the antenna. FIG. 26 is a flowchart of a method for preparing another antenna according to an embodiment of the present disclosure. The method can also prepare the antenna 100 shown in FIG. 15.

As shown in FIG. 25 and referring to FIG. 15 at the same time, the method for preparing the antenna provided by the embodiment of the present disclosure includes steps described below.

In S310, a substrate base plate is provided.

The substrate base plate is, for example, the first substrate base plate 71 in FIG. 14.

In S320, a second electrode is arranged on the substrate base plate. The second electrode is provided with a fixed potential.

The second electrode 20 is formed on a side of the first substrate base plate 71.

In S330, a circuit base plate is arranged on the second electrode. The circuit base plate includes a light-emitting element connection pad.

A transparent insulating layer 74 is formed on the second electrode 20 so as to prevent a signal trace in the circuit base plate 72 being electrically connected to the second electrode 20. A signal trace layer is formed on a side of the transparent insulating layer 74 facing away from the second electrode 20, and the signal trace layer includes the light-emitting element connection pad 15.

In S340, a limiting layer is arranged on a side of the circuit base plate facing away from the second electrode. The limiting layer includes a limiting hole, and a vertical projection of the limiting hole on a plane where the substrate base plate is located overlaps a vertical projection of the light-emitting element connection pad on the plane where the substrate base plate is located.

In S350, a light-emitting element is bonded to the limiting hole. The light-emitting element is electrically connected to the light-emitting element connection pad.

In S360, a sticking layer is arranged on a side of the substrate base plate facing away from the second electrode.

The sticking layer 80 is bonded to a side of the first substrate base plate 71 facing away from the second electrode 20.

In S370, a photodielectric variable module is bonded on a side of the sticking layer facing away from the substrate base plate. The photodielectric variable module includes a photodielectric variable layer and a first electrode, the first electrode is disposed on a side of the photodielectric variable layer facing away from the sticking layer, the first electrode includes a plurality of transmission electrodes and a plurality of radiator units, the plurality of transmission electrodes are configured to transmit an electrical signal, and the plurality of radiator units are configured to send the electrical signal.

The prepared photodielectric variable module is bonded to the side of the sticking layer 80 facing away from the first substrate base plate 71.

This embodiment differs from FIG. 25 in that the first electrode 10, the third electrode 30, and the photodielectric variable layer 40 are not formed on the first substrate base plate 71, but are formed on other supporting layers, and the supporting layers are peeled off and bonded to one side of the first substrate base plate 71 through the sticking layer 80.

In this embodiment, since the light-emitting element 50 is directly bonded to the substrate base plate provided with the second electrode 20 without providing another substrate base plate separately, that is, the light-emitting element and the second electrode are an integral structure, that is, the light-emitting element and the structure in the antenna are integrated, the process steps are simplified and the preparation efficiency of the antenna is improved. Moreover, the thickness of the antenna can be reduced, thereby facilitating the miniaturization of the antenna.

Figure 27:
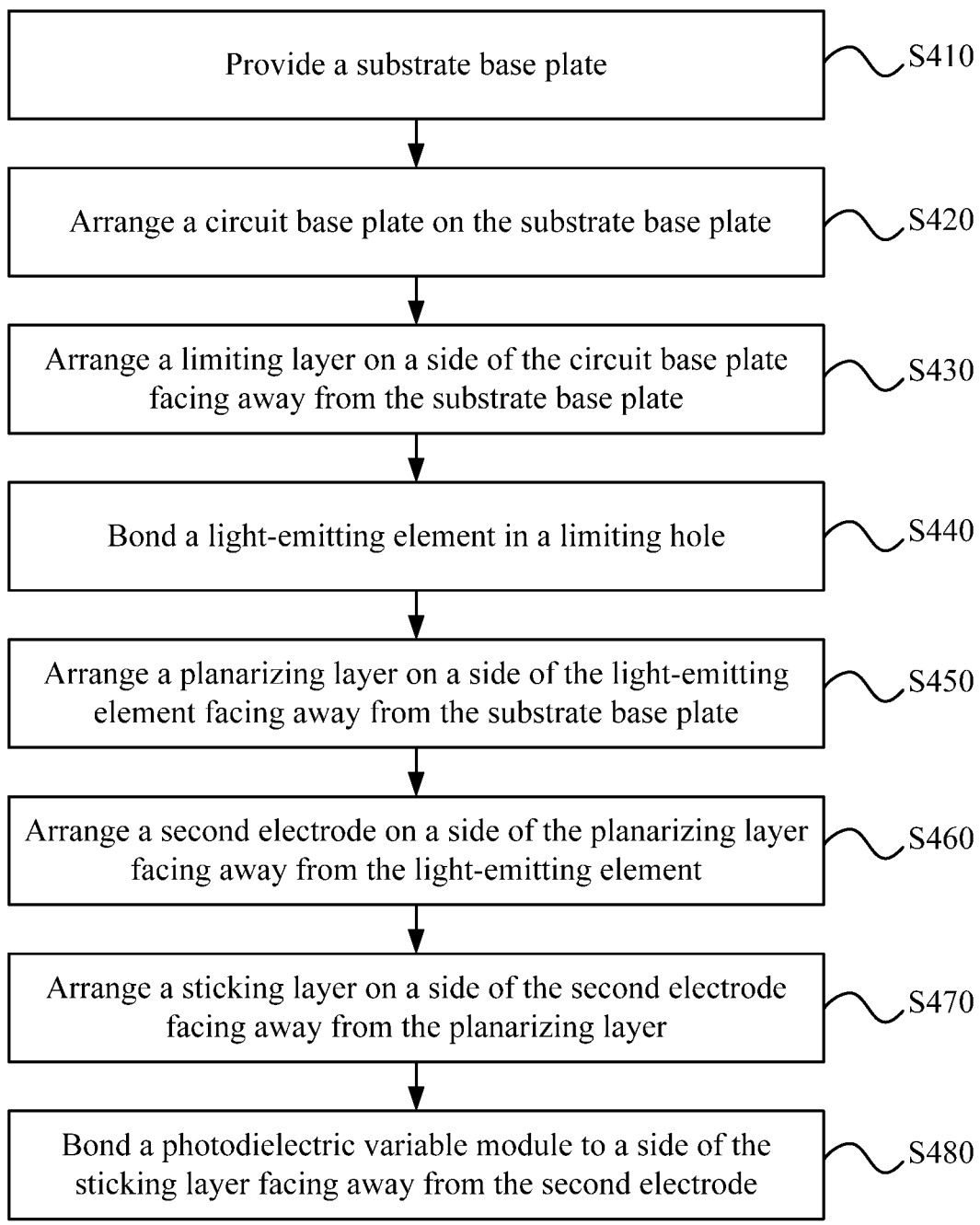
FIG. 27 is a flowchart of a method for preparing another antenna according to an embodiment of the present disclosure.

An embodiment of the present disclosure further provides a method for preparing an antenna, and the method belongs to the same inventive concept as the antenna in the above embodiments. For embodiments not described in detail, reference may be made to embodiments of the antenna. FIG. 27 is a flowchart of a method for preparing another antenna according to an embodiment of the present disclosure. The method may, for example, prepare the antenna 100 shown in FIG. 19 or 20. As shown in FIG. 27, the method for preparing an antenna provided by the embodiment of the present disclosure includes steps described below.

In S410, a substrate base plate is provided.

The substrate base plate may be, for example, the first substrate base plate 71 shown in FIGS. 19 and 20.

In S420, a circuit base plate is arranged on the substrate base plate. The circuit base plate includes a light-emitting element connection pad.

When the light-emitting element is driven to emit light in the passive driving manner, for example, referring to FIG. 19, a transparent insulating layer 74 may be firstly formed on the first substrate base plate 71, and then a signal trace layer is prepared on a side of the transparent insulating layer 74 facing away from the first substrate base plate 71. The signal trace layer includes a signal trace (not shown in FIG. 19) and the light-emitting element connection pad 15.

When the light-emitting element is driven to emit light in the active driving manner, for example, referring to FIG. 20, a pixel circuit layer 75 may be formed on the first substrate base plate 71. The pixel circuit layer 75 includes a pixel circuit 751, and the pixel circuit 751 is configured to drive the light-emitting element 50 to emit light.

In S430, a limiting layer is arranged on a side of the circuit base plate facing away from the substrate base plate. The limiting layer includes a limiting hole, and a vertical projection of the limiting hole on a plane where the substrate base plate is located overlaps a vertical projection of the light-emitting element connection pad on the plane where the substrate base plate is located.

In S440, a light-emitting element is bonded to the limiting hole. The light-emitting element is electrically connected to the light-emitting element connection pad.

In S450, a planarizing layer is arranged on a side of the light-emitting element facing away from the substrate base plate.

The planarizing layer 90 is arranged on the side of the light-emitting element 50 facing away from the first substrate base plate 71 so that the light-emitting element 50 is protected and the preparation of the second electrode 20 is facilitated at the same time.

In S460, a second electrode is arranged on a side of the planarizing layer facing away from the light-emitting element. The second electrode is provided with a fixed potential.

In S470, a sticking layer is arranged on a side of the second electrode facing away from the planarizing layer.

In S480, a photodielectric variable module is bonded on a side of the sticking layer facing away from the second electrode. The photodielectric variable module includes a photodielectric variable layer and a first electrode, the first electrode is disposed on a side of the photodielectric variable layer facing away from the sticking layer, the first electrode includes a plurality of transmission electrodes and a plurality of radiator units, the plurality of transmission electrodes are configured to transmit an electrical signal, and the plurality of radiator units are configured to send the electrical signal.

The prepared photodielectric variable module is bonded to the side of the sticking layer 80 facing away from the first substrate base plate 71.

It is to be noted that the light-emitting direction of the light-emitting element 50 shown in FIGS. 19 and 20 is opposite to the light-emitting direction of the light-emitting element 50 in the above embodiment. The light-emitting element 50 shown in FIGS. 19 and 20 emits light from the top, and the light-emitting direction faces towards the photodielectric variable layer 40. However, the light-emitting element 50 shown in other embodiments emits light from the bottom, and the light-emitting direction also faces towards the photodielectric variable layer 40.

In this embodiment, since the light-emitting element 50 is directly bonded to the substrate base plate provided with the second electrode 20 without providing another substrate base plate separately, that is, the light-emitting element and the second electrode are an integral structure, that is, the light-emitting element and the structure in the antenna are integrated, the process steps are simplified and the preparation efficiency of the antenna is improved. Moreover, the thickness of the antenna can be reduced, thereby facilitating the miniaturization of the antenna.

Figure 28:
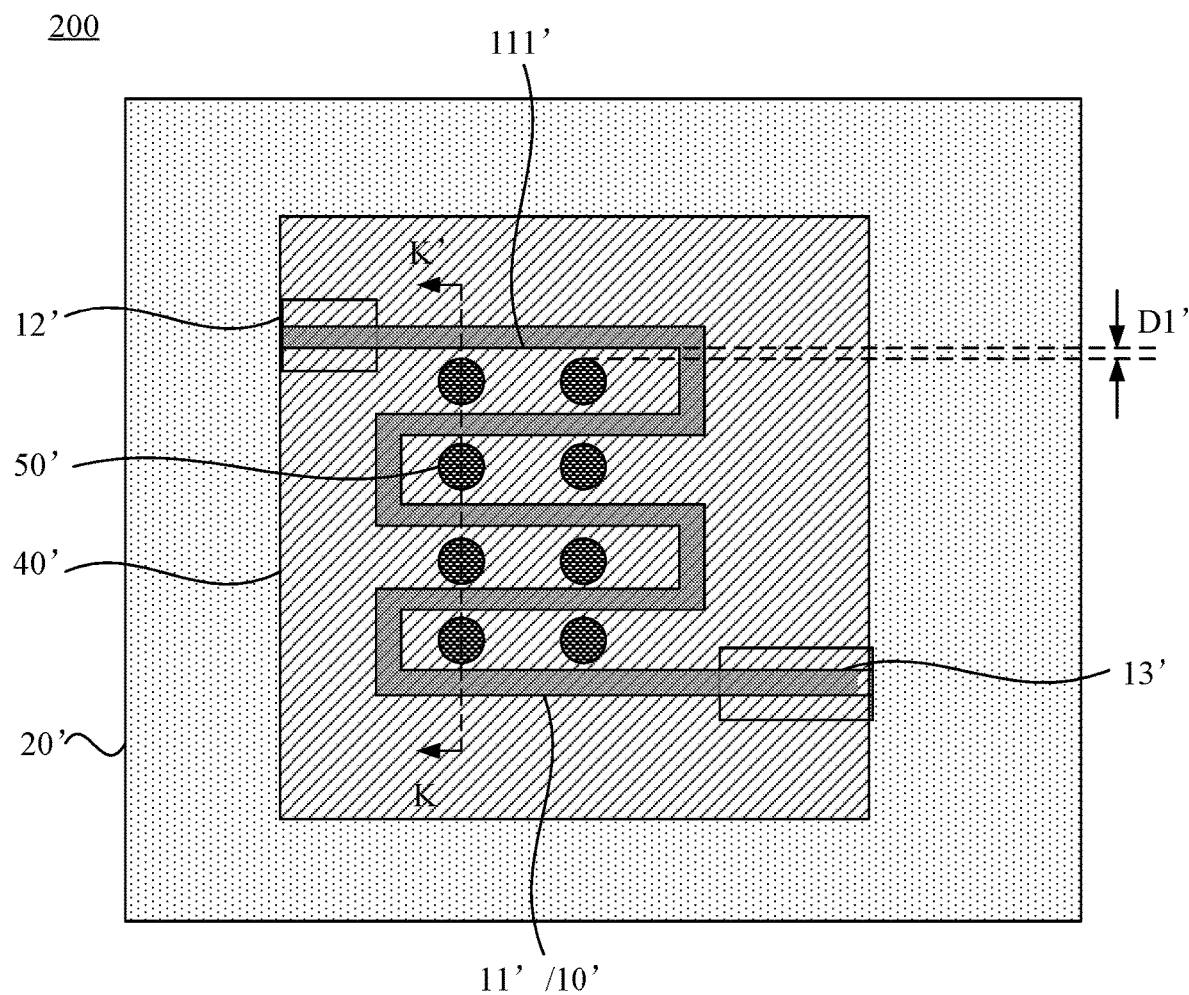
FIG. 28 is a top view of a phase shifter according to an embodiment of the present disclosure.
Figure 29:
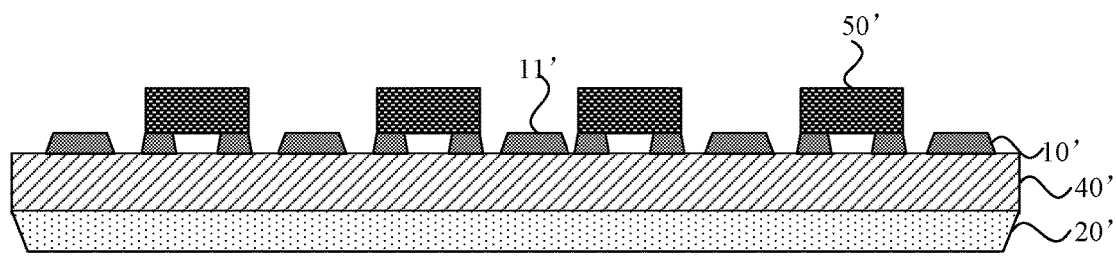
FIG. 29 is a cross-sectional structure view taken along a line K-K' of FIG. 28.

Based on the same concept, an embodiment of the present disclosure further provides a phase shifter. FIG. 28 is a top view of a phase shifter according to an embodiment of the present disclosure. FIG. 29 is a cross-sectional structure view taken along a line K-K' of FIG. 28. As shown in FIGS. 28 and 29, a phase shifter 200 provided by the embodiment of the present disclosure includes a first electrode 10', a second electrode 20', and a photodielectric variable layer 40'. The first electrode 10' and the second electrode 20' are respectively disposed on opposite two sides of the photodielectric variable layer 40'. The first electrode 10' includes a plurality of transmission electrodes 11', and the plurality of transmission electrodes 11' are configured to transmit an electrical signal. The electric signal transmitted by the transmission electrodes 11' may be, for example, a high frequency signal, and a frequency of the high frequency signal is greater than 1 GHz. The second electrode 20' is provided with a fixed potential. For example, the second electrode 20' is grounded.

Still referring to FIGS. 28 and 29, the phase shifter 200 further includes at least one light-emitting element 50' configured to emit light irradiated to the photodielectric variable layer 40' to change a dielectric constant of the photodielectric variable layer 40'. The at least one light-emitting element 50' and at least one of the first electrode 10' or the second electrode 20' are an integral structure. The integral structure means that the at least one light-emitting element 50' and at least one of the first electrode 10' or the second electrode 20' are located on a same supporting layer, that is, the at least one light-emitting element 50' and at least one of the first electrode 10', the second electrode 20', or the third electrode 30' are disposed in the same supporting layer, and that is, if the at least one light-emitting element 50' is a prepared light-emitting element, the at least one light-emitting element 50' is directly bonded to the supporting layer provided with at least one of the first electrode 10', the second electrode 20', or the third electrode 30' without providing another supporting layer separately. For example, the light-emitting element 50' may be a Micro Light Emitting Diode (Micro LED) or a Mini Light Diode (Mini LED). Alternatively, the light-emitting element 50' is prepared and formed on the supporting layer, and in addition to the light-emitting element 50', at least one of the first electrode 10', the second electrode 20', or the third electrode 30' is also prepared and formed on the supporting layer without providing another supporting layer separately. For example, the light-emitting element 50' may be an Organic Light-Emitting Diode (OLED). Exemplarily, if the light-emitting element 50' is the prepared light-emitting element, for example, a substrate base plate may be provided with the second electrode 20' shown in FIGS. 28 and 29, the photodielectric variable layer 40' is disposed on the second electrode 20', one side of the photodielectric variable layer 40' facing away from the second electrode 20' is formed with the transmission electrodes 11', and then the light-emitting element 50' is bonded, that is, the light-emitting element 50', the first electrode 10' and the second electrode 20' are all disposed in the same supporting layer, and that is, the light-emitting element 50' is directly bonded to the supporting layer provided with the first electrode 10', the second electrode 20', and the third electrode 30' without providing another supporting layer separately. It is to be understood that if the phase shifter 200 requires the supporting layer, the supporting layer (not shown in the figure) does not need to be peeled off; and if the phase shifter 200 does not requires the supporting layer, the supporting layer may be peeled off, as shown in FIGS. 27 and 28.

In this embodiment, the transmission electrodes 11' are configured to transmit the electrical signal. In a process of transmitting the electrical signal, the light emitted by the light-emitting element 50' and irradiated to the photodielectric variable layer 40' can change the dielectric constant of the photodielectric variable layer 40'. When the dielectric constant of the photodielectric variable layer 40' changes, a capacitance value of a capacitor formed between the transmission electrodes 11' and the second electrode 20' is changed, resulting in a change in a phase of the electrical signal transmitted by the transmission electrodes 11'. In this manner, the phase of the electrical signal is changed, and a function of phase shifting of the electrical signal is implemented. The transmission electrodes 11' are configured to transmit the electrical signal and the phase of the electrical signal is shifted in the transmission process. A first feed terminal 12' and a second feed terminal 13' are configured to cooperate with two ends of the transmission electrode 11' to achieve the feeding in and feeding out of the electrical signal on the transmission electrode 11'.

In the embodiment provided in the present application, not only a new phase shifter is provided, but also a light source for controlling the phase shifter is integrated into the phase shifter, so that a volume of the phase shifter device can be further reduced. Portable and light phase shifters provide more possibilities for their applications. For example, in addition to being used in position-fixed devices (such as 5G base stations), the phase shifters can also be applied to devices with changing positions, such as automobiles, airplanes, ships, or the like. On the other hand, compared with a liquid crystal phase shifter, since the signal is controlled by the light source rather than by the electric field generated by the electrodes, the phase shifter can avoid the influence of the control of the dielectric variable layer on the transmission signal.

Figure 30:
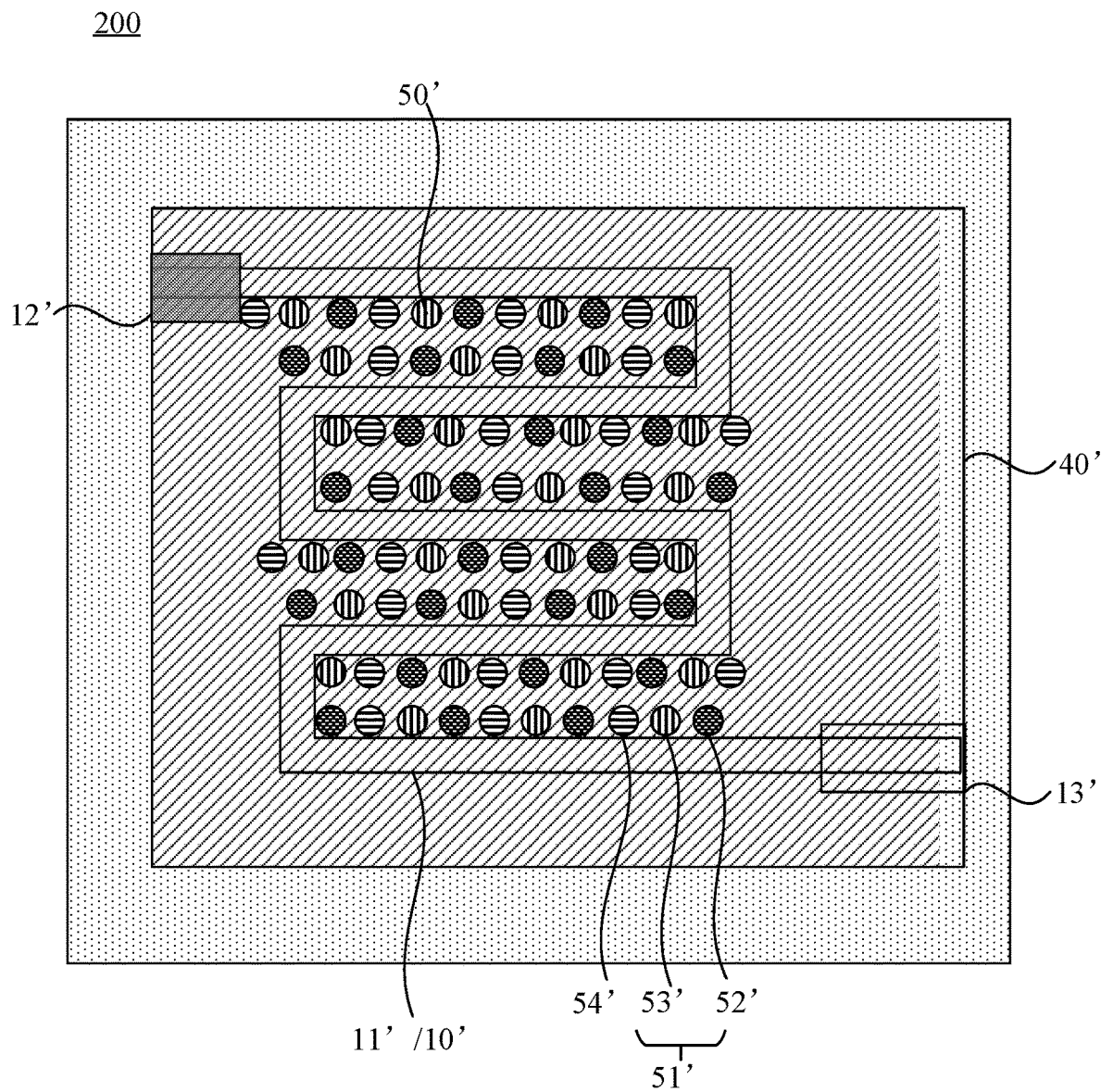
FIG. 30 is a top view of another phase shifter according to an embodiment of the present disclosure.

It is to be noted that the dielectric constant of the photodielectric variable layer 40' may be changed through the light intensity of the light and may also be changed through the light wavelength of the light. When the dielectric constant of the photodielectric variable layer 40' is changed through the light intensity of the light, in an embodiment, still referring to FIGS. 27 and 28, the at least one light-emitting element 50' includes a plurality of light-emitting elements 50', the light emitted by the plurality of light-emitting elements 50' may be, for example, ultraviolet light, and the dielectric constant of the photodielectric variable layer 40' is changed through the light intensity of the ultraviolet light. Exemplarily, a material of the photodielectric variable layer 40' may include azo dyes or azo polymers. The azo dyes or azo polymers are sensitive to the ultraviolet light. When the light-emitting element 50' emits the ultraviolet light, the ultraviolet light can reverse the molecular structure of the azo dyes or azo polymers, for example, the molecular structure changes between the cis-form and the trans-form, so that the dielectric constant of the photodielectric variable layer 40' is changed. It is to be understood that the material of the photodielectric variable layer 40' is not limited to the azo dyes or azo polymers and the light emitted by the light-emitting element 50' is also not limited to the ultraviolet light, which can be selected by those skilled in the art according to the actual situation as long as the phase of the electrical signal transmitted on the transmission electrode 11' can be shifted through the photodielectric variable layer 40' to change the phase of the electrical signal. When the dielectric constant of the photodielectric variable layer 40' is changed through the light wavelength of the light, in an embodiment, FIG. 30 is a top view of another phase shifter according to an embodiment of the present disclosure. As shown in FIG. 30, the at least one light-emitting element 50' includes a plurality of light-emitting elements 50', and the plurality of light-emitting elements 50' form a plurality of light-emitting element groups 51'; and each of the plurality of light-emitting element groups 51' includes a first light-emitting element 52' having a light-emitting color of a first color, a second light-emitting element 53' having a light-emitting color of a second color, and a third light-emitting element 54' having a light-emitting color of a third color. The light-emitting color of the first light-emitting element 52' may be, for example, green, the light-emitting color of the second light-emitting element 53' may be, for example, red, the light-emitting color of the third light-emitting element 54' may be, for example, blue, and three colors of red, green, and blue in different proportions are combined to a desired light wavelength so that the dielectric constant of the photodielectric variable layer 40' is changed. In addition, a quantum dot layer (not shown in the figure) may further be provided between the light-emitting element 50' and the photodielectric variable layer 40' so that when the light-emitting element 50' is a monochromatic light-emitting element, the light intensity can be increased. Alternatively, different quantum dot layers are provided between the light-emitting element 50' and the photodielectric variable layer 40', and the light emitted by the monochromatic light-emitting element is converted by the quantum dot layers to form lights of different colors such that the required light wavelength is synthesized.

It is to be noted that the type of the light-emitting element 50' includes, but is not limited to, the above examples. FIGS. 28 and 29 describe an example in which the light-emitting element 50' is the Micro LED and the Micro LED uses a flip-chip and bottom-emitting light-emitting chip. When the light-emitting element 50' includes the Micro LED, since a size of the Micro LED is smaller, the number of Micro LEDs may be larger. In this way, the amount of light irradiated to each region of the photodielectric variable layer 40' is substantially consistent, and consistency of the change of the dielectric constant of each region of the photodielectric variable layer 40' is ensured.

It is to be noted that this embodiment does not limit materials of the first electrode 10' and the second electrode 20'. Exemplarily, the second electrode 20' may be made of metal or indium tin oxide. When the second electrode 20' may be made of the metal, for example, the second electrode 20' may be made of copper. When the second electrode 20' is made of the copper, the light emitted by the light-emitting element 50' may pass through the photodielectric variable layer 40' and be irradiated to the second electrode 20', and since the copper has a relatively high reflectivity, the light can be reflected by the second electrode 20' at this time, thereby improving the utilization rate of the light.

It is to be noted that the light-emitting element 50' and the first electrode 10' may be disposed at a same side, that is, the first electrode 10' and the light-emitting element 50' are disposed on a side of the photodielectric variable layer 40', and the second electrode 20' is disposed on another side of the photodielectric variable layer 40'; and the light-emitting element 50' may further be disposed at a same side as the second electrode 20', that is, the second electrode 20' and the light-emitting element 50' are disposed on a side of the photodielectric variable layer 40', and the first electrode 10' is disposed on another side of the photodielectric variable layer 40'. FIGS. 28 and 29 only describe an example in which the light-emitting element 50' and the first electrode 10' are disposed on the same side. In other optional embodiments, the light-emitting element 50' may further be disposed at the side of the second electrode 20'. The arrangement position of the light-emitting element 50' will be described in detail below with respect to these two cases.

Firstly, a situation in which the light-emitting element 50' and the first electrode 10' are disposed on the same side is described above.

In an embodiment, still referring to FIGS. 28 and 29, the light-emitting element 50' is disposed on the side of the photodielectric variable layer 40' facing away from the second electrode 20' and does not overlap the transmission electrode 11'; and the transmission electrode 11' includes a first boundary 111', the first boundary 111' is a boundary closest to a transmission electrode 11' from the light-emitting element 50', and a distance from the light-emitting element 50' to the first boundary 111' is D1', where 10 μm≤D1'≤100 μm.

Considering that when the light-emitting element 50' is the Micro LED or the Mini LED, an anode and a cathode of the light-emitting element 50' transmit a signal, and if the light-emitting element 50' is too close to the transmission electrode 11', the signals transmitted in the light-emitting element 50' may interfere with the electrical signals transmitted on the transmission electrode 11'; and if the light-emitting element 50' is too far away from the transmission electrode 11', the light emitted by the light-emitting element 50' cannot be irradiated to the photodielectric variable layer 40' below the transmission electrode 11', thereby causing the dielectric constant of the photodielectric variable layer 40' in this region to be unable to change and affecting the phase shift of the electrical signal. Therefore, in this embodiment, the distance between the light-emitting element 50' and the first boundary 111' is configured to be between 10 μm and 100 μm so that it is ensured that the electric signal transmitted by the transmission electrode 11' is not interfered with and the light emitted by the light-emitting element 50' is irradiated to the photodielectric variable layer 40' below the transmission electrode 11', and thus the dielectric constant of the photodielectric dielectric variable layer 40' in this region is changed.

In an embodiment, for example, still referring to FIGS. 30, the at least one light-emitting element 50' includes a plurality of light-emitting elements 50'; shapes of the transmission electrodes 11' include a linear shape, the linear shape includes a plurality of segments connected to each other, and extension directions of at least two segments among the plurality of segments intersect with each other; and the plurality of light-emitting elements 50' are sequentially disposed along an extension direction of the transmission electrodes 11'.

In this embodiment, the shapes of the transmission electrodes 11' are linear so that a path for transmitting the electrical signals is lengthened and the influence of the photodielectric variable layer 40' on electrical signals is increased. In addition, when the shapes of the transmission electrodes 11' are linear and the plurality of light-emitting elements 50' are sequentially disposed along the extension direction of the transmission electrodes 11', the amount of light irradiated to each region of the photodielectric variable layer 40' is substantially consistent, and the consistency of the change of the dielectric constant of each region of the photodielectric variable layer 40' is ensured.

Figure 31:
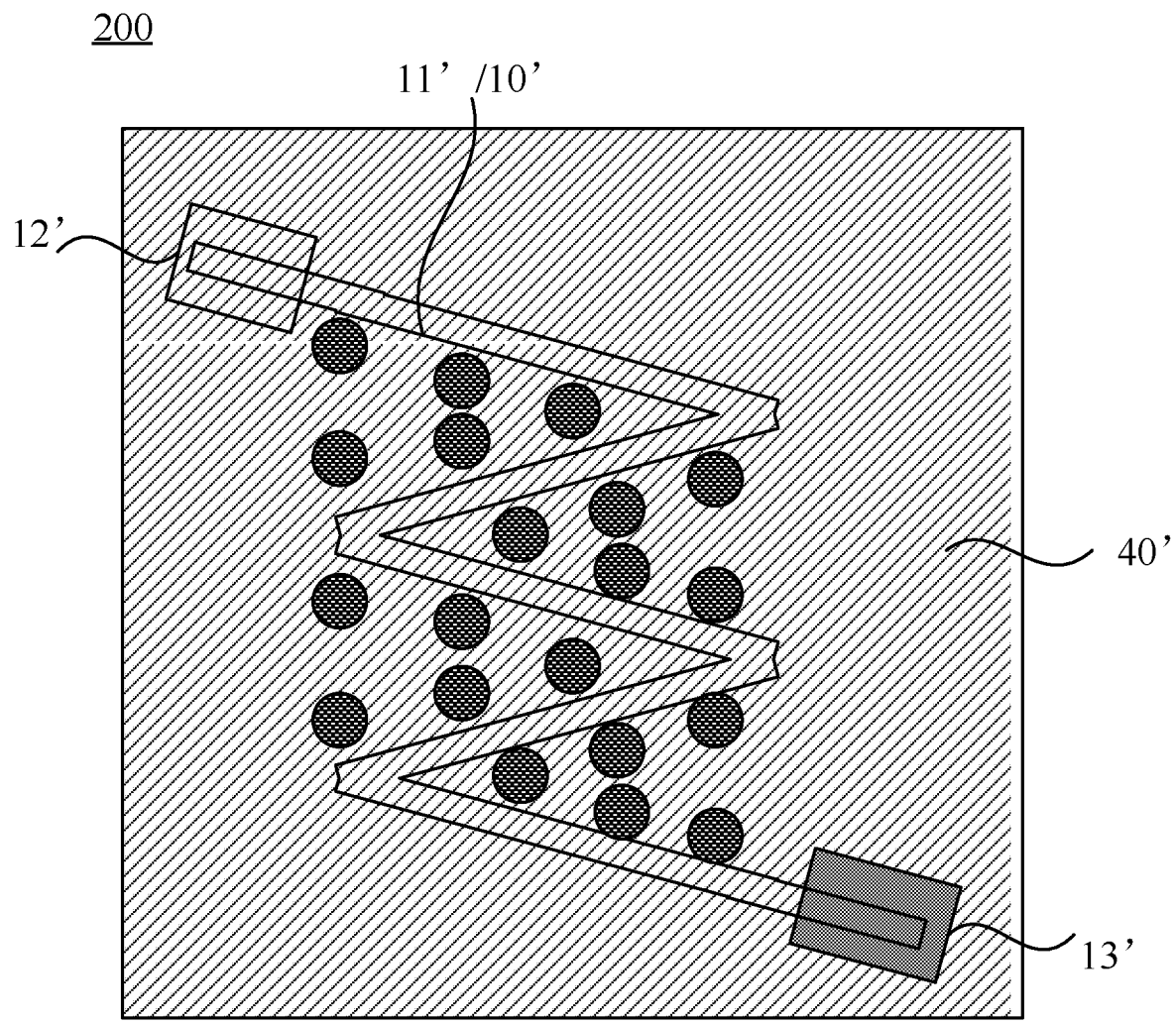
FIG. 31 is a top view of another phase shifter according to an embodiment of the present disclosure.

It is to be noted that when the shapes of the transmission electrodes 11' are linear, FIG. 30 illustrates an example in which the transmission electrodes 11' are S-shaped, the example is not a limitation of the preset application, and those skilled in the art can set the shape of the transmission electrode according to the actual situation. In other optional embodiments, the shape of the transmission electrode 11' may also be a W-shape formed by multiple connected straight segments, for example, referring to FIG. 31 or an interconnected U-shape (not shown in the figure).

Figure 32:
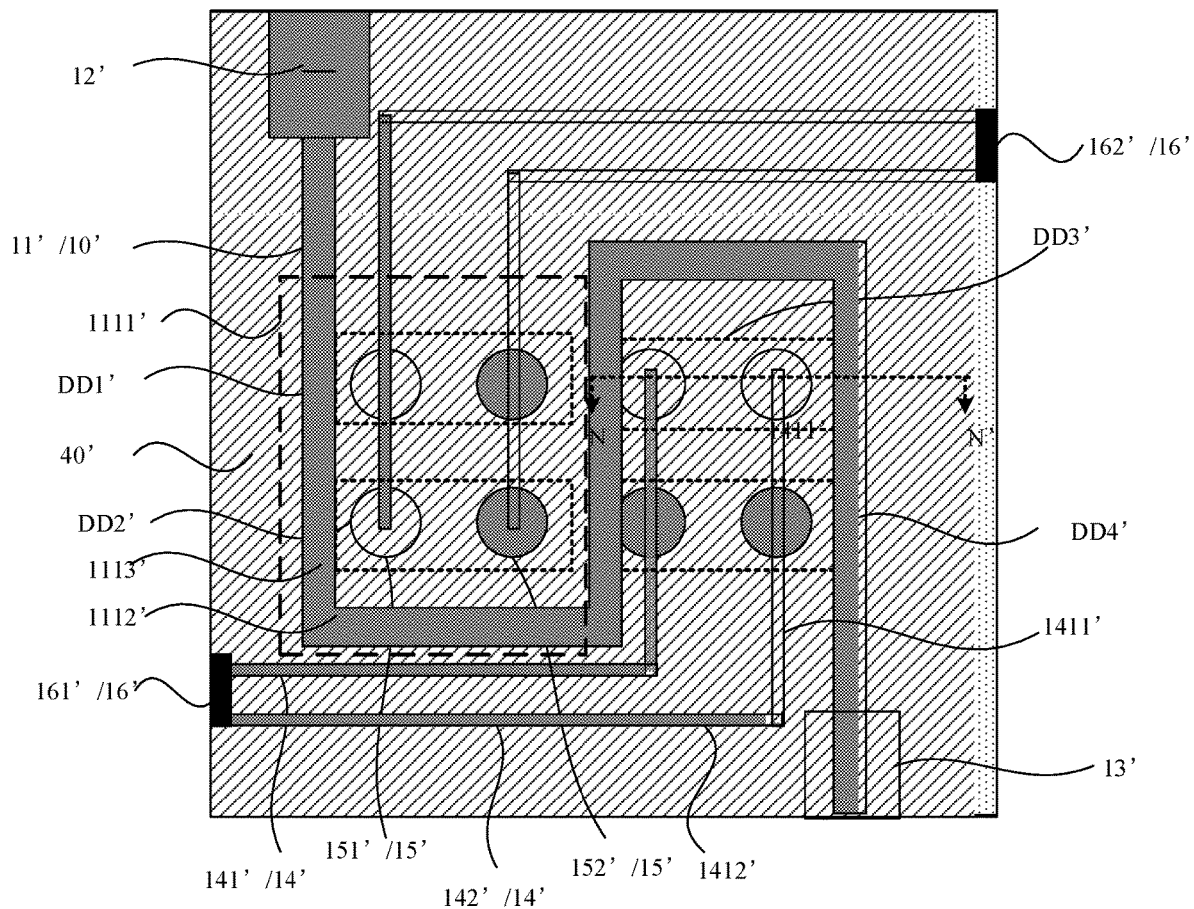
FIG. 32 is a top view of another phase shifter according to an embodiment of the present disclosure.
Figure 33:
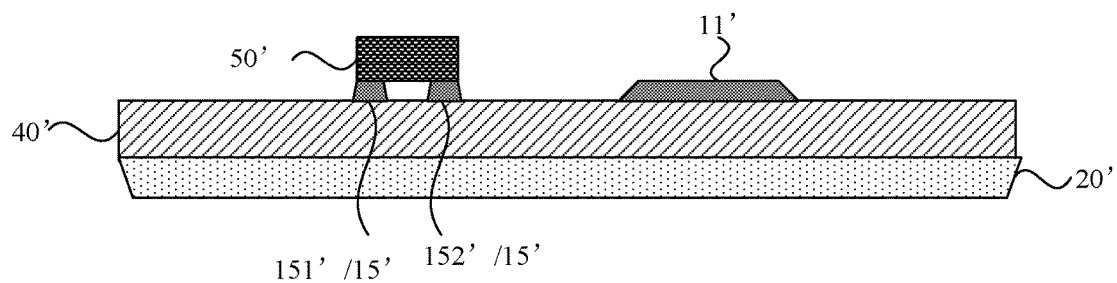
FIG. 33 is a cross-sectional structure view taken along a line N-N' of FIG. 32.

In an embodiment, FIG. 32 is a top view of another phase shifter according to an embodiment of the present disclosure, and FIG. 33 is a cross-sectional structure view taken along a line N-N' of FIG. 32. As shown in FIGS. 32 and 33, the light-emitting element 50' is disposed on the side of the photodielectric variable layer 40' facing away from the second electrode 20'. The antenna 200' further includes a signal trace 14' and a light-emitting element connection pad 15'. The light-emitting element 50' is disposed in a light-emitting element arrangement region DD' and disposed on the light-emitting element connection pad 15', and the light-emitting element connection pad 15' is electrically connected to the light-emitting element 50' and the signal trace 14', separately. The signal trace 14', the light-emitting element connection pad 15', and the transmission electrodes 11' are disposed in a same layer. It is to be noted that in order to clearly show a positional relationship between the light-emitting element connection pad 15' and the signal trace 14' in FIG. 32, the light-emitting element 50' is not shown in the light-emitting element arrangement region DD' of FIG. 32.

Exemplarily, still referring to FIGS. 32 and 33, the light-emitting element 50' in this embodiment includes the Micro LED and a type of the Micro LED is a lateral structure. Correspondingly, the light-emitting element connection pad 15' includes a first light-emitting element connection pad 151' and a second light-emitting element connection pad 152', the first light-emitting element connection pad 151' is electrically connected to the anode of the light-emitting element 50', the second light-emitting element connection pad 152' is electrically connected to the cathode of the light-emitting element 50', the first light-emitting element connection pad 151' is electrically connected to a signal trace 14' transmitting an anode signal, and the second light-emitting element connection pad 152' is electrically connected to a signal trace 14' transmitting a cathode signal. In addition, the phase shifter 200 further includes a drive circuit 16', and the drive circuit 16' may be, for example, a driver chip, or may be, for example, a flexible printed circuit board. The signal trace 14' is configured to receive a driving signal sent by the drive circuit 16' and transmit the driving signal to the light-emitting element connection pad 15' to drive the light-emitting element 50' to emit light. The signal trace 14', the first light-emitting element connection pad 151', the second light-emitting element connection pad 152', and the transmission electrodes 11' are disposed in the same layer so that not only the interference to the electric signal transmitted on the transmission electrode 11' caused by the cross-line on the transmission electrodes 11' can be avoided, but also a lower cost is achieved.

It is to be understood that the above embodiment only describes an example in which the light-emitting element 50' includes the Micro LED and the type of the Micro LED is the Micro LED with the lateral structure and not limits the present application. In other optional embodiments, the light-emitting element 50' may further include the Mini LED.

It is to be noted that the above embodiment only describes an example in which the light-emitting element 50' is driven in a passive driving mode, that is, the Micro LED integrates with a body wiring of the phase shifter in a transfer mode, the example is not a limitation of the preset application, and those skilled in the art can select the driving mode of the light-emitting element 50' according to the actual situation.

In an embodiment, still referring to FIGS. 32 and 33, the at least one light-emitting element 50' includes a plurality of light-emitting elements 50'. As described above, in order to clearly show the positional relationship between the light-emitting element connection pad 15' and the signal trace 14' in FIG. 32, the light-emitting element 50' is not shown in the light-emitting element arrangement region DD' of FIG. 32, and only the light-emitting element arrangement region DD' is shown in FIG. 32. A first light-emitting element arrangement region DD1' is provided with the first light-emitting element, a second light-emitting element arrangement region DD2' is provided with the second light-emitting element, a third light-emitting element arrangement region DD3' is provided with the third light-emitting element, and a fourth light-emitting element arrangement region DD4' is provided with the fourth light-emitting element.

The signal trace 14' includes an anode signal trace 141' and a cathode signal trace 142'. Anodes of at least part of the plurality of light-emitting elements 50' are electrically connected to a same anode signal trace 141'. Cathodes of at least part of the plurality of light-emitting elements 50' are electrically connected to a same cathode signal trace 142'. For example, a first light-emitting element connection pad 151' corresponding to a first light-emitting element disposed in the first light-emitting element arrangement region DD1' and a first light-emitting element connection pad 151' corresponding to a second light-emitting element disposed in the second light-emitting element arrangement region DD2' are electrically connected to a same anode signal trace 141', and a second light-emitting element connection pad 152' corresponding to the first light-emitting element disposed in the first light-emitting element arrangement region DD1' and a second light-emitting element connection pad 152' corresponding to the second light-emitting element disposed in the second light-emitting element arrangement region DD2' are electrically connected to a same cathode signal trace 142'. This configuration has advantages that the structure is simple, a reduction of the number of control terminals on the chip for providing an anode signal and a cathode signal is facilitated and saving of the cost of the chip is facilitated. In addition, since each cathode in the light-emitting element 50' can receive a same signal, the cathodes of all the light-emitting elements 50' can be electrically connected to a same cathode signal trace 142'. In this way, the number of control terminals on the chip can be further reduced.

Figure 34:
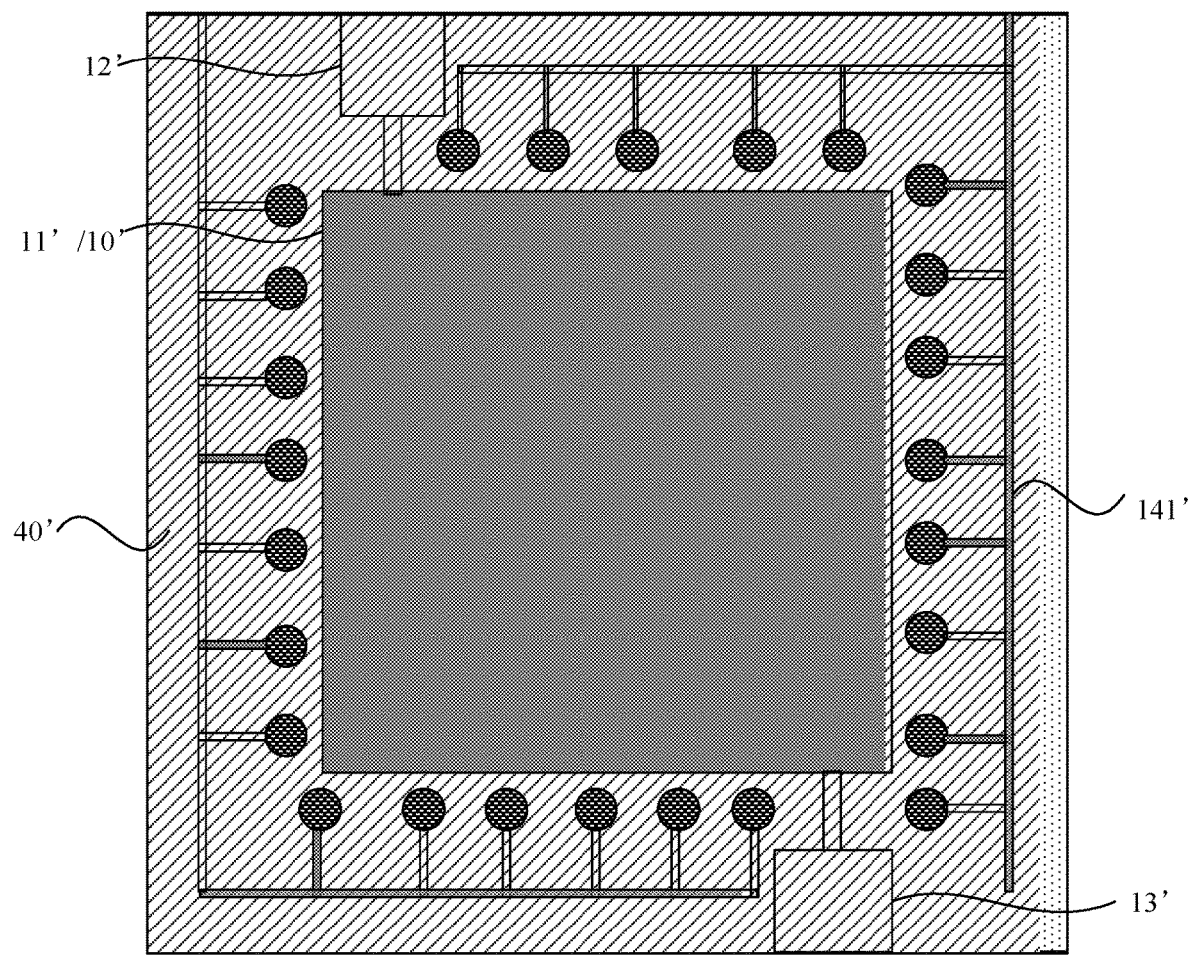
FIG. 34 is a top view of another phase shifter according to an embodiment of the present disclosure.

It is to be noted that FIG. 32 only illustrates an example in which the shapes of the transmission electrodes 11' are linear. In other optional embodiments, the shapes of the transmission electrodes 11' may further be a block. For example, referring to FIG. 34, when the transmission electrode 11' has a block shape, the light-emitting elements 50' are successively disposed in series along edges of the transmission electrode 11'. Anodes of at least part of the plurality of light-emitting elements 50' are electrically connected to a same anode signal trace 141'. Cathodes of at least part of the plurality of light-emitting elements 50' are electrically connected to a same cathode signal trace. FIG. 34 only illustrates the anode signal trace 141' and does not illustrate the cathode signal trace.

In an embodiment, partial side of the phase shifter is provided with the drive circuit. Exemplarily, still referring to FIG. 32, the phase shifter 200 further includes a plurality of drive circuits 16'. The plurality of drive circuits 16' may include, for example, a first drive circuit 161' and a second drive circuit 162'. An anode signal trace 141' electrically connected to a first light-emitting element connection pad 151' corresponding to a first light-emitting element disposed in the first light-emitting element arrangement region DD1' and a first light-emitting element connection pad 151' corresponding to a second light-emitting element disposed in the second light-emitting element arrangement region DD2' and a cathode signal trace 142' electrically connected to a second light-emitting element connection pad 152' corresponding to the first light-emitting element disposed in the first light-emitting element arrangement region DD1' and a second light-emitting element connection pad 152' corresponding to the second light-emitting element disposed in the second light-emitting element arrangement region DD2' are connected to the second drive circuit 162'. An anode signal trace 141' electrically connected to a first light-emitting element connection pad 151' corresponding to a third light-emitting element disposed in the third light-emitting element arrangement region DD3' and a first light-emitting element connection pad 151' corresponding to a fourth light-emitting element disposed in the fourth light-emitting element arrangement region DD4' and a cathode signal trace 142' electrically connected to a second light-emitting element connection pad 152' corresponding to the third light-emitting element disposed in the third light-emitting element arrangement region DD3' and a second light-emitting element connection pad 152' corresponding to the fourth light-emitting element disposed in the fourth light-emitting element arrangement region DD4' are connected to the first drive circuit 161'. In this way, when partial side of the phase shifter is provided with the drive circuit 16', the reduction of cross-line is facilitated. In addition, the signal traces are connected to a closer drive circuit 16' so that the reduction of the cost of line manufacturing is facilitated.

In an embodiment, still referring to FIG. 32, the signal trace 14' includes a plurality of connected subsections, and at least part of the plurality of connected subsections is parallel to part of the plurality of segments of the linear transmission electrode 11'. Exemplarily, still referring to FIG. 32, the anode signal trace 141 includes a first subsection 1411' and a second subsection 1412'; and the linear transmission electrode 11' includes a transmission unit 1111', and the transmission unit 1111' includes a first segment 1112' and a second segment 1113'. The first subsection 1411' is parallel to the first segment 1112' and the second subsection 1412' is parallel to the second segment 1113' so that crossline can be reduced.

In addition, still referring to FIG. 32, the transmission unit 1111' further includes a transmission opening 1114', and signal traces 14' corresponding to light-emitting elements 50' in transmission openings 1114' with a same orientation in a same transmission electrode 11' are electrically connected to a same drive circuit 16'. In this way, the reduction of cross-line is facilitated and the processing step is simplified.

A situation in which the light-emitting element 50' and the first electrode 10' are disposed on the same side is described above. It could be known from the above description that the light-emitting element 50' and the first electrode 10' are disposed on the same side and the dielectric constant of the photodielectric variable layer 40' is controlled to change through the light emitted by the light-emitting element 50' in the phase shifter 200 so that the electrical signal transmitted by the transmission electrode 11' is controlled to shift the phase. Compared with the phase shifter of the existing art, the phase shifter provided in the embodiment of the present disclosure can achieve the phase shift of the electrical signal by replacing the expensive liquid crystal layer with the photodielectric variable layer 40' with a relatively low price and reduce the cost of the phase shifter at the same time. In addition, since the light-emitting element 50' and at least one of the first electrode 10' or the second electrode 20' are an integral structure, that is, the light-emitting element 50' and the structure in the phase shifter 200 are integrated, the process steps are simplified and the preparation efficiency of the phase shifter is improved. Moreover, a thickness of the phase shifter 200 can be reduced, thereby facilitating the miniaturization of the phase shifter 200.

A situation in which the light-emitting element 50' and the second electrode 20' are disposed on the same side is described below.

Figure 35:
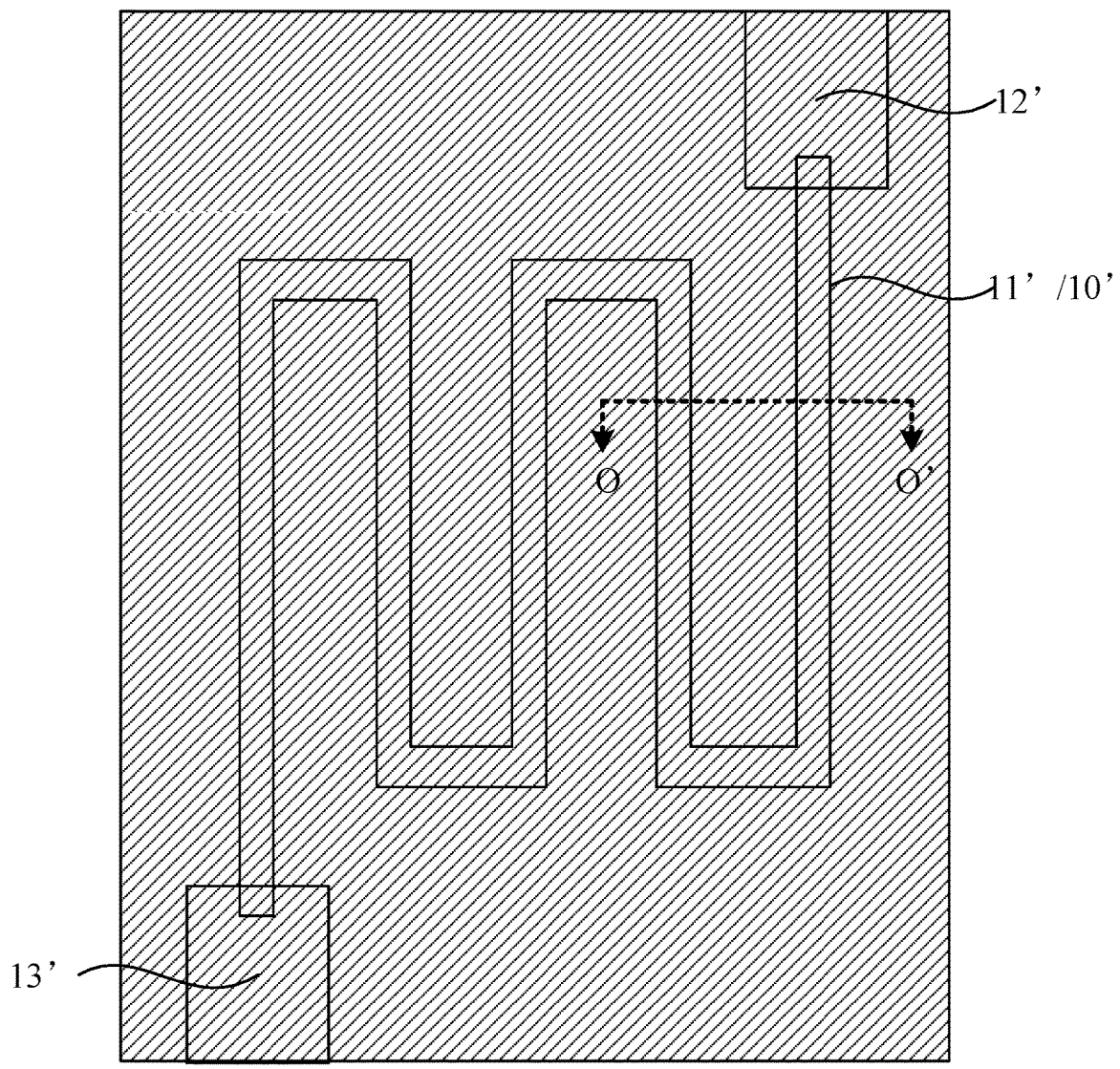
FIG. 35 is a top view of another phase shifter according to an embodiment of the present disclosure.
Figure 36:
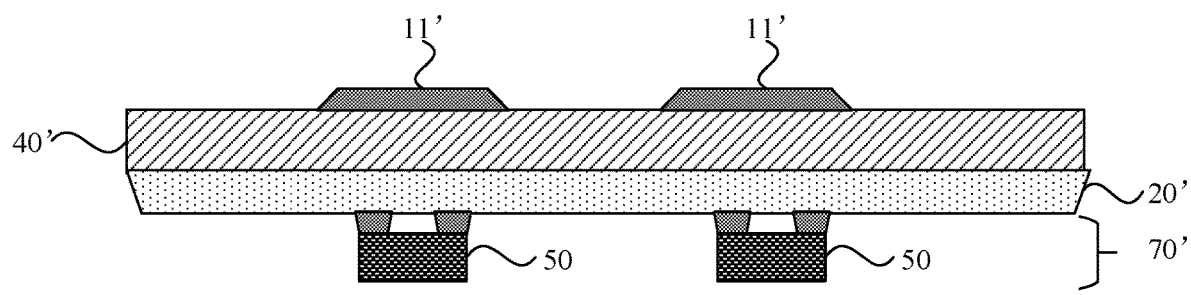
FIG. 36 is a cross-sectional structure view taken along a line O-O' of FIG. 35.

In an embodiment, FIG. 35 is a top view of another phase shifter according to an embodiment of the present disclosure, and FIG. 36 is a cross-sectional structure view taken along a line O-O' of FIG. 35. As shown in FIGS. 35 and 36, the phase shifter 200 provided by the embodiment of the present disclosure further includes a light-emitting element arrangement base plate 70' disposed on a side of the second electrode 20' facing away from the photodielectric variable layer 40', and the light-emitting element arrangement base plate 70' includes the light-emitting element 50'. It is to be noted that the light-emitting element arrangement base plate 70' is not a single substrate, but a combination of several films. The structure will be described in detail in the following embodiments and will not be repeated herein.

In this embodiment, the light-emitting element 50' is disposed on a side of the photodielectric variable layer 40' facing away from the first electrode 10', that is, the light-emitting element may be disposed not only on a side of the photodielectric variable layer 40' facing towards the first electrode 10', but also on the side of the photodielectric variable layer 40' facing away from the first electrode 10', so that the arrangement position of the light-emitting element 50' is flexible.

It is to be noted that when the light-emitting element 50' is disposed on the side of the photodielectric variable layer 40' facing away from the first electrode 10', the shape of the transmission electrode 11' is not limited to the linear shape of FIG. 35 nor to the S-shape of FIG. 35, and those skilled in the art can set the shape of the transmission electrode according to the actual situation. For example, when the shape of the transmission electrode 11' is linear, the shape may also be a W-shape formed by multiple connected straight segments, or an interconnected U-shape. For another example, the shape of the transmission electrode 11' is a block and the like.

In an embodiment, still referring to FIG. 35, the light-emitting elements 50' overlap the transmission electrodes 11'. This arrangement has the advantage that a large amount of light emitted from the light-emitting element 50' can be ensured to be irradiated to the photodielectric variable layer 40' below the transmission electrode 11' so that the dielectric constant of the photodielectric variable layer 40' in this region is changed and the utilization rate of the light can be improved.

In an embodiment, still referring to FIG. 35, the at least one light-emitting element 50' includes a plurality of light-emitting elements 50'; shapes of the transmission electrodes 11' include a linear shape, the linear shape includes a plurality of segments connected to each other, and extension directions of at least two segments among the plurality of segments intersect with each other; and the plurality of light-emitting elements 50' are sequentially disposed along an extension direction of the transmission electrodes 11'.

In this embodiment, the shapes of the transmission electrodes 11' are linear so that the path for transmitting the electrical signals is lengthened and the influence of the photodielectric variable layer 40' on electrical signals is increased. In addition, when the shapes of the transmission electrodes 11' are linear and the plurality of light-emitting elements 50' are sequentially disposed along the extension direction of the transmission electrodes 11', the amount of light irradiated to each region of the photodielectric variable layer 40' is substantially consistent, and the consistency of the change of the dielectric constant of each region of the photodielectric variable layer 40' is ensured.

Figure 37:
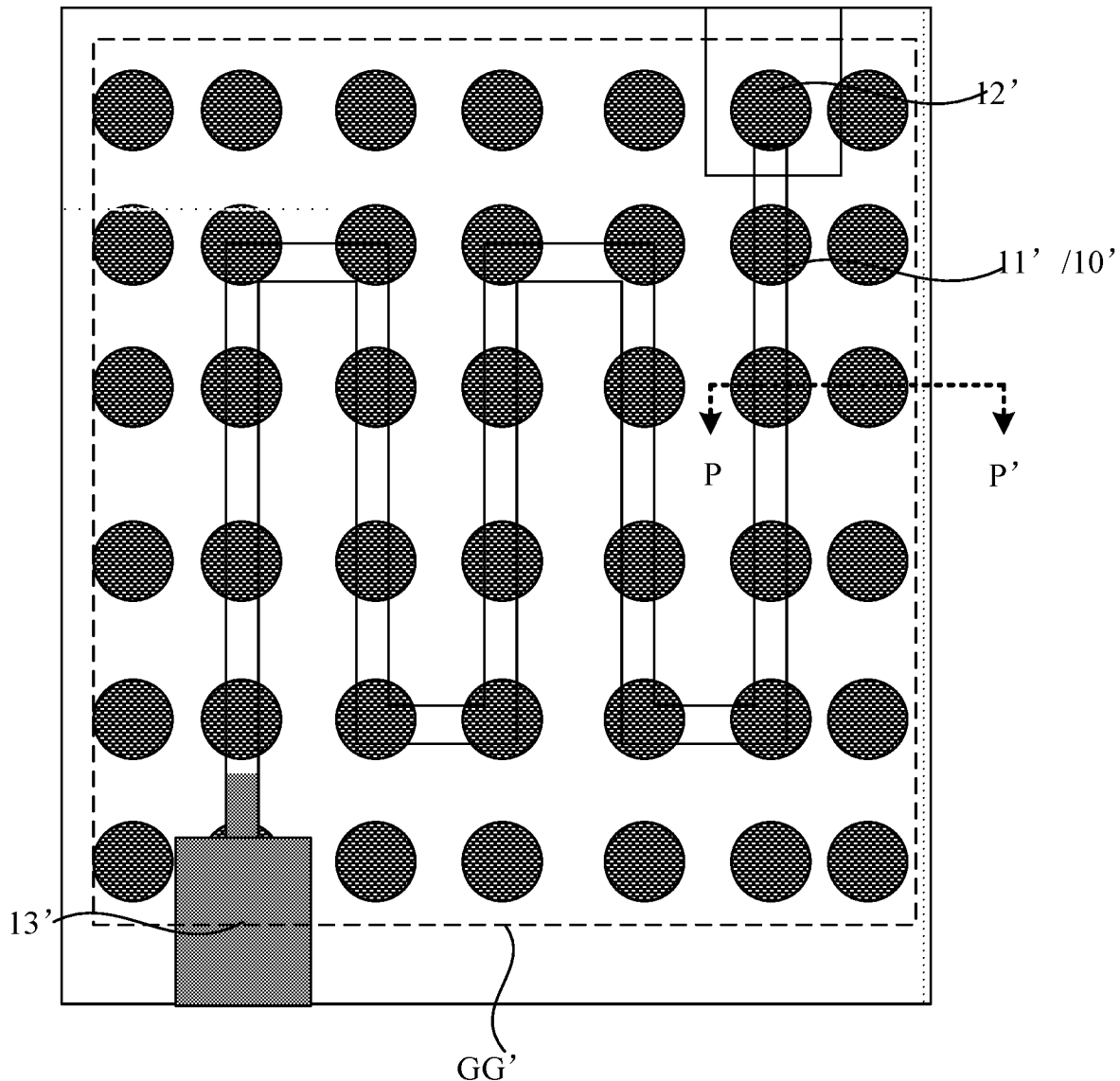
FIG. 37 is a top view of another phase shifter according to an embodiment of the present disclosure.
Figure 38:
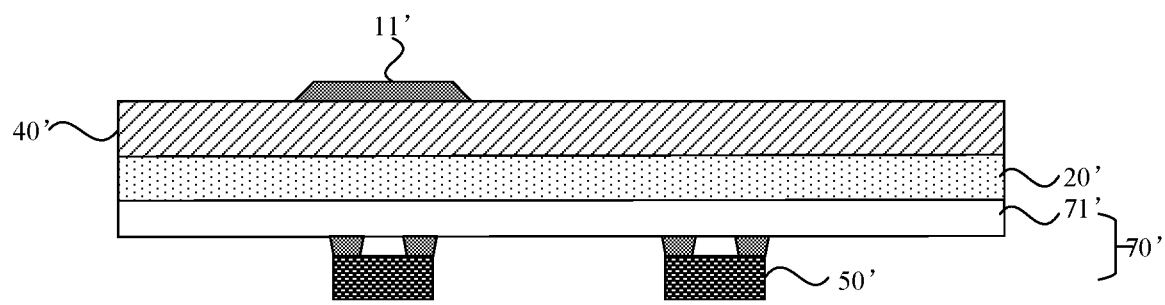
FIG. 38 is a cross-sectional structure view taken along a line P-P' of FIG. 37.

In an embodiment, FIG. 37 is a top view of another phase shifter according to an embodiment of the present disclosure, and FIG. 38 is a cross-sectional structure view taken along a line P-P' of FIG. 37. As shown in FIGS. 37 and 38, the light-emitting element arrangement base plate 70' further includes a first substrate base plate 71'; the first substrate base plate 71' includes a light-emitting element arrangement region GG'; and the at least one light-emitting element 50' includes a plurality of light-emitting elements 50', and the plurality of light-emitting elements 50' are disposed in overall of the light-emitting element arrangement region GG'. In this way, positions of the transmission electrodes 11' do not need to be positioned so that the process steps are simplified and the preparation efficiency of the phase shifter is improved. It is to be understood that the light emitted by the light-emitting elements 50' can pass through the first substrate base plate 71' in this embodiment so that the light can be irradiated to the photodielectric variable layer 40'.

Figure 39:
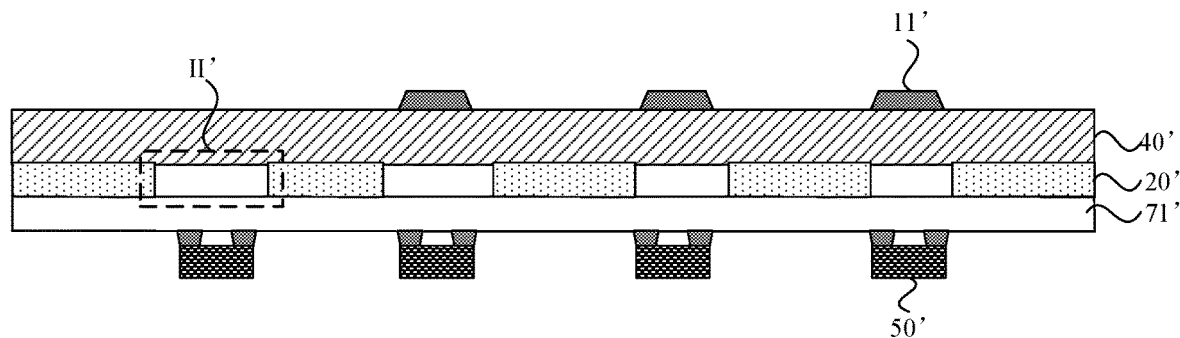
FIG. 39 is a structure diagram of a partial film of a phase shifter according to an embodiment of the present disclosure.

In an embodiment, FIG. 39 is a structure diagram of a partial film of a phase shifter according to an embodiment of the present disclosure. As shown in FIG. 39, the second electrode 20' includes a first hollowed-out structure II', and the first hollowed-out structure II' overlaps the light-emitting element 50'. In this way, the light emitted by the light-emitting elements 50' can pass through the first hollowed-out structure II' and be irradiated to the photodielectric variable layer 40' so as to control the dielectric constant of the photodielectric variable layer 40' to change and prevent the second electrode 20' from blocking the light emitted by the light-emitting element 50'. In an embodiment, the light-emitting element 50' covers the first hollowed-out structure II'. The electrode layer (such as the anode or the cathode) in the light-emitting element 50' can prevent the electric signal transmitted by the transmission electrode 11' from being leaked outward through the first hollowed-out structure II'.

In an embodiment, the second electrode 20' includes a light-transmitting electrode.

The light-transmitting electrode may be, for example, a transparent electrode, that is, the light emitted by the light-emitting element 50' may be irradiated to the photodielectric dielectric variable layer 40' through the light-transmitting electrode. In this case, the light-transmitting electrode may be made of, for example, indium tin oxide. The light-transmitting electrode is not limited to the transparent electrode, and may also be an electrode that can only transmit light that the photodielectric variable layer 40' can respond to. The light that the photodielectric variable layer 40' can respond to may be that the dielectric constant of the photodielectric variable layer 40' changes when the light is irradiated to the photodielectric variable layer 40'. For example, the light that the photodielectric variable layer can respond to is blue light, and the light-transmitting electrode can transmit the blue light.

As can be seen from the above content, the light-emitting element arrangement base plate 70' is not a single substrate, but a combination of some films, that is, the light-emitting element arrangement base plate 70' includes not only the light-emitting element 50', but also traces for providing the anode signal and the cathode signal for the light-emitting element 50', an insulating layer, and the like. The light-emitting element arrangement base plate 70' will be described in detail below with reference to typical examples.

Figure 40:
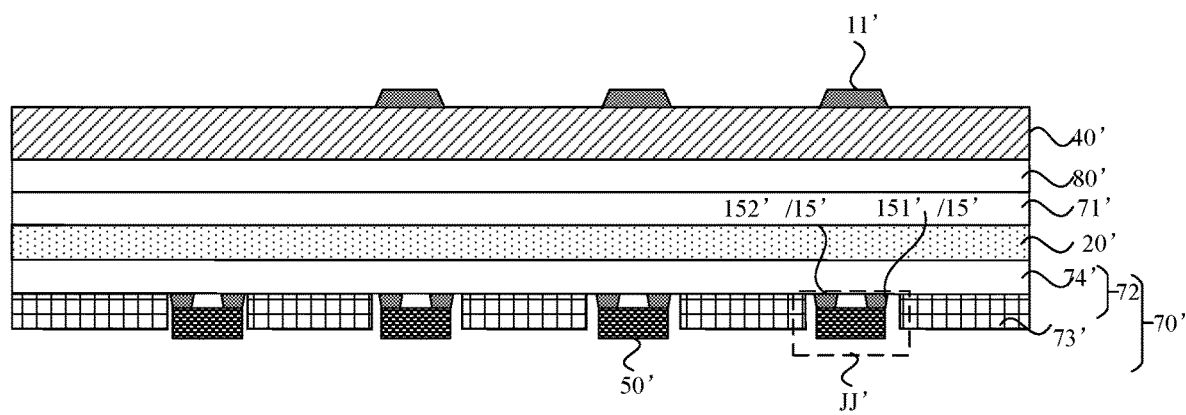
FIG. 40 is a structure diagram of a partial film of another phase shifter according to an embodiment of the present disclosure.

In an embodiment, FIG. 40 is a structure diagram of a partial film of another phase shifter according to an embodiment of the present disclosure. As shown in FIG. 40, the light-emitting element arrangement base plate 70' includes a circuit base plate 72' and a limiting layer 73'; and the circuit base plate 72' includes a first surface provided with a light-emitting element connection pad 15', the limiting layer 73' is disposed on the first surface, and the limiting layer 73' includes a limiting hole JJ'. A vertical projection of the limiting hole JJ' on a plane where the first surface is located overlaps a vertical projection of the light-emitting element connection pad 15' on the plane where the first surface is located.

Exemplarily, the circuit base plate 72' includes a transparent insulating layer 74', the light-emitting element connection pad 15', and a signal trace (not shown in the figure). The first surface of the circuit base plate 72' is provided with the limiting layer 73', the limiting layer 73' includes a plurality of limiting holes JJ', and each limiting hole JJ' penetrates through the limiting layer 73' so as to expose the light-emitting element connection pad 15' on the circuit base plate 72'. When the light-emitting element 50' is transferred to the circuit base plate 72', the light-emitting element 50' is located in the limiting hole JJ' so that the electric connection between electrodes of the light-emitting element 50' and the light-emitting element connection pad 15' can be achieved.

In an embodiment, the limiting layer 73' may include, for example, a light-blockage layer. It is to be understood that the limiting layer 73' includes, but is not limited to, the light-blockage layer, which may be set by those skilled in the art according to the actual situation as long as the light-emitting element 50' is limited to a preset position to achieve the electric connection between the light-emitting element 50' and the light-emitting element connection pad 15'.

It is to be understood that the light-emitting element 50' may be driven to emit light in an active driving manner or a passive driving manner.

Figure 41:
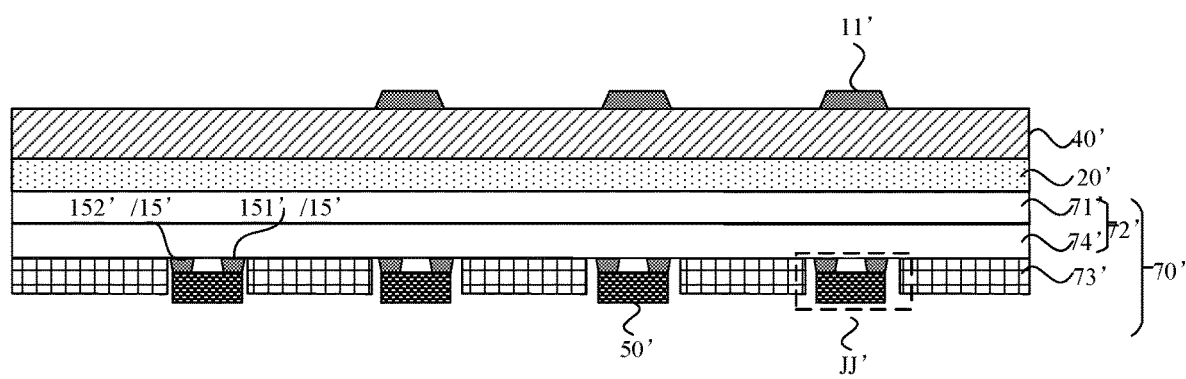
FIG. 41 is a structure diagram of a partial film of another phase shifter according to an embodiment of the present disclosure.

When the light-emitting element 50' is driven to emit light in the passive driving manner, in an embodiment, FIG. 41 is a structure diagram of a partial film of another phase shifter according to an embodiment of the present disclosure. As shown in FIG. 41, the circuit base plate 72' includes a first substrate base plate 71', a transparent insulating layer 74' disposed on a side of the first substrate base plate 71', and a signal trace layer disposed on a side of the transparent insulating layer 74' facing away from the first substrate base plate 71'. The signal trace layer includes the signal trace (not shown in FIG. 41) and the light-emitting element connection pad 15'. The light-emitting element 50' is disposed on the light-emitting element connection pad 15', and the light-emitting element connection pad 15' is electrically connected to the light-emitting element 50' and the signal trace, separately. That is to say, the signal on the chip is directly transmitted to the light-emitting element connection pad 15' through the signal trace and then transmitted to the light-emitting element 50' through the light-emitting element connection pad 15' to drive the light-emitting element 50' to emit light. It is to be understood that when the light-emitting element 50' is driven to emit light in the passive driving manner, the phase shifter is not limited to the phase shifter shown in FIG. 41 and may further be the phase shifter shown in FIG. 40.

Figure 42:
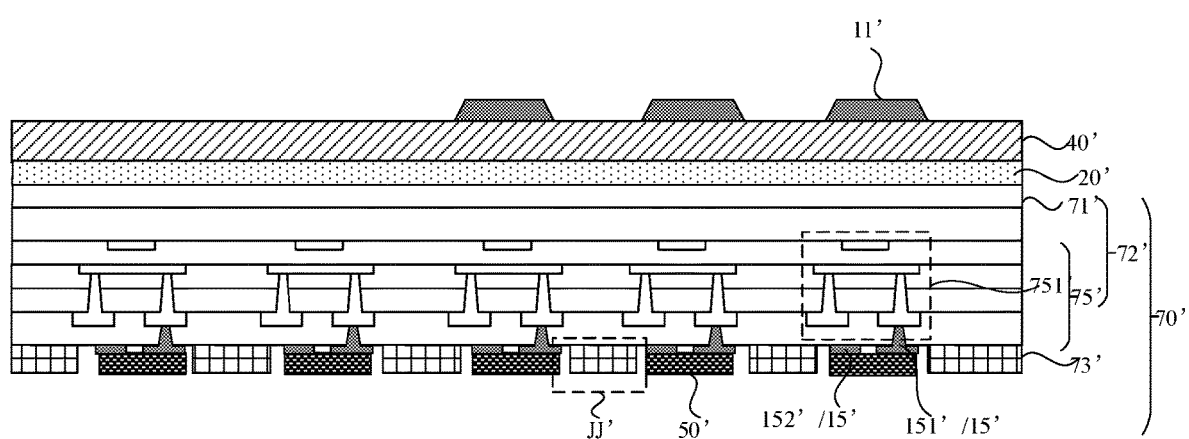
FIG. 42 is a structure diagram of a partial film of another phase shifter according to an embodiment of the present disclosure.

When the light-emitting element 50' is driven to emit light in the active driving manner, in an embodiment, FIG. 42 is a structure diagram of a partial film of another phase shifter according to an embodiment of the present disclosure. As shown in FIG. 42, the circuit base plate 72' includes a first substrate base plate 71' and a pixel circuit layer 75' disposed on a side of the first substrate base plate 71'. The pixel circuit layer 75' includes a pixel circuit 751', and the pixel circuit 751' is electrically connected to the anode of the light-emitting element 50'. The pixel circuit 751' may be electrically connected to the light-emitting element 50' through, for example, the light-emitting element connection pad 15' to drive a corresponding light-emitting element 50' to emit light, and the embodiment of the present disclosure does not specifically limit the specific structure of the pixel circuit 751' on the premise that the above functions can be achieved. For example, a pixel circuit 751' having a 2T1C structure (two transistors and one capacitor) or a pixel circuit 751' having a 7T1C structure (seven transistors and one capacitor) may be used.

Figure 43:
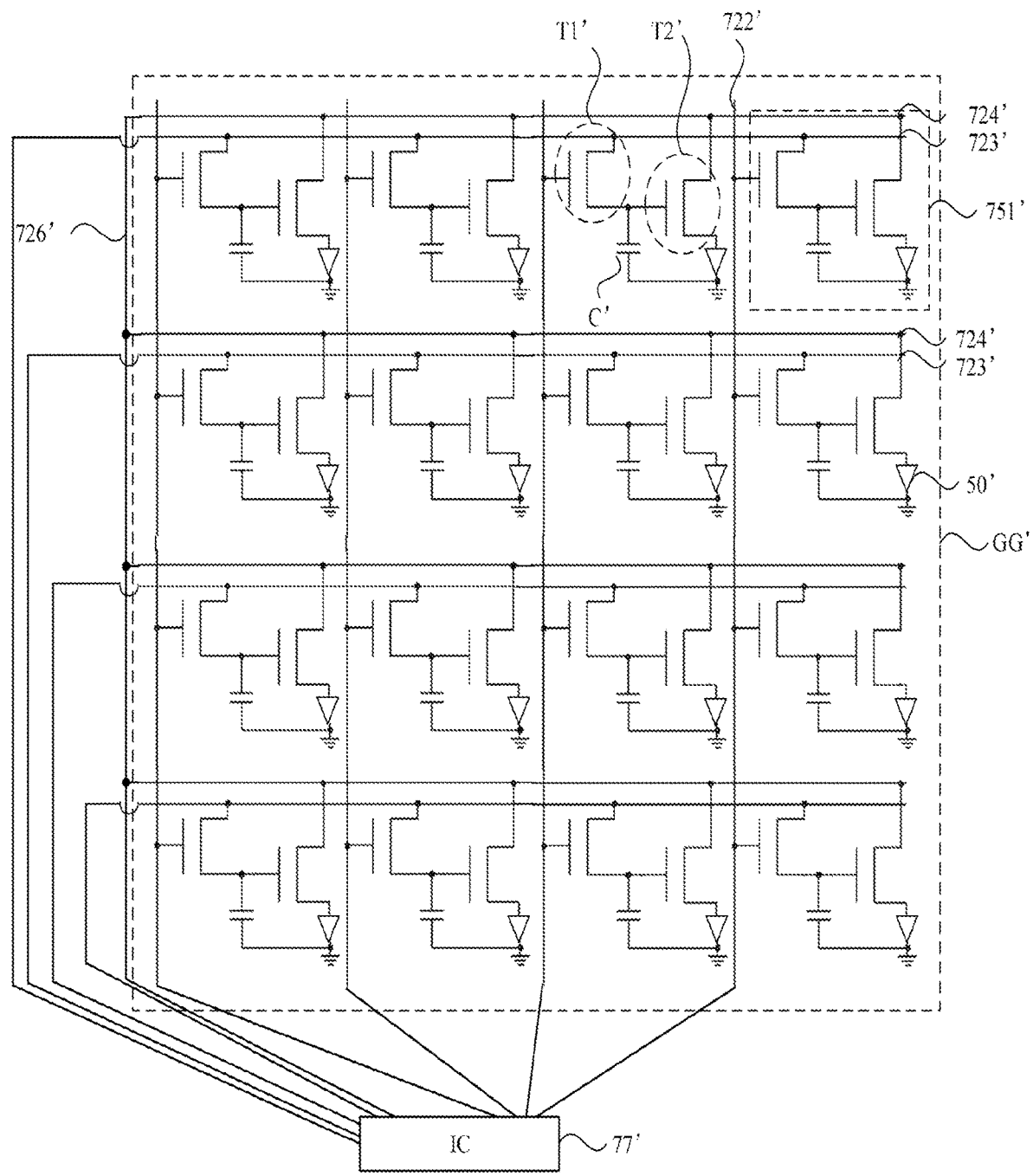
FIG. 43 is a circuit diagram of a pixel circuit according to an embodiment of the present disclosure.

In an embodiment, FIG. 43 is a circuit diagram of a pixel circuit according to an embodiment of the present disclosure. As shown in FIGS. 42 and 43, when the light-emitting elements 50' and the second electrode 20' are disposed on the same side and disposed in different layers, the plurality of light-emitting elements 50' are arranged in an array in the light-emitting element arrangement region GG'. The light-emitting element arrangement base plate 70' further includes the pixel circuit layer 75' disposed on the first substrate base plate 71'. The pixel circuit layer 75' includes pixel circuits 751' arranged in an array, a plurality of scanning lines 722', a plurality of data lines 723', a first power supply signal line 724', and a second power supply signal line (not shown in the figure). Pixel circuits 751' in a same row are electrically connected to a same data line 723', and the data line 723' is electrically connected to a driver chip 77' to receive a data signal. Pixel circuits 751' in a same column are electrically connected to a same scanning line 722', and the scanning line 722' is electrically connected to the driver chip 77' to receive a scanning signal. Pixel circuits 751' in a same row are electrically connected to a same first power supply signal line 724', first power supply signal lines 724' corresponding to pixel circuits 751' of different rows are electrically connected to a same power supply signal bus 726', and the power supply signal bus 726' is electrically connected to the driver chip 77' to receive a first power supply signal. The pixel circuits 751' are electrically connected to anodes of the light-emitting elements 50' in one-to-one correspondence.

Exemplarily, the pixel circuit 751' includes a drive transistor T1', a data writing transistor T2', and a storage capacitor C', that is, the pixel circuit 751' having 2T1C is used to drive the light-emitting element 50'. In an embodiment, the scanning signal transmitted by the scanning line 722' is written into a gate of the data writing transistor T2' to turn on the data writing transistor T2'; and then the data signal transmitted on the data line 723' is written to a gate of the drive transistor T1' through the data writing transistor T2', so that the drive transistor T1' generates a driving current for driving the light-emitting element 50' to emit light. In an embodiment, the phase shifter 200 is further provided with a cascaded shifting register (not shown in the figure), and the shifting register receives a signal sent by the driver chip 77' to output the scanning signal to the scanning lines 722'.

In the technical scheme provided in this embodiment, since the light-emitting element 50' and the second electrode 20' are disposed on the same side and disposed in different layers, the pixel circuit layer 75' corresponding to the light-emitting elements 50' is separately disposed. In this way, the design of other films (the first electrode 10' and the second electrode 20') in the phase shifter does not need to be changed, thereby reducing the process difficulty.

It is to be noted that all the above embodiments are described with the example in which the light-emitting element 50' is the Micro LED and the Micro LED is the Micro LED with the lateral structure, that is, the anode and the cathode of the Micro LED are disposed at a same side; and correspondingly, the light-emitting element connection pad 15' includes the first light-emitting element connection pad 151' and the second light-emitting element connection pad 152', the first light-emitting element connection pad 151' is electrically connected to the anode of the Micro LED, and the second light-emitting element connection pad 152' is electrically connected to the cathode of the Micro LED. The example is not a limitation of the present application, and those skilled in the art can select according to the actual situation.

Figure 44:
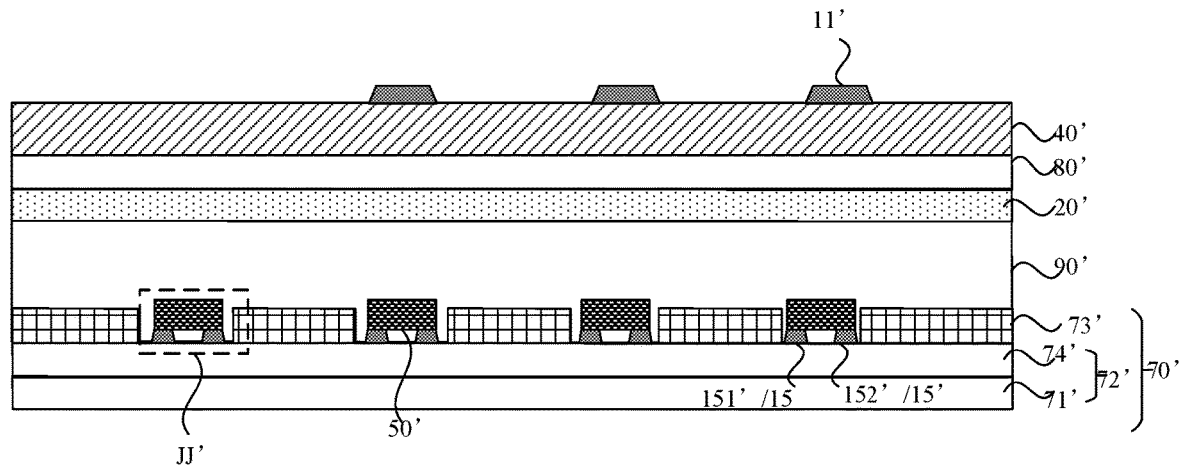
FIG. 44 is a structure diagram of a partial film of another phase shifter according to an embodiment of the present disclosure.
Figure 45:
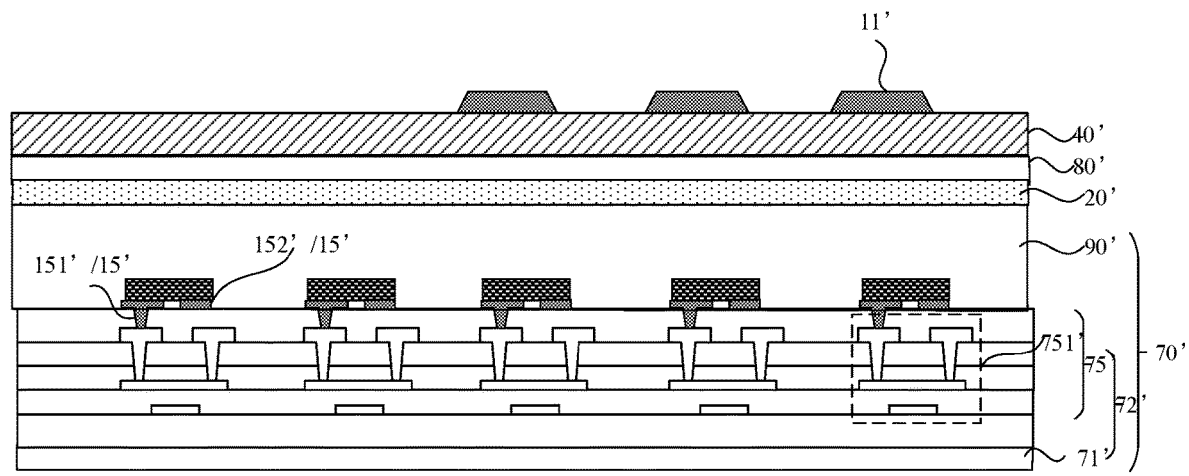
FIG. 45 is a structure diagram of a partial film of another phase shifter according to an embodiment of the present disclosure.

It is to be noted the above embodiments only describe an example in which the light-emitting element 50' is disposed on the side of the first substrate base plate 71' facing away from the second electrode 20', that is, each film in the light-emitting element arrangement base plate 70' is formed on the first substrate base plate 71', and the second electrode 20', the photodielectric variable layer 40', the transmission electrodes 11' and the like are disposed on the side of the first substrate base plate 71' facing away from the light-emitting element arrangement base plate 70', but the example is not a limitation of the present application. In an embodiment, FIG. 44 is a structure diagram of a partial film of another phase shifter according to an embodiment of the present disclosure. As shown in FIG. 44, the phase shifter 200 provided by this embodiment further includes a sticking layer 80', and the sticking layer 80' is disposed on a side of the light-emitting element 50' facing away from the first substrate base plate 71' and disposed between the photodielectric variable layer 40' and the second electrode 20'. That is to say, the photodielectric variable layer 40' is formed on a supporting layer (not shown in the figure) and the transmission electrode 11' is formed on the side of the photodielectric variable layer 40' facing away from the supporting layer; the circuit base plate 72 'and the limiting layer 73' are formed, the light-emitting element 50' is bonded in the limiting hole JJ' in the limiting layer 73', a planarizing layer 90' is provided, and the second electrode 20' is formed on the planarizing layer 90'; and then the second electrode 20' and the photodielectric variable layer 40' are bonded together through the sticking layer 80' to form the phase shifter 200. The process of the method for preparing the phase shifter will be described in detail in the following embodiments and will not be repeated herein. In an embodiment, FIG. 45 is a structure diagram of a partial film of another phase shifter according to an embodiment of the present disclosure. The difference from FIG. 44 is that the light-emitting element 50' is driven to emit light in the passive driving manner in FIG. 44, and the light-emitting element 50' is driven to emit light in the active driving manner in FIG. 45.

It is to be understood that when the phase shifter 200 further includes the sticking layer 80' and the sticking layer 80' is disposed on the side of the light-emitting element 50' facing away from the first substrate base plate 71' and disposed between the photodielectric variable layer 40' and the second electrode 20', the transparent insulating layer 74' in FIG. 44 is not limited to a transparent material, and the material of the transparent insulating layer may be selected by those skilled in the art according to the actual situation.

A situation in which the light-emitting element 50' and the first electrode 20' are disposed on the same side is described above. As can be seen from the above description, when the light-emitting element 50' and the second electrode 20' are disposed on the same side, the arrangement mode of the light-emitting element 50' is more flexible.

To sum up, when the light-emitting element 50' and the first electrode 10' are disposed on the same side or the light-emitting element 50' and the second electrode 20' are disposed on the same side, the dielectric constant of the photodielectric variable layer 40' can be controlled to change so that the electrical signal transmitted by the transmission electrode 11' is controlled to shift the phase. Compared with the phase shifter of the existing art, the phase shifter provided in the embodiment of the present disclosure can achieve the phase shift of the electrical signal by replacing the expensive liquid crystal layer with the photodielectric variable layer 40' with a relatively low price and reduce the cost of the phase shifter at the same time. In addition, since the light-emitting element 50' and at least one of the first electrode 10' or the second electrode 20' are an integral structure, that is, the light-emitting element 50' and the structure in the phase shifter 200 are integrated, the process steps are simplified and the preparation efficiency of the phase shifter is improved. Moreover, the thickness of the phase shifter 200 can be reduced, thereby facilitating the miniaturization of the phase shifter 200.

In an embodiment, the phase shifter further includes at least one second substrate base plate. The at least one second substrate base plate and the photodielectric variable layer are disposed in a same layer; and/or the at least one second substrate base plate and the photodielectric variable layer are disposed in different layers and overlap each other.

The second substrate base plate may be made of, for example, one of polyimide, glass or liquid crystal polymer. It is to be understood that the material of the second substrate base plate includes, but is not limited to, the above examples and may be selected by those skilled in the art according to the actual situation.

Figure 46:
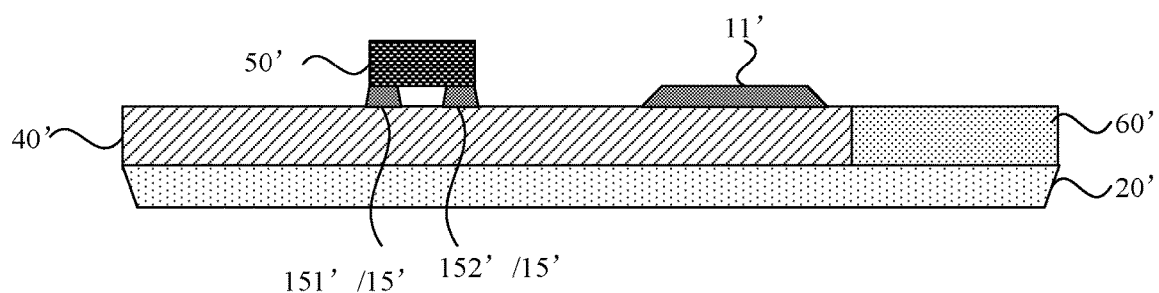
FIG. 46 is a structure diagram of a partial film of another phase shifter according to an embodiment of the present disclosure.

Exemplarily, FIG. 46 is a structure diagram of a partial film of another phase shifter according to an embodiment of the present disclosure. As shown in FIG. 46, the phase shifter 200 further includes the second substrate base plate 60', and the second substrate base plate 60' and the photodielectric variable layer 40' are disposed in a same layer. In an embodiment, for example, the preparation steps of the phase shifter 200 shown in FIG. 46 may be described below. First, the second electrode 20' is formed on a supporting layer (not shown in the figure). Then a side of the second electrode 20' facing away from the supporting layer is provided with the second substrate base plate 60'. The second substrate base plate 60' includes a plurality of groove structures, and all the plurality of groove structures penetrate through the second substrate base plate 60'. Each groove structure is provided with the photodielectric variable layer 40'. A side of the second substrate base plate 60' facing away from the second electrode 20' is formed with the transmission electrodes 11', signal traces corresponding to the light-emitting elements 50', and light-emitting element connection pads. Finally, the light-emitting element 50' is bonded. If the phase shifter 200 includes the supporting layer, the supporting layer does not need to be peeled off; and if the phase shifter 200 does not requires the supporting layer, the supporting layer may be peeled off after the light-emitting element 50' is bonded, as shown in FIG. 46.

Figure 47:
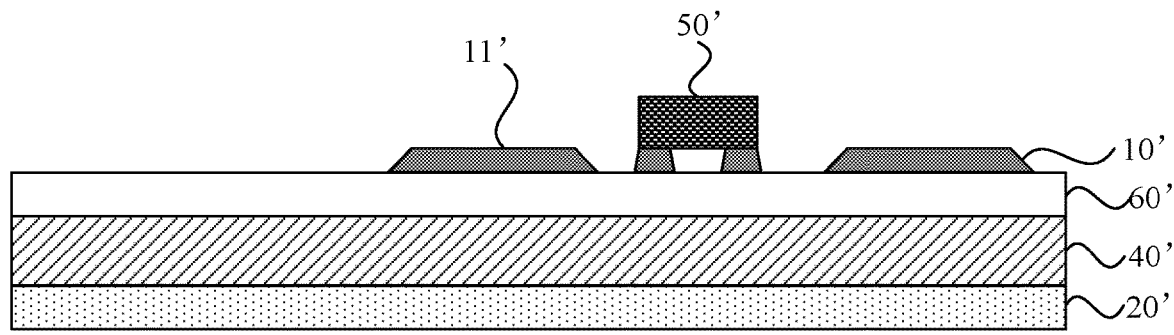
FIG. 47 is a structure diagram of a partial film of another phase shifter according to an embodiment of the present disclosure.

Exemplarily, FIG. 47 is a structure diagram of a partial film of another phase shifter according to an embodiment of the present disclosure. As shown in FIG. 47, the phase shifter 200 further includes a second substrate base plate 60', and the second substrate base plate 60' is disposed between the first electrode 10' and the photodielectric variable layer 40'.

Figure 48:
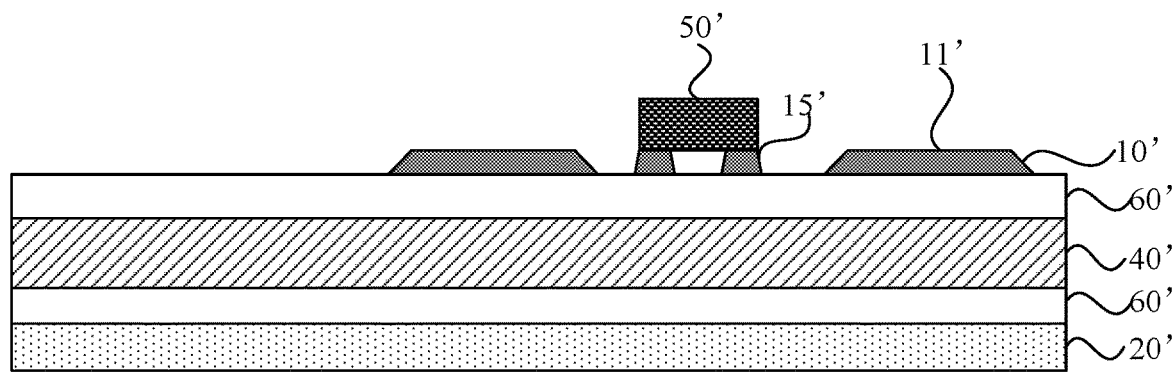
FIG. 48 is a structure diagram of a partial film of another phase shifter according to an embodiment of the present disclosure.

Exemplarily, FIG. 48 is a structure diagram of a partial film of another phase shifter according to an embodiment of the present disclosure. As shown in FIG. 48, the phase shifter 200 further includes two second substrate base plates 60', where one of the two the second substrate base plates 60' is disposed between the photodielectric variable layer 40' and the first electrode 10', and the other second substrate base plate 60' is disposed between the photodielectric variable layer 40' and the second electrode 20'. The phase shifter provided by this embodiment has a simple structure so that the process steps are simplified and the preparation efficiency of the phase shifter is improved during preparation of the phase shifter. The preparation steps of the phase shifter are not limited in this embodiment. For example, the transmission electrodes 11', the signal traces, the light-emitting element connection pads 15' and the like may be formed on one of the two second substrate base plates 60', and then the light-emitting elements 50 are bonded; the second electrode 20' is formed on the other second substrate base plate 60'; and then the photodielectric variable layer 40' is bonded between the two second substrate base plates 60' through OC optical glue or the like.

In an embodiment, still referring to FIGS. 47 and 48, the second substrate base plate 60' and the photodielectric variable layer 40' are disposed in different layers and overlap each other, and a thickness of the photodielectric variable layer 40' is greater than a thickness of the second substrate base plate 60' so that the influence of the photodielectric variable layer 40' on the electrical signal is increased.

To sum up, the photodielectric variable layer is disposed between the first electrode and the second electrode, the dielectric constant of the photodielectric variable layer is controlled to change through the light emitted by the light-emitting element in the phase shifter, and then the electrical signal transmitted by the transmission electrode is controlled to shift the phase. The phase shifter provided by the embodiments of the present disclosure provides more possibilities for large-scale commercialization. In addition, in this embodiment, since the light-emitting element and at least one of the first electrode or the second electrode are an integral structure, that is, the light-emitting element and the structure in the phase shifter are integrated, the process steps are simplified and the preparation efficiency of the phase shifter is improved. Moreover, the thickness of the phase shifter can be reduced, thereby facilitating the miniaturization of the phase shifter.

An embodiment of the present disclosure further provides a method for preparing a phase shifter, and the method belongs to the same inventive concept as the phase shifter in the above embodiments. For embodiments not described in detail, reference may be made to embodiments of the phase shifter. The method can prepare, for example, the phase shifter shown in FIGS. 28 and 29.

The method for preparing a phase shifter provided by the embodiment of the present disclosure includes steps described below.

In S510, a photodielectric variable module is provided. The photodielectric variable module includes a photodielectric variable layer and a second electrode, and the second electrode is provided with a fixed potential.

Exemplarily, still referring to FIGS. 28 and 29, the second electrode 20' is formed on a supporting layer (not shown in the figure), and the photodielectric variable layer 40' is disposed on a side of the second electrode 20' facing away from the supporting layer. If the formed phase shifter 200 requires the supporting layer to be included, the supporting layer does not need to be peeled off, and in this case, the photodielectric variable module includes the supporting layer, the second electrode 20', and the photodielectric variable layer 40'. If the formed phase shifter 200 does not require the supporting layer, the supporting layer needs to be peeled off in subsequent steps, and in this case, the photodielectric variable module includes only the photodielectric variable layer 40' the second electrode 20'.

In S520, a first electrode is formed on a side of the photodielectric variable module. The first electrode and the second electrode are respectively disposed on two sides of the photodielectric variable layer. The first electrode includes a plurality of transmission electrodes, a signal trace, and a light-emitting element connection pad. The plurality of transmission electrodes are configured to transmit an electrical signal.

The signal trace (not shown in FIGS. 28 and 29), the light-emitting element connection pads 15', and the transmission electrodes 11' are disposed in a same layer so that the process steps are simplified.

In S530, a light-emitting element is bonded to the light-emitting element connection pad. The light-emitting element connection pad is electrically connected to the light-emitting element and the signal trace, separately.

For example, the light-emitting element 50' may be transferred to the light-emitting element connection pad through a transfer process to achieve electric connection between the light-emitting element 50' to the light-emitting element connection pad 15', and then an anode signal and a cathode signal transmitted by the signal trace are transmitted to the light-emitting element 50', so that the light-emitting element 50' emits light.

In this embodiment, since the prepared light-emitting element 50' is directly bonded to the supporting layer provided with the first electrode 10' and the second electrode 20' without providing another supporting layer separately, that is, the light-emitting element, the first electrode and the second electrode are an integral structure, that is, the light-emitting element and the structure in the phase shifter are integrated, the process steps are simplified and the preparation efficiency of the phase shifter is improved. Moreover, the thickness of the phase shifter can be reduced, thereby facilitating the miniaturization of the phase shifter.

An embodiment of the present disclosure further provides a method for preparing a phase shifter, and the method belongs to the same inventive concept as the phase shifter in the above embodiments. For embodiments not described in detail, reference may be made to embodiments of the phase shifter. The method can prepare, for example, the phase shifter shown in FIGS. 41 and 42. The method for preparing a phase shifter provided by the embodiment of the present disclosure includes steps described below.

In S610, a substrate base plate is provided.

The substrate base plate is, for example, the first substrate base plate 71' in FIG. 41. For example, other film structures in the phase shifter are prepared on the first substrate base plate 71'.

In S620, a circuit base plate is arranged on the substrate base plate. The circuit base plate includes a light-emitting element connection pad.

When the light-emitting element is driven to emit light in the passive driving manner, for example, referring to FIG. 16, a transparent insulating layer 74' may be firstly formed on the first substrate base plate 71', and then a signal trace layer is prepared on a side of the transparent insulating layer 74' facing away from the first substrate base plate 71'. The signal trace layer includes a signal trace (not shown in FIG. 16) and the light-emitting element connection pad 15'.

When the light-emitting element is driven to emit light in the active driving manner, for example, referring to FIG. 42, a pixel circuit layer 75' may be formed on the first substrate base plate 71'. The pixel circuit layer 75' includes a pixel circuit 751', and the pixel circuit 751' is configured to drive the light-emitting element 50' to emit light.

In S630, a limiting layer is arranged on a side of the circuit base plate facing away from the substrate base plate. The limiting layer includes a limiting hole, and a vertical projection of the limiting hole on a plane where the substrate base plate is located overlaps a vertical projection of the light-emitting element connection pad on the plane where the substrate base plate is located.

Exemplarily, the limiting layer 73' is arranged on the side of the circuit base plate 72' facing away from the first substrate base plate 71. For example, the limiting layer 73' may be patterned by exposure development to form a plurality of limiting holes JJ', and each limiting hole JJ' penetrates through the limiting layer 73' to expose the light-emitting element connection pad 15' on the circuit base plate 72'.

In S640, a second electrode is formed on a side of the substrate base plate facing away from the circuit base plate. The second electrode is provided with a fixed potential.

In S650, a photodielectric variable layer is arranged on a side of the substrate base plate facing away from the circuit base plate.

For example, the photodielectric variable layer 40' may be formed on the first substrate base plate 71' by a coating or printing process.

In S660, a first electrode is arranged on a side of the photodielectric variable layer facing away from the substrate base plate. The first electrode includes a plurality of transmission electrodes, and the transmission electrodes are configured to transmit the electrical signal.

Exemplarily, an electrode layer is formed on the side of the photodielectric variable layer 40' facing away from the first substrate base plate 71', and the electrode layer is patterned to form the transmission electrodes 11'.

In S670, a light-emitting element is bonded to the limiting hole. The light-emitting element is electrically connected to the light-emitting element connection pad.

Exemplarily, the light-emitting element 50' is transferred to the circuit base plate 72', and the limiting hole JJ' functions as limiting a position of the light-emitting element 50' so that the light-emitting element 50' is transferred to a preset position and the electric connection between the electrodes of the light-emitting element 50' and the light-emitting element connection pad 15' is achieved.

In this embodiment, since the prepared light-emitting element 50' is directly bonded to the substrate base plate provided with the first electrode 10' and the second electrode 20' without providing another substrate base plate separately, that is, the light-emitting element, the first electrode and the second electrode are an integral structure, that is, the light-emitting element and the structure in the phase shifter are integrated, the process steps are simplified and the preparation efficiency of the phase shifter is improved. Moreover, the thickness of the phase shifter can be reduced, thereby facilitating the miniaturization of the phase shifter.

An embodiment of the present disclosure further provides a method for preparing a phase shifter, and the method belongs to the same inventive concept as the phase shifter in the above embodiments. For embodiments not described in detail, reference may be made to embodiments of the phase shifter. The method similarly can prepare the phase shifter 200 shown in FIG. 40. The method for preparing a phase shifter provided by the embodiment of the present disclosure includes steps described below.

In S710, a substrate base plate is provided.

The substrate base plate is, for example, the first substrate base plate 71' in FIG. 40.

In S720, a second electrode is arranged on the substrate base plate. The second electrode is provided with a fixed potential.

The second electrode 20' is formed on a side of the first substrate base plate 71'.

In S730, a circuit base plate is arranged on the second electrode. The circuit base plate includes a light-emitting element connection pad.

A transparent insulating layer 74' is formed on the second electrode 20' so as to prevent a signal trace in the circuit base plate 72' being electrically connected to the second electrode 20'. A signal trace layer is formed on a side of the transparent insulating layer 74' facing away from the second electrode 20', and the signal trace layer includes the light-emitting element connection pad 15'.

In S740, a limiting layer is arranged on a side of the circuit base plate facing away from the second electrode. The limiting layer includes a limiting hole, and a vertical projection of the limiting hole on a plane where the substrate base plate is located overlaps a vertical projection of the light-emitting element connection pad on the plane where the substrate base plate is located.

In S750, a light-emitting element is bonded to the limiting hole. The light-emitting element is electrically connected to the light-emitting element connection pad.

In S760, a sticking layer is arranged on a side of the substrate base plate facing away from the second electrode.

The sticking layer 80' is bonded to a side of the first substrate base plate 71' facing away from the second electrode 20'.

In S770, a photodielectric variable module is bonded on a side of the sticking layer facing away from the substrate base plate. The photodielectric variable module includes a photodielectric variable layer and a first electrode, the first electrode is disposed on a side of the photodielectric variable layer facing away from the sticking layer, the first electrode includes a plurality of transmission electrodes, and the plurality of transmission electrodes are configured to transmit an electrical signal.

The prepared photodielectric variable module is bonded to the side of the sticking layer 80' facing away from the first substrate base plate 71'.

In this embodiment, the first electrode 10' and the photodielectric variable layer 40' are not formed on the first substrate base plate 71', but are formed on other supporting layers, and the supporting layers are peeled off and bonded to one side of the first substrate base plate 71' through the sticking layer 80'.

In this embodiment, since the light-emitting element 50' is directly bonded to the substrate base plate provided with the second electrode 20' without providing another substrate base plate separately, that is, the light-emitting element and the second electrode are an integral structure, that is, the light-emitting element and the structure in the phase shifter are integrated, the process steps are simplified and the preparation efficiency of the phase shifter is improved. Moreover, the thickness of the phase shifter can be reduced, thereby facilitating the miniaturization of the phase shifter.

An embodiment of the present disclosure further provides a method for preparing a phase shifter, and the method belongs to the same inventive concept as the phase shifter in the above embodiments. For embodiments not described in detail, reference may be made to embodiments of the phase shifter. The method can prepare, for example, the phase shifter shown in FIGS. 44 and 45. The phase shifter for preparing a phase shifter provided by the embodiment of the present disclosure includes steps described below.

In S810, a substrate base plate is provided.

The substrate base plate may be, for example, the first substrate base plate 71' shown in FIGS. 44 and 45.

In S220, a circuit base plate is arranged on the substrate base plate. The circuit base plate includes a light-emitting element connection pad.

When the light-emitting element is driven to emit light in the passive driving manner, for example, referring to FIG. 43, a transparent insulating layer 74' may be firstly formed on the first substrate base plate 71', and then a signal trace layer is prepared on a side of the transparent insulating layer 74' facing away from the first substrate base plate 71'. The signal trace layer includes a signal trace (not shown in FIG. 44) and the light-emitting element connection pad 15'.

When the light-emitting element is driven to emit light in the active driving manner, for example, referring to FIG. 45, a pixel circuit layer 75' may be formed on the first substrate base plate 71'. The pixel circuit layer 75' includes a pixel circuit 751', and the pixel circuit 751' is configured to drive the light-emitting element 50' to emit light.

In S830, a limiting layer is arranged on a side of the circuit base plate facing away from the substrate base plate. The limiting layer includes a limiting hole, and a vertical projection of the limiting hole on a plane where the substrate base plate is located overlaps a vertical projection of the light-emitting element connection pad on the plane where the substrate base plate is located.

In S840, a light-emitting element is bonded to the limiting hole. The light-emitting element is electrically connected to the light-emitting element connection pad.

In S850, a planarizing layer is arranged on a side of the light-emitting element facing away from the substrate base plate.

The planarizing layer 90' is arranged on the side of the light-emitting element 50' facing away from the first substrate base plate 71' so that the light-emitting element 50' is protected and the preparation of the second electrode 20' is facilitated at the same time.

In S860, a second electrode is arranged on a side of the planarizing layer facing away from the light-emitting element. The second electrode is provided with a fixed potential.

In S870, a sticking layer is arranged on a side of the second electrode facing away from the planarizing layer.

In S880, a photodielectric variable module is bonded on a side of the sticking layer facing away from the second electrode. The photodielectric variable module includes a photodielectric variable layer and a first electrode, the first electrode is disposed on a side of the photodielectric variable layer facing away from the sticking layer, the first electrode includes a plurality of transmission electrodes and a plurality of radiator units, the plurality of transmission electrodes are configured to transmit an electrical signal, and the plurality of radiator units are configured to send the electrical signal.

The prepared photodielectric variable module is bonded to the side of the sticking layer 80' facing away from the first substrate base plate 71'.

It is to be noted that the light-emitting direction of the light-emitting element 50' shown in FIGS. 44 and 45 is opposite to the light-emitting direction of the light-emitting element 50' in the above embodiment. The light-emitting element 50' shown in FIGS. 44 and 45 emits light from the top, and the light-emitting direction faces towards the photodielectric variable layer 40'. However, the light-emitting element 50' shown in other embodiments emits light from the bottom, and the light-emitting direction also faces towards the photodielectric variable layer 40'.

In this embodiment, since the light-emitting element 50' is directly bonded to the substrate base plate provided with the second electrode 20' without providing another substrate base plate separately, that is, the light-emitting element and the second electrode are an integral structure, that is, the light-emitting element and the structure in the phase shifter are integrated, the process steps are simplified and the preparation efficiency of the phase shifter is improved. Moreover, the thickness of the phase shifter can be reduced, thereby facilitating the miniaturization of the phase shifter.

An embodiment of the present disclosure further provides a communication device. The communication device includes a light source and any one of the antennas described above; or the communication device includes a light source and any one of the phase shifters described above. The light source is configured to emit light irradiated to the photodielectric variable layer to change the dielectric constant of the photodielectric variable layer. The communication device may be placed in the car so as to enable the car to receive a signal.

Figure 49:
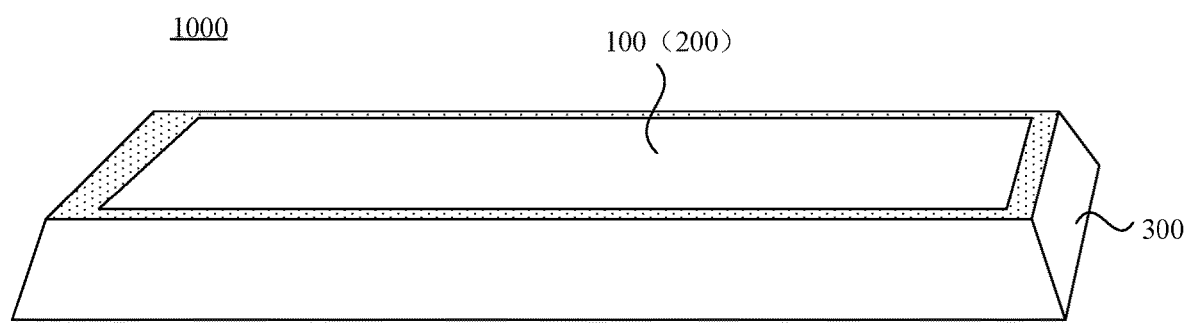
FIG. 49 is a structural diagram of a communication device according to an embodiment of the present disclosure.

Exemplarily, FIG. 49 is a structural diagram of a communication device according to an embodiment of the present disclosure. The communication device 1000 includes an antenna 100, or the communication device 1000 includes a phase shifter 200.

The communication device 1000 further includes a housing 300 for accommodating the antenna 100 or the phase shifter 200, and the housing 300 is configured to protect the antenna 100 or the phase shifter 200.

It is to be noted that the above are merely preferred embodiments of the present disclosure and the technical principles used therein. It is to be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail through the preceding embodiments, the present disclosure is not limited to the preceding embodiments and may further include more other equivalent embodiments without departing from the concept of the present disclosure. The scope of the present disclosure is determined by the scope of the appended claims.

What is claimed is:

1. An antenna, comprising: a first electrode, a second electrode, a third electrode, and a photodielectric variable layer; wherein
the first electrode and the second electrode are respectively disposed on opposite two sides of the photodielectric variable layer;
the first electrode comprises a plurality of transmission electrodes, and the plurality of transmission electrodes are configured to transmit an electrical signal;
the second electrode is provided with a fixed potential; and
the third electrode comprises a plurality of radiator units, and the plurality of radiator units are configured to send the electrical signal; and
the antenna further comprises at least one light-emitting element configured to emit light irradiated to the photodielectric variable layer to change a dielectric constant of the photodielectric variable layer; wherein
the at least one light-emitting element and at least one of the first electrode, the second electrode, or the third electrode are an integral structure.

2. The antenna of claim 1, wherein the at least one light-emitting element is disposed on a side of the photodielectric variable layer facing away from the second electrode, and the at least one light-emitting element does not overlap the plurality of transmission electrodes;
the plurality of transmission electrodes comprise a first boundary, the first boundary is a boundary closest to a transmission electrode from the at least one light-emitting element, and a distance from the at least one light-emitting element to the first boundary is D1, wherein 10 µm≤D1≤100 µm.

3. The antenna of claim 2, wherein the at least one light-emitting element comprises a plurality of light-emitting elements;
shapes of the plurality of transmission electrodes comprise a linear shape, the linear shape comprises a plurality of segments connected to each other, and extension directions of at least two segments among the plurality of segments intersect with each other; and
the plurality of light-emitting elements are sequentially disposed along an extension direction of the plurality of transmission electrodes.

4. The antenna of claim 1, wherein the at least one light-emitting element is disposed on a side of the photodielectric variable layer facing away from the second electrode, and
the antenna further comprises a signal trace and a light-emitting element connection pad, the at least one light-emitting element is disposed on the light-emitting element connection pad, and the light-emitting element connection pad is electrically connected to the at least one light-emitting element and the signal trace, separately;
wherein the signal trace, the light-emitting element connection pad, and the plurality of transmission electrodes are disposed in a same layer.

5. The antenna of claim 4, wherein the photodielectric variable layer comprises a plurality of photodielectric variable units, and the at least one light-emitting element comprises a plurality of light-emitting elements; and
each photodielectric variable unit among the plurality of photodielectric variable units corresponds to a plurality of light-emitting elements, and the each photodielectric variable units overlaps the plurality of transmission electrodes; and the signal trace comprises an anode signal trace and a cathode signal trace;
wherein anodes of at least part of the plurality of light-emitting elements corresponding to a same photodielectric variable unit are electrically connected to a same anode signal trace; and
cathodes of at least part of the plurality of light-emitting elements are electrically connected to a same cathode signal trace.

6. The antenna of claim 1, further comprising a light-emitting element arrangement base plate disposed on a side of the second electrode facing away from the photodielectric variable layer;
wherein the light-emitting element arrangement base plate comprises the at least one light-emitting element, and the at least one light-emitting element overlaps the plurality of transmission electrodes.

7. The antenna of claim 6, wherein the at least one light-emitting element comprises a plurality of light-emitting elements; and shapes of the plurality of transmission electrodes comprise a linear shape, the linear shape comprises a plurality of segments connected to each other, and extension directions of at least two segments among the plurality of segments intersect with each other; and
the plurality of light-emitting elements are sequentially disposed along extension directions of the plurality of transmission electrodes.

8. The antenna of claim 6, wherein the light-emitting element arrangement base plate further comprises a first substrate base plate;
the first substrate base plate comprises a light-emitting element arrangement region, and the plurality of transmission electrodes are disposed on a same light-emitting element arrangement region; and
the at least one light-emitting element comprises a plurality of light-emitting elements, and the plurality of light-emitting elements are disposed in overall of the light-emitting element arrangement region.

9. The antenna of claim 8, wherein the plurality of light-emitting elements are arranged in an array in the light-emitting element arrangement region;
the light-emitting element arrangement base plate further comprises pixel circuits arranged in an array, a plurality of scanning lines, and a plurality of data lines on the first substrate base plate; and
pixel circuits in a same column are electrically connected to a same data line among the plurality of data lines, pixel circuits in a same row are electrically connected to a same scanning line among the plurality of scanning lines, and the pixel circuits are electrically connected to anodes of the plurality of light-emitting elements in one-to-one correspondence.

10. The antenna of claim 6, wherein the second electrode comprises a first hollowed-out structure, and the first hollowed-out structure overlaps the at least one light-emitting element.

11. The antenna of claim 10, wherein the at least one light-emitting element covers the first hollowed-out structure.

12. The antenna of claim 6, wherein the second electrode comprises a light-transmitting electrode.

13. The antenna of claim 6, wherein the light-emitting element arrangement base plate comprises a circuit base plate and a limiting layer; and
the circuit base plate comprises a first surface provided with a light-emitting element connection pad, the limiting layer is disposed on the first surface, and the limiting layer comprises a limiting hole;
wherein a vertical projection of the limiting hole on a plane where the first surface is located overlaps a vertical projection of the light-emitting element connection pad on the plane where the first surface is located.

14. The antenna of claim 13, wherein the circuit base plate comprises a first substrate base plate, a transparent insulating layer disposed on a side of the first substrate base plate, and a signal trace layer disposed on a side of the transparent insulating layer facing away from the first substrate base plate; and
the signal trace layer comprises a signal trace and a light-emitting element connection pad, the at least one light-emitting element is disposed on the light-emitting element connection pad, and the light-emitting element connection pad is electrically connected to the at least one light-emitting element and the signal trace, separately.

15. The antenna of claim 13, wherein the circuit base plate comprises a first substrate base plate and a pixel circuit layer disposed on a side of the first substrate base plate; and
the pixel circuit layer comprises a pixel circuit, and the pixel circuit is electrically connected to an anode of the at least one light-emitting element.

16. The antenna of claim 14, wherein the at least one light-emitting element is disposed on a side of the first substrate base plate facing away from the second electrode, or
the antenna further comprises a sticking layer disposed on a side of the at least one light-emitting element facing away from the first substrate base plate and disposed between the photodielectric variable layer and the second electrode.

17. The antenna of claim 1, wherein the at least one light-emitting element comprises a plurality of light-emitting elements, and light-emitting colors of the plurality of light-emitting elements each are white.

18. The antenna of claim 1, wherein the at least one light-emitting element comprises a Micro Light Emitting Diode.

19. The antenna of claim 1, further comprising at least one second substrate base plate, wherein the at least one second substrate base plate and the photodielectric variable layer are disposed in a same layer; and/or the at least one second substrate base plate and the photodielectric variable layer are disposed in different layers and overlap each other.

20. The antenna of claim 1, wherein a material of the photodielectric variable layer comprises azo dyes or azo polymers.

* * * * *